(12) United States Patent
Ueno et al.

(10) Patent No.: US 6,815,295 B1
(45) Date of Patent: Nov. 9, 2004

(54) METHOD OF MANUFACTURING FIELD EFFECT TRANSISTORS

(75) Inventors: Shuichi Ueno, Tokyo (JP); Yoshinori Okumura, Tokyo (JP); Shigenobu Maeda, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 796 days.

(21) Appl. No.: 09/429,283

(22) Filed: Oct. 28, 1999

Related U.S. Application Data

(62) Division of application No. 08/958,546, filed on Oct. 27, 1997, now Pat. No. 5,998,828.

(30) Foreign Application Priority Data

May 14, 1999 (JP) ................................................ 9-123941

(51) Int. Cl.[7] .............................................. H01L 21/335
(52) U.S. Cl. ...................... 438/275; 438/528; 438/585; 438/257; 438/241; 438/258
(58) Field of Search ................................. 438/528, 241, 438/258, 197, 257, 275, 585, FOR 193, FOR 189, FOR 205

(56) References Cited

U.S. PATENT DOCUMENTS

| | | | | |
|---|---|---|---|---|
| 5,278,085 A | * | 1/1994 | Maddox, III et al. |
| 5,514,902 A | | 5/1996 | Kawasaki et al. |
| 5,567,638 A | | 10/1996 | Lin et al. |
| 5,607,868 A | | 3/1997 | Chida et al. |
| 5,780,330 A | * | 7/1998 | Choi |
| 5,783,469 A | * | 7/1998 | Gardner et al. |
| 5,872,049 A | * | 2/1999 | Gardner et al. |
| 5,885,861 A | * | 3/1999 | Gardner et al. |
| 5,885,877 A | * | 3/1999 | Gardner et al. |
| 5,893,739 A | * | 4/1999 | Kadosh et al. |
| 5,998,271 A | * | 12/1999 | Schwalke |
| 6,001,713 A | * | 12/1999 | Ramsbey |
| 6,004,849 A | * | 12/1999 | Gardner et al. |
| 6,017,808 A | * | 1/2000 | Wang et al. |

FOREIGN PATENT DOCUMENTS

| | | |
|---|---|---|
| JP | 4-157766 | 5/1992 |
| JP | 7-176743 | 7/1995 |
| JP | 9-022999 | 1/1997 |

OTHER PUBLICATIONS

Sze, S.M., "VLSI Technology", McGraw–Hill, 1988, pp, 493–494.*
C. Kuo, "Embedded Flash Memory Applications, Technology and Design", 1995 IEDM Short Course, Motorola Inc., Austin, Texas, 1995.
T. Kuroi, et al., Japanese Journal of Applied Physics, vol. 34, No. 2B, pps. 771–775, "The Impact of Nitrogen Implantation Into Highly Doped Polysilicon Gates of Highly Reliable and High–Performance Sub–Quarter–Micron Dual–Gate Complementary Metal Oxide Semiconductor," Feb. 1, 1995.
A.I. Chou et al., 1997 IEEE International Reliability Physics Symposium Proceedings, vol. Symp. 35, pps. 174–177, "The Effects of Nitrogen Implant Into Gate Electrode on the Characteristics of Dual–Gate MOSFETs with Ultra–Thin Oxide and Oxynitrides," 1997.

* cited by examiner

*Primary Examiner*—George Fourson
(74) *Attorney, Agent, or Firm*—Oblon, Spivak, McClelland, Maier & Neustadt, P.C.

(57) ABSTRACT

In a semiconductor device and a method of manufacturing the same according to the present invention, a trade-off relationship between threshold values and a diffusion layer leakage is eliminated and it is not necessary to form gate oxide films at more than one stages. Since doses of nitrogen are different from each other between gate electrodes (4A to 4C) of N-channel type MOS transistors (T41 to T43), concentrations of nitrogen in the nitrogen-introduced regions (N1 to N3) are accordingly different from each other. Concentrations of nitrogen in the gate electrodes are progressively lower in the order of expected higher threshold values.

14 Claims, 56 Drawing Sheets

HIGH-VOLTAGE RESISTANT PORTION | PERIPHERAL CIRCUIT PORTION | MEMORY CELL ARRAY PORTION

HIGH-VOLTAGE RESISTANT PORTION | SENSE AMPLIFIER PORTION | MEMORY CELL ARRAY PORTION

□ : EFFECTIVE OXIDE FILM THICKNESS
■ : ACTUAL OXIDE FILM THICKNESS

LOGIC PORTION | PERIPHRAL CIRCUIT PORTION | MEMORY CELL ARRAY PORTION

SENSE AMPLIFIER PORTION    PERIPHERAL CIRCUIT PORTION    MEMORY CELL ARRAY PORTION

METHOD OF MANUFACTURING FIELD EFFECT TRANSISTORS

This application is a divisional of U.S. Ser. No. 08/958,546 filed Oct. 27, 1997, now U.S. Pat. No. 5,998,828.

BACKGROUND OF THE INVENTION

1. Field of the Invention

The present invention relates to a semiconductor device and a method of manufacturing the same, and more particularly, to a semiconductor device in which a plurality of types of transistors are formed within one chip and a method of manufacturing such a semiconductor device.

2. Description of the Background Art

As a semiconductor device in which a plurality of types of transistors (e.g., transistors having different required specifications from each other) are formed within one chip, the following four conventional examples will be described.

<First Conventional Example>
<Overall Structure of DRAM>

First, as a first conventional example, a structure of a DRAM 600 in which a plurality of types of transistors are formed and a method of manufacturing the same will be described. The structure of the DRAM 600 (i.e., cell structure) is shown in FIG. 71.

The DRAM 600 includes not only a memory cell array portion 601 for storing data, but also a peripheral circuit portion (i.e., an address buffer 602, an X decoder 603, a Y decoder 604, a row/column clock portion 605, an I/O pass portion 606, a refresh portion 607), a sense amplifier portion 608, etc.

Although any these portions are formed by transistors, characteristics required for these portions are different from each other. For instance, the memory cell array portion 601 only allows a low leakage current, in order to prevent disappearance of data because of a leakage current. Meanwhile, a high amount of current is demanded in the peripheral circuit portion so as to enable operations at a high speed. Further, to distinguish a high level from a low level, the sense amplifier portion 608 must operate at a voltage which is half that of the high level, for example. To this end, a transistor which is used for the sense amplifier portion 608 must operate at a low voltage. In short, a plurality of types of transistors which have different characteristics from each other are needed within the DRAM which is formed as one chip.

Comparing threshold values, for instance, a threshold value for a transistor of the memory cell array portion is about 1V and a threshold value for transistors of the peripheral circuit portions are about 0.8V, while a threshold value for the transistor of the sense amplifier portion must be suppressed as low as 0.4V.

<Structures of the Respective Transistors>

A conventional approach for forming these transistors which have different characteristics from each other within one chip is to change an impurity profile of a channel dope layer in accordance with a transistor. In the following, an example where an impurity concentration of a channel dope is changed in accordance with a transistor will be described.

FIG. 72 shows (in a partial view) an example of a structure of a DRAM which is fabricated by a conventional manufacturing method. Cross sections of N-channel MOS transistors T1 to T3 which are used for the sense amplifier portion, the peripheral circuit portion, and the memory cell array portion are shown.

In FIG. 72, the N-channel MOS transistors T1 to T3 are formed within a P-type well layer 101 which is formed on the same semiconductor substrate 1 (of the P-type). The well layer 101 is element-separated by a channel cut layer 102 and a LOCOS layer 2 in such a manner that the N-channel MOS transistors T1 to T3 are formed in regions which are created by element separation.

The N-channel MOS transistor T1 of the sense amplifier portion comprises a pair of source/drain layers 106 formed within the well layer 101 independently of each other but parallel to each other and a pair of low dope drain layers (hereinafter "LDD layers") 107 formed adjacent to edge portions facing each other of the source/drain layers 106.

The gate oxide film 3 is formed on the LDD layers 107, and a gate electrode 4 is formed on the gate oxide film 3. A side wall oxide film 5 is formed on a side surface of the gate oxide film 3 and the gate electrode 4. Within the well layer 101 ca under the gate electrode 4, a channel dope layer 103 is formed.

The N-channel MOS transistor T2 of the peripheral circuit portion comprises a pair of source/drain layers 106 formed within the well layer 101 independently of each other but parallel to each other and a pair of LDD layers 107.

The gate oxide film 3 is formed on the LDD layers 107, and a gate electrode 4 is formed on the gate oxide film 3. The side wall oxide film 5 is formed on a side surface of the gate oxide film 3 and the gate electrode 4. Within the well layer 101 under the gate electrode 4, a channel dope layer 104 is formed.

The N-channel MOS transistor T3 of the memory cell array portion comprises a pair of source/drain layers 106 formed within the well layer 101 independently of each other but parallel to each other and a pair of LDD layers 107.

A gate oxide film 3 is formed on the source/drain layers 106 and the LDD layers 107, and a gate electrode 4 is formed on the gate oxide film 3. The side wall oxide film 5 is formed on a side surface of the gate oxide film 3 and the gate electrode 4. Within the well layer 101 under the gate electrode 4, a channel dope layer 105 is formed. The memory cell array portion has a gate array structure in which adjacent gates share one source/drain layer 106. Such structures are arranged successively.

Table 1 shows figures regarding the structures of the N-channel MOS transistors T1 to T3.

TABLE 1

|  | SENSE AMPLIFIER PORTION (T1) | PERIPHERAL CIRCUIT PORTION (T2) | MEMORY CELL ARRAY PORTION (T3) |
| --- | --- | --- | --- |
| FIELD OXIDE FILM THICKNESS | 4000 Å | 4000 Å | 4000 Å |
| GATE OXIDE FILM THICKNESS | 100 Å | 100 Å | 100 Å |
| GATE ELECTRODE FILM THICKNESS | 2000 Å | 2000 Å | 2000 Å |
| GATE IMPURITY CONCENTRATION | $5 \times 10^{20}/cm^3$ | $5 \times 10^{20}/cm^3$ | $5 \times 10^{20}/cm^3$ |
| SIDE WALL | 1000 Å | 1000 Å | 1000 Å |

TABLE 1-continued

|  | SENSE AMPLIFIER PORTION (T1) | | | PERIPHERAL CIRCUIT PORTION (T2) | | | MEMORY CELL ARRAY PORTION (T3) | | |
|---|---|---|---|---|---|---|---|---|---|
| WELL | B | 700 keV | $1 \times 10^{13}/cm^2$ | B | 700 keV | $1 \times 10^{13}/cm^2$ | B | 700 keV | $1 \times 10^{13}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $1 \times 10^{12}/cm^2$ | B | 50 keV | $3 \times 10^{12}/cm^2$ | B | 50 keV | $5 \times 10^{12}/cm^2$ |
| LDD | As | 30 keV | $1 \times 10^{13}/cm^2$ | As | 30 keV | $1 \times 10^{13}/cm^2$ | As | 30 keV | $1 \times 10^{13}/cm^2$ |
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| HEATING |  |  |  |  | 850° C. 60 min |  |  |  |  |

In Table 1, impurity dose for forming the channel dope layers of the N-channel MOS transistors T1, T2 and T3 are $1\times10^{12}/cm^2$, $3\times10^{12}/cm^2$ and $5\times10^{2}/cm^2$, respectively. Boron (B) is implanted as an impurity for each of the layers with the implantation energy of 50 keV.

FIG. 73 shows impurity profiles of the N-channel MOS transistors T1, T2 and T3 forming the sense amplifier portion, the peripheral circuit portion and the memory cell array portion, all of which are shown in FIG. 72, taken at cross sectional portions along A–A' line, B–B' line and C–C' line, respectively.

In FIG. 73, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 1, the impurity concentration in the gate electrode stays uniformly at the same quantity among any transistors, and therefore, the A–A' line, the B–B' line and the C–C' line are one atop the other and shown as overlapping straight lines. On the other hand, in the well layer, as described earlier, the channel dose is smaller for a transistor which requires a lower threshold value (i.e., T1<T2<T3), and therefore, the impurity concentration is low at an interface between the oxide film and the bulk. A peak position of each profile is approximately the same as a position at which each channel dope layer is formed.

<Method of Manufacturing the Respective Transistors>

Now, a description will be given on a method of manufacturing the N-channel MOS transistors T1, T2 and T3 of the sense amplifier portion, the peripheral circuit portion and the memory cell array portion which are shown in FIG. 72, with reference to FIGS. 74 to 79.

At a step shown in FIG. 74, the LOCOS layer (i.e., field oxide film) 2 is formed into a thickness of 4,000 Å, for instance, by a LOCOS method on a surface of the semiconductor substrate 1 of the P-type. Following this, boron ions, for instance, are implanted with the energy of 700 keV and at a dose of $1\times10^{13}/cm^2$, thereby forming a P-type well region 101 within the semiconductor substrate 1. Although an N-type well region as well is formed in the semiconductor substrate 1 in order to form P-channel MOS transistors, this is not shown and a description will be omitted. Next, boron ions, for example, are implanted with the energy of 130 keV and at a dose of $5\times10^{12}/cm^2$, thereby forming the channel cut layer 102 within the semiconductor substrate 1. The channel cut layer 102 is formed in such a shape which together with the LOCOS layer 2 creates the element-separated regions.

Next, at step shown in FIG. 75, at a predetermined position within the well region 101, the channel dope layer 103 is formed which has the lowest impurity concentration in accordance with the transistor T1 of the sense amplifier portion. At this stage, the channel dope layer 103 is formed also in regions within the transistors T2 and T3 of the peripheral circuit portion and the memory cell array portion. The channel dope layer 103 is formed by implanting boron ions, for instance, with the energy of 50 keV and at a dose of $1\times10^{12}/cm^2$.

Next, at step shown in FIG. 76, a resist mask R201 is formed on the sense amplifier portion. An impurity is additionally implanted in a selective fashion into the channel dope layer 103 of the peripheral circuit portion and the memory cell array portion, thereby forming the channel dope layer 104 which has an impurity concentration in accordance with the transistor T2 of the peripheral circuit portion. At this stage, the channel dope layer 104 is formed also in a region within the transistor T3 of the memory cell array portion. The channel dope layer 104 is formed by implanting boron ions, for instance, with the energy of 50 keV and at a dose of $2\times10^{12}/cm^2$.

Next, at step shown in FIG. 77, a resist mask R202 is formed on the sense amplifier portion and the peripheral circuit portion, an impurity is additionally implanted in a selective fashion into the channel dope layer 104 of the memory cell array portion, thereby forming the channel dope layer 105 which has an impurity concentration in accordance with the transistor T3 of the memory cell array portion. The channel dope layer 105 is formed by implanting boron ions, for instance, with the energy of 50 keV and at a dose of $2\times10^{12}/cm^2$.

Next, at step shown in FIG. 78, after forming an oxide film 31 which will become the gate oxide film 3 on a main surface of the semiconductor substrate 1 by a thermal oxide method, a doped polysilicon layer 41, for instance, is formed as a gate electrode material on the oxide film 31 by a CVD method. The oxide film 31 has a thickness of about 100 Å, whereas the doped polysilicon layer 41 has a thickness of about 2,000 Å. Phosphorus (P) is used as an impurity. The concentration of the impurity is about $5\times10^{20}/cm^3$.

Next, at step shown in FIG. 79, a resist mask R203 is formed on the doped polysilicon layer 41. By patterning, the gate electrode 4 and the gate oxide film 3 are formed.

Following this, after forming the LDD layers 107 in the sense amplifier portion, the peripheral circuit portion and the memory cell array portion by ion implantation, the side wall oxide film 5 is formed on a side surface of the gate oxide film 3 and the gate electrode 4 into a thickness of about 1,000 Å. Using the side wall oxide film 5 as a mask, by ion implantation, the source/drain layers 106 are formed. In this manner, the structure of the DRAM shown in FIG. 72 is obtained.

Now, the LDD layers 107 are obtained by injecting arsenic (As) ions, for instance, with the energy of 30 keV and at a dose of $1\times10^{13}/cm^2$. Meanwhile, the source/drain layers 106 are obtained by injecting arsenic ions, for instance, with the energy of 50 keV and at a dose of $1\times10^{15}/cm^2$ and thereafter annealing at 850° C. for 60 minutes.

Although this is followed by formation of a capacitor, an inter-layer insulation film, a wiring layer and the like to form the DRAM, this will not be described nor is shown in the drawings.

D<Problems With Conventional DRAM>

As described above, in the conventional DRAM, to form transistors which have different characteristics from each other and which are used in the sense amplifier portion, the peripheral circuit portion, the memory cell array portion and the like within one chip, the impurity concentration of the channel dope layer is changed in accordance with each transistor and the threshold value is adjusted.

However, the higher the impurity concentration of the channel dope layer is, the higher the threshold value becomes. At the same time, since the impurity concentration is high at a junction portion between a diffusion layer and the substrate, a leakage current from the diffusion layer (i.e., diffusion layer leakage increases. In other words, the threshold value and the diffusion layer leakage are in a trade-off relationship with each other, and therefore, a leakage current is determined automatically once the threshold value is determined. Thus, the trade-off relationship between the two imposes a restriction on designing of the circuit.

<Second Conventional Example>

<Overall Structure of Flash Memory>

As a second conventional example, a structure of a flash memory 700 in which a plurality of types of transistors are formed and a method of manufacturing the same will be described.

FIG. 80 shows a structure of the flash memory 700 (cell structure). In general, a flash memory is different from a DRAM in using a high voltage, such as 10V, for writing and erasing. To this end, in the flash memory 700 shown in FIG. 80, a charge pump circuit 710 is disposed as a step-up circuit.

The flash memory 700 comprises not only a memory cell array portion 701 for storing data, but also a high-voltage resistant portion, such as an X decoder 703 and a Y decoder 704, which is used after stepping up, a peripheral circuit portion (i.e., an address buffer 702, a row/column clock portion 705, an I/O pass portion 706, a data register portion 707, a sense amplifier portion 708, an operation control portion 709), and the like. Although any these portions are formed by transistors, due to differences between voltages used, a plurality of types of transistors which have different characteristics from each other are needed.

For instance, a transistor in the memory cell array portion 701 demands an oxide film thickness of about 100 Å, for example, in order to guarantee the reliability of a tunnel oxide film. However, a high amount of current is demanded in the peripheral circuit portion for the purpose of a high-speed operation, and therefore, an oxide film thickness is often set smaller than that of the memory cell array portion 701. Still, in the high-voltage resistant portion, a transistor which withstands a voltage of 10V is necessary. Hence, it is necessary to use a thick oxide film which is as thick as 250 Å, for instance. In short, a plurality of types of transistors which have different oxide film thicknesses from each other are needed within the flash memory which is in the form of one chip.

<Structures of the Respective Transistors>

In the following, an example where an oxide film thickness is changed in accordance with a transistor will be described. FIG. 81 shows (in a partial view) an example of a structure of a flash memory which is fabricated by a conventional manufacturing method. Cross sections of N-channel MOS transistors T11 to T13 which are used for the high-voltage resistant portion, the peripheral circuit portion, and the memory cell array portion are shown.

In FIG. 81, the N-channel MOS transistors T11 to T13 are formed within a P-type well layer 121 which is formed on the same semiconductor substrate 21 (of the P-type). The well layer 121 is element-separated by a channel cut layer 122, which is formed within the well layer 121, and a LOCOS layer 22 in such a manner that the N-channel MOS transistors T11 to T13 are formed in regions which are created by element separation.

The N-channel MOS transistor T11 of the high-voltage resistant portion comprises a pair of source/drain layers 126 formed within the well layer 121 independently of each other but parallel to each other and a pair of LDD layers 127 formed adjacent to edge portions facing each other of the source/drain layers 126.

A gate oxide film 26 is formed on the LDD layers 127, and a gate electrode 29 is formed on the gate oxide film 26. A side wall oxide film 30 is formed on a side surface of the gate oxide film 26 and the gate electrode 29. Within the well layer 121 under the gate electrode 29, a channel dope layer 123 is formed.

The N-channel MOS transistor T12 of the peripheral circuit portion comprises a pair of source/drain layers 126 formed within the well layer 121 independently of each other but parallel to each other and a pair of LDD layers 127.

A gate oxide film 25 is formed on the LDD layers 127, and a gate electrode 29 is formed on the gate oxide film 25. A side wall oxide film 30 is formed on a side surface of the gate oxide film 25 and the gate electrode 29. Within the well layer 121 under the gate electrode 29, a channel dope layer 124 is formed.

The N-channel MOS transistor T13 of the memory cell array portion comprises a pair of source/drain layers 126 formed within the well layer 121 independently of each other but parallel to each other. A tunnel oxide film 23 is formed on edge portions of the source/drain layers 126. A floating gate electrode 27, an inter-layer insulation film 24 and a control gate electrode 28 are formed in this order on the tunnel oxide film 23.

The side wall oxide film 30 is formed on a side surface of the tunnel oxide film 23, the floating gate electrode 27, the inter-layer insulation film 24 and the control gate electrode 28.

Within the well layer 121 under the floating electrode 27, a channel dope layer 125 is formed. The memory cell array portion has a gate array structure in which adjacent gates share one source/drain layer 126. Such structures are arranged successively.

A characteristic of the flash memory which is shown in FIG. 81 is that the thickness of the gate oxide film 26 of the N-channel MOS transistor T11 of the high-voltage resistant portion is largest, followed by the thickness of the tunnel oxide film 23 of the N-channel MOS transistor T13 of the memory cell array portion and the thickness of the gate oxide film 25 of the N-channel MOS transistor T12 of the peripheral circuit portion in this order.

FIG. 82 shows the thicknesses of the respective gate oxide films. In FIG. 82, there are shown the N-channel MOS transistors of the high-voltage resistant portion, the peripheral circuit portion, and the memory cell array portion in this order along the horizontal axis from the left-hand side.

Table 2 shows figures regarding the structures of the N-channel MOS transistors T11 to T13.

TABLE 2

| | HIGH-VOLTAGE RESISTANT PORTION (T11) | | | PERIPHERAL CIRCUIT PORTION (T12) | | | MEMORY CELL ARRAY PORTION (T13) | | |
|---|---|---|---|---|---|---|---|---|---|
| FIELD OXIDE FILM THICKNESS | 4000 Å | | | 4000 Å | | | 4000 Å | | |
| GATE OXIDE FILM THICKNESS | 250 Å | | | 80 Å | | | 100 Å | | |
| FLOATING GATE ELECTRODE FILM THICKNESS | — | | | — | | | 1000 Å | | |
| FLOATING GATE IMPURITY CONCENTRATION | — | | | — | | | $1 \times 10^{20}/cm^3$ | | |
| INTER-LAYER INSULATION FILM THICKNESS | — | | | — | | | TEOS/$Si_3N_4$/TEOS = 100/100/100 Å | | |
| CONTROL GATE ELECTRODE FILM THICKNESS | 2000 Å | | | 2000 Å | | | 2000 Å | | |
| CONTROL GATE IMPURITY CONCENTRATION | $5 \times 10^{20}/cm^3$ | | | $5 \times 10^{20}/cm^3$ | | | $5 \times 10^{20}/cm^3$ | | |
| SIDE WALL | 2000 Å | | | 2000 Å | | | 2000 Å | | |
| WELL | B | 700 keV | $1 \times 10^{13}/cm^2$ | B | 700 keV | $1 \times 10^{13}/cm^2$ | B | 700 keV | $1 \times 10^{13}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $5 \times 10^{12}/cm^2$ | B | 50 keV | $5 \times 10^{12}/cm^2$ | B | 50 keV | $5 \times 10^{12}/cm^2$ |
| LDD | As | 30 keV | $1 \times 10^{13}/cm^2$ | As | 30 keV | $1 \times 10^{13}/cm^2$ | | | — |
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| HEATING | | | | 850° C. 60 min | | | | | |

In Table 2, the thicknesses of the gate oxide films of the N-channel MOS transistors T11, T12 and T13 are 250 Å, 80 Å and 100 Å, respectively.

<Method of Manufacturing the Respective Transistors>

Now, a description will be given on a method of manufacturing the N-channel MOS transistors T11, T12 and T13 of the high-voltage resistant portion, the peripheral circuit portion and the memory cell array portion which are shown in FIG. 81, with reference to FIGS. 83 to 96.

First, at a step shown in FIG. 83, the LOCOS layer (i.e., field oxide film) 22 is formed into a thickness of 4,000 Å, for instance, by a LOCOS method on a surface of the semiconductor substrate 21 of the P-type. Following this, boron ions, for instance, are implanted with the energy of 700 keV and at a dose of $1 \times 10^{13}/cm^2$, thereby forming a P-type well region 121 within the semiconductor substrate 21. Although an N-type well region as well is formed in the semiconductor substrate 21 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 122 within the semiconductor substrate 21. The channel cut layer 122 is formed in such a shape which together with the LOCOS layer 22 creates the element-separated regions.

Next, a channel dope layer 120 is formed at predetermined positions of the high-voltage resistant portion, the peripheral circuit portion and the memory cell array portion within the well region 121. The channel dope layer 120 is formed by implanting boron ions, for instance, with the energy of 50 keV and at a dose of $1 \times 10^{12}/cm^2$.

Next, at a step shown in FIG. 84, after forming an oxide film 231 which will become the tunnel oxide film 23 on a main surface of the semiconductor substrate 21 by a thermal oxide method, a doped polysilicon layer 271, for instance, is formed as a gate electrode material on the oxide film 231 by a CVD method. The oxide film 231 has a thickness of about 100 Å, whereas the doped polysilicon layer 271 has a thickness of about 1,000 Å. Phosphorus (P) is used as an impurity. The concentration of the impurity is about $1 \times 10^{20}/cm^3$.

Next, at a step shown in FIG. 85, a resist mask R221 is formed selectively on the doped polysilicon layer 271 within the memory cell array portion. In this case, the resist mask R121 is formed along the gate-width direction of the memory cell array portion. A portion of the doped polysilicon layer 271 which is not covered with the resist mask R121 is removed by anisotropic etching. FIG. 86 shows this condition.

FIG. 86 is a plan view viewing FIG. 85 from the upper surface side (i.e., the side on which the resist mask R221 is formed). Within the memory cell array portion, the resist mask R221 is formed as rectangular islands which are arranged regularly. The resist mask R221 is formed to cover an active layer AL which has a configuration like a rectangular island and an LOCOS layer LL around the same. Within the high-voltage resistant portion and the peripheral circuit portion, since the resist mask R is not formed, the active layer AL is exposed. Although FIG. 86 partially omits the resist mask R221 so that the active layer AL and the LOCOS layer LL are visible, this is only for the clarity of illustration of the structure below the resist mask R221 and merely for the convenience of illustration.

Next, after removing the resist mask R221, at a step shown in FIG. 87, an insulation film 241, which will become the inter-layer insulation film 24 which insulates the floating gate from the control gate, is formed above the doped polysilicon layer 271 by a CVD method. This film has a structure in which a TEOS (tetraethyl orthosilicate) film, a nitride film ($Si_3N_4$) film, a TEOS film each having a thickness of 100 Å are stacked in this order. The inter-layer insulation film 24 is referred to as "ONO film" in some cases. The insulation film 241 is formed on the high-voltage resistant portion and the peripheral circuit portion as well.

Next, at a step shown in FIG. 88, a resist mask R222 is formed on the insulation film 241 of the memory cell array portion, and the insulation film 241 in all other regions is removed. In this case, in the other regions, the oxide film 231 is removed as well. FIG. 89 shows this condition.

FIG. 89 is a plan view viewing FIG. 88 from the upper surface side (i.e., the side on which the resist mask R222 is formed). The resist mask R222 is formed to entirely cover the memory cell array portion. However, within the high-voltage resistant portion and the peripheral circuit portion, since the resist mask R222 is not formed, the active layer AL is exposed.

Next, after removing the resist mask R222, at a step shown in FIG. 90, an oxide film 261 which will become the gate oxide film 26 is formed entirely on the main surface of the semiconductor substrate 21 by a thermal oxide method.

At this stage, since the insulation film 241 on the memory cell array portion includes the nitride film, the insulation film 241 is not oxidized and the thickness of the insulation film 241 is maintained. The thickness of the oxide film 261 is about 170 Å.

Next, at a step shown in FIG. 91, regions other than the peripheral circuit portion are covered with a resist mask R223 and the oxide film 261 on the oxide film 261 is removed by wet etching. FIG. 92 shows this condition.

FIG. 92 is a plan view viewing FIG. 91 from the upper surface side (i.e., the side on which the resist mask R223 is formed). The resist mask R223 is formed to entirely cover the memory cell array portion and the high-voltage resistant portion. However, within the peripheral circuit portion, since the resist mask R223 is not formed, the active layer AL is exposed.

Next, after removing the resist mask R223, at a step shown in FIG. 93, an oxide film 251 which will become the gate oxide film 25 is formed by a thermal oxide method. At this stage, since the insulation film 241 on the memory cell array portion includes the nitride film, the insulation film 241 is not oxidized and the thickness of the insulation film 241 is maintained. However, within the high-voltage resistant portion, the oxide film 261 grows and gains film thickness.

The thickness of the oxide film 251 is about 80 Å. The oxide film 261 grows to about 250 Å.

Next, at a step shown in FIG. 94, a doped polysilicon layer 291 is formed, as a gate electrode material, entirely on the main surface of the semiconductor substrate 21 by a CVD method. The thickness of the doped polysilicon layer 291 is about 2,000 Å. Phosphorus (P) is used as an impurity. The concentration of the impurity is about $5 \times 10^{20}/cm^3$.

Next, at a step shown in FIG. 95, a resist mask R224 is formed on the doped polysilicon layer 291 and patterned. FIG. 96 shows this condition.

FIG. 96 is a plan view viewing FIG. 95 from the upper surface side (i.e., the side on which the resist mask R224 is formed). The resist mask R224 is formed to be perpendicular to the active layer AL which has a rectangular configuration.

As a result of patterning, the gate oxide film 26 and gate electrode 29 are formed within the high-voltage resistant portion, the gate oxide film 25 and gate electrode 29 are formed within the peripheral circuit portion, and the tunnel oxide film 23, the floating gate electrode 27 and the control gate electrode 28 are formed within the memory cell array portion.

Following this, after forming the LDD layers 127 by implanting ions into the high-voltage resistant portion and the peripheral circuit portion, the side wall oxide film 30 of about 1,000 Å in thickness is formed on a side surface of the gate oxide film 26 and gate electrode 29, on a side surface of the gate oxide film 25 and gate electrode 29, and on a side surface of the tunnel oxide film 23, the floating gate electrode 27, the inter-layer insulation film 24 and the control gate electrode 28. Using the side wall oxide film 30 as a mask, by ion implantation, the source/drain layers 126 are formed. In this manner, the structure of the flash memory which is shown in FIG. 81 is obtained.

Now, the LDD layers 127 are obtained by implanting arsenic ions, for instance, with the energy of 30 keV and at a dose of $1 \times 10^{13}/cm^2$. Meanwhile, the source/drain layers 126 are obtained by injecting arsenic ions, for instance, with the energy of 50 keV and at a dose of $5 \times 10^{15}/cm^2$ and thereafter annealing at 850° C. for 60 minutes.

Although this is followed by formation of a capacitor, an inter-layer insulation film, a wiring layer and the like to form the flash memory, this will not be described nor is shown in the drawings.

<Problems With Conventional Flash Memory>

As described above, as in the conventional DRAM, in the conventional flash memory, there is a trade-off relationship between a threshold value and a diffusion layer leakage. The trade-off relationship imposes a restriction on designing of the circuit.

Further, since it is necessary to form a plurality of types of transistors which have different oxide film thicknesses from each other within the flash memory which is in the form of one chip, it is necessary to form the oxide films at more than one step in some cases. For example, within the high-voltage resistant portion, at the step of removing the resist mask R223 (See FIG. 91), the oxide film 261 is grown further during formation of the oxide film 251 (See FIG. 93). That is, the oxide film 261 is formed at two steps. This leads to a higher possibility of allowing entry of an impurity or the like, which in turn degrades the reliability of the gate oxide film 26 or worsens the controllability of the film thickness. This further leads to a problem that the reliability of the N-channel MOS transistor T11 of the high-voltage resistant portion is lost, etc.

<Third Conventional Example>
<Overall Structure of DRAM Comprising Logic Circuit>

As a third conventional example, a structure of a DRAM 800 which comprises a logic circuit (hereinafter "LOGIC in DRAM") and a method of manufacturing the same will be described.

The LOGIC in DRAM 800 is a device which executes a high performance and requires only a low cost, since a logic circuit is formed within the same chip so that the DRAM and the logic circuit, which have been heretofore formed as separate chips, are combined with each other.

As shown in FIG. 97, the LOGIC in DRAM 800 is roughly divided into a logic portion and a DRAM portion. A requirement of the logic portion is operation at a high speed, that is, a high driving capability and a low capacity. Meanwhile, as described earlier, the DRAM portion includes a memory cell array portion in which a leakage current is demanded, a sense amplifier portion in which an operation at a low voltage is demanded, etc. That is, a plurality of types of transistors which have different characteristics from each other are needed within the LOGIC in DRAM 800 which is formed as one chip.

<Structures of the Respective Transistors>

A conventional approach for forming transistors which have different characteristics from each other within one chip is to change an impurity profile of a channel dope layer or an oxide film thickness in accordance with a transistor. In the following, with respect to the DRAM portion, an example where an impurity concentration of a channel dope layer is changed in accordance with a transistor will be described, whereas with respect to the logic portion, an example where an oxide film thickness is changed in accordance with a transistor will be described.

FIG. 98 shows (in a partial view) an example of a structure of a LOGIC in DRAM which is fabricated by a conventional manufacturing method. Cross sections of N-channel MOS transistors T21 to T23 which are used for the logic portion and for the sense amplifier portion and memory cell array portion of the DRAM portion are shown.

In FIG. 98, the N-channel MOS transistors T21 to T23 are formed within a P-type well layer 151 which is formed on the same semiconductor substrate 51 (of the P-type). The well layer 151 is element-separated by a channel cut layer 152 which is formed within the well layer 151 and a LOCOS layer 52 in such a manner that the N-channel MOS transistors T21 to T23 are formed in regions which are created by element separation.

The N-channel MOS transistor T21 of the logic portion comprises a pair of source/drain layers 156 formed within the well layer 151 independently of each other but parallel to each other and a pair of LDD layers 157 formed adjacent to edge portions facing each other of the source/drain layers 156.

A gate oxide film 54 is formed on the LDD layers 157, and a gate electrode 55 is formed on the gate oxide film 54. A side wall oxide film 56 is formed on a side surface of the gate oxide film 54 and the gate electrode 55. Within the well layer 151 under the gate electrode 55, a channel dope layer 155 is formed.

The N-channel MOS transistor T22 of the sense amplifier portion comprises a pair of source/drain layers 156 formed within the well layer 151 independently of each other but parallel to each other and a pair of LDD layers 157.

A gate oxide film 53 is formed on the LDD layers 157, and a gate electrode 55 is formed on the gate oxide film 53. The side wall oxide film 56 is formed on a side surface of the gate oxide film 53 and the gate electrode 55. Within the well layer 151 under the gate electrode 55, a channel dope layer 154 is formed.

The N-channel MOS transistor T23 of the memory cell array portion comprises a pair of source/drain layers 156 formed within the well layer 151 independently of each other but parallel to each other and a pair of LDD layers 157.

The gate oxide film 53 is formed on the source/drain layers 156 and the LDD layers 157, and the gate electrode 55 is formed on the gate oxide film 53. The side wall oxide film 56 is formed on a side surface of the gate oxide film 53 and the gate electrode 55. Within the well layer 151 under the gate electrode 55, a channel dope layer 153 is formed. The memory cell array portion has a gate array structure in which adjacent gates share one source/drain layer 156. Such structures are arranged successively.

Table 3 shows figures regarding the structures of the N-channel MOS transistors T21 to T23.

In FIG. 99, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 3, the impurity concentration in the gate electrode stays uniformly at the same quantity among any transistors, and therefore, the A–A' line, the B–B' line and the C–C' line are one atop the other and shown as overlapping straight lines (shown as two lines in the drawing to distinguish the A–A' line). On the other hand, in the well layer, the channel dose is smaller for a transistor of the sense amplifier portion which requires a low threshold value, and therefore, the impurity concentration is low at an interface between the oxide film and the bulk. A peak position of each profile is approximately the same as a position at which each channel dope layer is formed.

FIG. 100 shows thicknesses of the respective gate oxide films. In FIG. 100, the N-channel MOS transistors of the logic portion, the sense amplifier portion and the memory cell array portion are shown in this order along the horizontal axis from the left-hand side. As shown in FIG. 100, in order to improve the current driving capability, the logic portion has a thinner oxide film thickness than those of the sense amplifier portion and the memory cell array portion of the DRAM portion.

<Method of Manufacturing the Respective Transistors>

In the following, a description will be given on a method of manufacturing the N-channel MOS transistors T21, T22 and T23 of the logic portion, the sense amplifier portion and the memory cell array portion of the DRAM portion which are shown in FIG. 98, with reference to FIGS. 101 to 109.

First, at a step shown in FIG. 101, the LOCOS layer (i.e., field oxide film) 52 is formed to a thickness of 4,000 Å, for instance, by a LOCOS method, on a surface of the semiconductor substrate 51 of the P-type. Following this, boron

TABLE 3

| | LOGIC PORTION (T21) | | | SENSE AMPLIFIER PORTION (T22) | | | MEMORY CELL ARRAY PORTION (T23) | | |
|---|---|---|---|---|---|---|---|---|---|
| FIELD OXIDE FILM THICKNESS | 4000 Å | | | 4000 Å | | | 4000 Å | | |
| GATE OXIDE FILM THICKNESS | 60 Å | | | 100 Å | | | 100 Å | | |
| GATE ELECTRODE FILM THICKNESS | 2000 Å | | | 2000 Å | | | 2000 Å | | |
| GATE IMPURITY CONCENTRATION | $5 \times 10^{20}/cm^3$ | | | $5 \times 10^{20}/cm^3$ | | | $5 \times 10^{20}/cm^3$ | | |
| SIDE WALL | 1000 Å | | | 1000 Å | | | 1000 Å | | |
| WELL | B | 700 keV | $1 \times 10^{15}/cm^2$ | B | 700 keV | $1 \times 10^{15}/cm^2$ | B | 700 keV | $1 \times 10^{15}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $1 \times 10^{12}/cm^2$ | B | 50 keV | $1 \times 10^{12}/cm^2$ | B | 50 keV | $1 \times 10^{12}/cm^2$ |
| LDD | As | 30 keV | $1 \times 10^{13}/cm^2$ | As | 30 keV | $1 \times 10^{13}/cm^2$ | As | 30 keV | $1 \times 10^{13}/cm^2$ |
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| HEATING | | | | 850° C. 30 min | | | | | |

In Table 3, impurity dose for forming the channel dope layers of the N-channel MOS transistors T21, T22 and T23 are $1 \times 10^{13}/cm^2$, $1 \times 10^{12}/cm^2$ and $5 \times 10^{12}/cm^2$, respectively. Boron (B) is implanted as an impurity for each of the layers with the implantation energy of 50 keV.

Further, the thicknesses of the gate oxide films of the N-channel MOS transistors T21, T22 and T23 are 60 Å, 100 Å and 100 Å, respectively.

FIG. 99 shows impurity profiles of the N-channel MOS transistors T21, T22 and T23 of the logic portion, the sense amplifier portion and the memory cell array portion, all of which shown in FIG. 98, taken at cross sectional portions along A–A' line, B–B' line and C–C' line, respectively.

ions, for instance, are implanted with the energy of 700 keV and at a dose of $1 \times 10^{13}/cm^2$, thereby forming a P-type well region 151 within the semiconductor substrate 51. Although an N-type well region as well is formed in the semiconductor substrate 51 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 152 within the semiconductor substrate 51. The channel cut layer 152 is formed in such a shape which together with the LOCOS layer 52 creates the element-separated regions.

Next, at a step shown in FIG. 102, at a predetermined position within the well region 151, the channel dope layer 154 is formed which has the lowest impurity concentration in accordance with the transistor 12 of the sense amplifier portion. At this stage, the channel dope layer 154 is formed also in regions within the transistors T21 and T23 of the logic portion and the memory cell array portion. The channel dope layer 154 is formed by implanting boron ions, for instance, with the energy of 50 keV and at a dose of $1 \times 10^{12}/cm^2$.

Next, at a step shown in FIG. 103, a resist mask R251 is formed on the sense amplifier portion. An impurity is additionally implanted in a selective fashion into the channel dope layer 154 of the logic portion and the memory cell array portion, thereby forming the channel dope layer 153 which has an impurity concentration in accordance with the transistor T23 of the memory cell array portion. At this stage, the channel dope layer 153 is formed also in a region within the transistor T21 of the logic portion. The channel dope layer 153 is formed by implanting boron ions, for instance, with the energy of 50 keV and at a dose of $4 \times 10^{12}/cm^2$.

Next, at a step shown in FIG. 104, a resist mask R252 is formed on the sense amplifier portion and the memory cell array portion. An impurity is additionally implanted in a selective fashion into the channel dope layer 153 of the logic portion, thereby forming the channel dope layer 155 which has an impurity concentration in accordance with the transistor T21 of the logic portion. The channel dope layer 155 is formed by implanting boron ions, for instance, with the energy of 50 keV and at a dose of $5 \times 10^{12}/cm^2$.

Next, at a step shown in FIG. 105, an oxide film 531 which will become the gate oxide film 53 is formed on the main surface of the semiconductor substrate 51 by a thermal oxide method. The thickness of the oxide film 531 is about 40 Å.

Next, at a step shown in FIG. 106, the thickness of the oxide film 531 of the sense amplifier portion and the memory cell array portion is covered with a resist mask R253, and the thickness of the oxide film 531 which is located on the logic portion alone is selectively removed.

Next, after removing the resist mask R253, at a step shown in FIG. 107, an oxide film 541 which will become the gate oxide film 54 is formed on the main surface of the semiconductor substrate 51 by a thermal oxide method. At this stage, the insulation film 531 on the sense amplifier portion and the memory cell array portion grows and gains film thickness. The thickness of the oxide film 541 is about 60 Å. The oxide film 531 grows to about 100 Å.

Next, at a step shown in FIG. 108, a doped polysilicon layer 551 is formed, as a gate electrode material, on the oxide film 531 and the oxide film 541 by a CVD method. The thickness of the doped polysilicon layer 551 is about 2,000 Å. Phosphorus (P) is used as an impurity. The concentration of the impurity is about $1 \times 10^{20}/cm^3$.

Next, at a step shown in FIG. 109, a resist mask R254 is formed on the doped polysilicon layer 551 and patterned. By patterning, the gate electrode 54 and the gate electrode 55 are formed in the logic portion while the gate oxide film 53 and the gate electrode 55 are formed in the sense amplifier portion and the memory cell array portion.

Following this, after forming the LDD layers 157 by implanting ions into the logic portion, the sense amplifier portion and the memory cell array portion, the side wall oxide film 56 of about 1,000 Å in thickness is formed on a side surface of the gate oxide film 54 and gate electrode 55 within the logic portion, and on a side surface of the gate oxide film 53 and gate electrode 55 within the sense amplifier portion and the memory cell array portion. Using the side wall oxide film 56 as a mask, by ion implantation, the source/drain layers 156 are formed. In this manner, the structure of the LOGIC in DRAM which is shown in FIG. 98 is obtained.

Now, the LDD layers 157 are obtained by implanting arsenic (As) ions, for instance, with the energy of 30 keV and at a dose of $1 \times 10^{13}/cm^2$. Meanwhile, the source/drain layers 156 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in DRAM, this will not be described nor is shown in the drawings.

<Problems With Conventional LOGIC in DRAM>

As described above, in the conventional LOGIC in DRAM, to form transistors which are used in the logic portion, the sense amplifier portion and the memory cell array portion and which have different characteristics from each other within one chip, the impurity concentration of the channel dope layer is changed in accordance with each transistor and a threshold value is adjusted.

However, as the impurity concentration of the channel dope layer becomes higher, the threshold value increases. At the same time, a diffusion layer leakage increases since the impurity concentration becomes high at a junction portion between a diffusion layer and the substrate, for instance. In other words, the threshold value and the diffusion layer leakage are in a trade-off relationship with each other, and therefore, a leakage current is determined automatically once the threshold value is determined. Thus, the trade-off relationship between the two imposes a restriction on designing of the circuit.

Further, in order to improve the current driving capability, the logic portion has a thinner oxide film thickness than those of the other portions. To this end, it is necessary to form a plurality of types of transistors which have different oxide film thicknesses from each other within the flash memory which is in the form of one chip, it is necessary to form the oxide films at more than one step in some cases. For example, within the sense amplifier portion and the memory cell array portion, at the step of removing the resist mask R253 (See FIG. 106), the insulation film 531 is grown further during formation of the oxide film 541 (See FIG. 107). That is, the oxide film 531 is formed in two steps. This leads to a higher possibility of allowing entry of an impurity or the like, which in turn degrades the reliability of the gate oxide film 53 or worsens the controllability of the film thickness. This further leads to a problem that the reliability of the N-channel MOS transistors T22 and T23 of the sense amplifier portion and the memory cell array portion is lost, etc.

<Fourth Conventional Example>
<Overall Structure of Flash Memory Comprising Logic Circuit>

As a fourth conventional example, a structure of a flash memory 900 which comprises a logic circuit (hereinafter "LOGIC in FLASH") and a method of manufacturing the same will be described.

One of R&D targets which are attracting attention as a transistor becomes denser is development of a one-chip microcomputer in which a microcomputer is fabricated within one chip, while another R&D target under close attention is a larger capacity. An element in which a flash memory and a MPU microprocessing unit) are formed within one chip, in particular, is called flash-consolidated logic as the one which is made public in 1995 IEDM SHORT COURSE PROGRAM, "EMBEDDED FLASH MEMORY APPLICATIONS, TECHNOLOGY AND DESIGN," CLINTON KUO, MOTOROLA, and others.

FIG. 110 shows one example. As shown in FIG. 110, the LOGIC in FLASH 900 is roughly divided into a logic portion and a flash memory portion. A requirement of the logic portion is operation at a high speed, that is, a high driving capability and a low capacity.

The flash memory portion comprises a high-voltage resistant portion in which a high voltage is applied, a memory cell array portion in which a tunnel oxide film needs to be highly reliable, and the like. That is, a plurality of types of transistors which have different characteristics from each other are needed within the LOGIC in FLASH which is formed as one chip.

<Structures of the Respective Transistors>

A conventional approach for forming transistors which have different characteristics from each other within one chip is to change an oxide film thickness in accordance with a transistor, or if necessary, to change an impurity profile of a channel dope layer. In the following, an example where an oxide film thickness in accordance with a transistor while changing an impurity concentration of a channel dope layer will be described.

FIG. 111 shows (in a partial view) an example of a structure of a LOGIC in FLASH which is fabricated by a conventional manufacturing method. Cross sections of N-channel MOS transistors T31 to T33 which are used for the logic portion and for the high-voltage resistant portion and the memory cell array portion of the flash memory portion are shown.

In FIG. 111, the N-channel MOS transistors T31 to T33 are formed within a P-type well layer 171 which is formed on the same semiconductor substrate 71 (of the P-type). The well layer 171 is element-separated by a channel cut layer 171 which is formed within the well layer 171 and a LOCOS layer 72 in such a manner that the N-channel MOS transistors T31 to T33 are formed in regions which are created by element separation.

The N-channel MOS transistor T31 of the logic portion comprises a pair of source/drain layers 176 formed within the well layer 171 independently of each other but parallel to each other and a pair of LDD layers 177 formed adjacent to edge portions facing each other of the source/drain layers 176.

A gate oxide film 76 is formed on the LDD layers 177, and a gate electrode 79 is formed on the gate oxide film 76. A side wall oxide film 80 is formed on a side surface of the gate oxide film 76 and the gate electrode 79. Within the well layer 171 under the gate electrode 79, a channel dope layer 175 is formed.

The N-channel MOS transistor T32 of the high-voltage resistant portion of the flash memory portion comprises a pair of source/drain layers 176 formed within the well layer 171 independently of each other hut parallel to each other and a pair of LDD layers 177.

A gate oxide film 75 is formed on the LDD layers 177, and a gate electrode 79 is formed on the gate oxide film 75. The side wall oxide film 80 is formed on a side surface of the gate oxide film 75 and the gate electrode 79. Within the well layer 171 under the gate electrode 79, a channel dope layer 173 is formed.

The N-channel MOS transistor T33 of the memory cell array portion of the flash memory portion comprises a pair of source/drain layers 176 formed within the well layer 171 independently of each other but parallel to each other. A tunnel oxide film 73 is formed on edge portions of the source/drain layers 176. A floating gate electrode 77, an inter-layer insulation film 74 and a control gate electrode 78 are formed in this order on the tunnel oxide film 73.

The side wall oxide film 80 is formed on a side surface of the tunnel oxide film 73, the floating gate electrode 77, the inter-layer insulation film 74 and the control gate electrode 78.

Within the well layer 171 under the floating electrode 77, a channel dope layer 175 is formed. The memory cell array portion has a gate array structure in which adjacent gates share one source/drain layer 176. Such structures are arranged successively.

A characteristic of the flash memory which is shown in FIG. 111 is that the thickness of the gate oxide film 75 of the N-channel MOS transistor T32 of the high-voltage resistant portion is largest, followed by the thickness of the tunnel oxide film 73 of the N-channel MOS transistor T33 of the memory cell array portion and the thickness of the gate oxide film 76 of the N-channel MOS transistor T31 of the logic portion in this order, and that the impurity concentration of the channel dope layer 173 of the N-channel MOS transistor T32 of the high-voltage resistant portion is lower than those of the other channel dope layers.

Table 4 shows figures regarding the structures of the N-channel MOS transistors T31 to T33.

TABLE 4

| | LOGIC PORTION (T31) | | | SENSE AMPLIFIER PORTION (T32) | | | MEMORY CELL ARRAY PORTION (T33) | | |
|---|---|---|---|---|---|---|---|---|---|
| FIELD OXIDE FILM THICKNESS | 4000 Å | | | 4000 Å | | | 4000 Å | | |
| GATE OXIDE FILM THICKNESS | 60 Å | | | 250 Å | | | 100 Å | | |
| FLOATING GATE ELECTRODE FILM THICKNESS | — | | | — | | | 1000 Å | | |
| FLOATING GATE IMPURITY CONCENTRATION | — | | | — | | | $1 \times 10^{20}/cm^3$ | | |
| INTER-LAYER INSULATION FILM THICKNESS | — | | | — | | | TEOS/$Si_3N_4$/TEOS = 100/100/100 Å | | |
| CONTROL GATE ELECTRODE FILM THICKNESS | 2000 Å | | | 2000 Å | | | 2000 Å | | |
| CONTROL GATE IMPURITY CONCENTRATION | $5 \times 10^{20}/cm^3$ | | | $5 \times 10^{20}/cm^3$ | | | $5 \times 10^{20}/cm^3$ | | |
| SIDE WALL | 1000 Å | | | 1000 Å | | | 1000 Å | | |
| WELL | B | 700 keV | $1 \times 10^{15}/cm^2$ | B | 700 keV | $1 \times 10^{15}/cm^2$ | B | 700 keV | $1 \times 10^{15}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $1 \times 10^{13}/cm^2$ | B | 50 keV | $1 \times 10^{12}/cm^2$ | B | 50 keV | $1 \times 10^{13}/cm^2$ |
| LDD | As | 30 keV | $1 \times 10^{13}/cm^2$ | As | 30 keV | $1 \times 10^{13}/cm^2$ | — | | |

TABLE 4-continued

| | | LOGIC PORTION (T31) | | | SENSE AMPLIFIER PORTION (T32) | | | MEMORY CELL ARRAY PORTION (T33) | | |
|---|---|---|---|---|---|---|---|---|---|---|
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| HEATING | | | | | 850° C. 30 min | | | | | |

In Table 4, the thicknesses of the gate oxide films of the N-channel MOS transistors T31, T32 and T33 are 60 Å, 250 Å and 100 Å, respectively.

Further, an impurity dose for forming the channel dope layer 173 of the N-channel MOS transistor T32 is $1 \times 10^{12}/cm^2$, while an impurity dose for forming the channel dope layer 173 of the N-channel MOS transistors T31 and T33 is $1 \times 10^{13}/cm^2$. Boron (B) is implanted as an impurity for either layers with the implantation energy of 50 keV.

FIG. 112 shows impurity profiles of the N-channel MOS transistors T31, T32 and T33 forming the sense amplifier portion, the peripheral circuit portion and the memory cell array portion, all of which shown in FIG. 111, taken at cross sectional portions along line A–A', line B–B' and line C–C' respectively.

In FIG. 112, a position (i.e., depth) in a cross sectional direction is shown along a horizontal axis and an impurity concentration is shown along a vertical axis. There are the gate electrode (polysilicon layer), the gate oxide film ($SiO_2$ layer) and the well layer (bulk silicon layer) in this order along the horizontal axis from the left-hand side.

As shown in Table 4, the impurity concentration in the gate electrode stays uniformly at the same quantity among any transistors, and therefore, the A–A' line, the B–B' line and the C–C' line are one atop the other and shown as overlapping straight lines (shown as three lines in the drawing to distinguish the respective lines). On the other hand, in the well layer, the channel dose is smaller for a transistor of the high-voltage resistant portion which requires a low threshold value, and therefore, the impurity concentration is low at an interface between the oxide film and the bulk. A peak position of each profile is approximately the same as a position at which each channel dope layer is formed.

FIG. 113 shows thicknesses of the respective gate oxide films. In FIG. 113, the N-channel MOS transistors of the logic portion, the high-voltage resistant portion and the memory cell array portion are shown in this order along the horizontal axis from the left-hand side. As shown in FIG. 113, the oxide film of the high-voltage resistant portion of the flash memory portion is thickest, while the oxide film of the logic portion is the thinnest in order to improve the current driving capability, <Method of Manufacturing the Respective Transistors>

In the following, a description will be given on a method of manufacturing the N-channel MOS transistors T31 to T33 of the logic portion, and of the high-voltage resistant portion and the memory cell array portion of the flash memory portion, which are shown in FIG. 111, with reference to FIGS. 114 to 127.

First, at a step shown in FIG. 114, the LOCOS layer (i.e., field oxide film) 72 is formed into a thickness of 4,000 Å, for instance, by a LOCOS method, on a surface of the semiconductor substrate 71 of the P-type. Following this, boron ions, for instance, are implanted with the energy of 700 keV and at a dose of $1 \times 10^{13}/cm^2$, thereby forming a P-type well region 171 within the semiconductor substrate 71. Although an N-type well region as well is formed in the semiconductor substrate 71 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 172 within the semiconductor substrate 71. The channel cut layer 172 is formed in such a shape which together with the LOCOS layer 72 creates the element-separated regions.

Next; the channel dope layer 173 which has the lowest impurity concentration is formed within the well region 171 of the transistor T32 of the high-voltage resistant portion. The channel dope layer 173 is formed by implanting boron ions, for instance, with the energy of 50 keV and at a dose of $1 \times 10^{12}/cm^2$.

Next, an impurity is implanted into the well region 171 of the transistors T31 and T33 of the logic portion and the memory cell array portion, thereby forming the channel dope layer 175 which has an impurity concentration in accordance with the transistors T31 and T33 of the logic portion and the memory cell array portion. The channel dope layer 175 is formed by implanting boron ions, for instance, with D3 the energy of 50 keV and at a dose of $1 \times 10^{13}/cm^2$.

Next, at a step shown in FIG. 115, after forming an oxide film 731 which will become the tunnel oxide film 73 on a main surface of the semiconductor substrate 71 by a thermal oxide method, a doped polysilicon layer 771, for instance, is formed as a gate electrode material on the oxide film 731 by a CVD method. The oxide film 731 has a thickness of about 100 Å, whereas the doped polysilicon layer 771 has a thickness of about 1,000 Å. Phosphorus (P) is used as an impurity. The concentration of the impurity is about $1 \times 10^{20}/cm^3$.

Next, at a step shown in FIG. 116, a resist mask R261 is formed selectively on the doped polysilicon layer 771 within the memory cell array portion. In this case, the resist mask R261 is formed along the gate-width direction of the memory cell array portion. A portion of the doped polysilicon layer 771 which is not covered with the resist mask R261 is removed by anisotropic etching. FIG. 117 shows this condition.

FIG. 117 is a plan view viewing FIG. 116 from the upper surface side (i.e., the side on which the resist mask R261 is formed). Within the memory cell array portion, the resist mask R261 is formed as rectangular islands which are arranged regularly. The resist mask R261 is formed to cover an active layer AL which has a configuration like a rectangular island and an LOCOS layer LL around the same. Within the high-voltage resistant portion and the logic portion, since the resist mask R261 is not formed, the active layer AL is exposed. Although FIG. 87 partially omits the resist mask R261 so that the active layer AL and the LOCOS layer LL are visible, this is only for the clarity of illustration of the structure below the resist mask R261 and merely for the convenience of illustration.

Next, after removing the resist mask R261, at a step shown in FIG. 118, an insulation film 741, which will become the inter-layer insulation film 74 which insulates the floating gate from the control gate, is formed above the doped polysilicon layer 771 by a CVD method. This film has a structure in which a TEOS (tetraethyl orthosilicate) film, a nitride film (Si$_3$N$_4$) film, a TEOS film each having a thickness of 100 Å are stacked in this order. The inter-layer insulation film 74 is referred to as "ONO film" in some cases. The insulation film 741 is formed on the high-voltage resistant portion and the logic portion as well.

Next, at a step shown in FIG. 119, a resist mask R262 is formed on the insulation film 741 of the memory cell array portion, and the insulation film 741 in all other regions is removed. In this case, in the other regions, the oxide film 731 is removed as well. FIG. 120 shows this condition.

FIG. 120 is a plan view viewing FIG. 119 from the upper surface side (i.e., the side on which the resist mask R262 is formed). The resist mask R262 is formed to entirely cover the memory cell array portion. However, within the high-voltage resistant portion and the logic portion, since the resist mask R262 is not formed, the active layer AL is exposed.

Next, after removing the resist mask R262, at a step shown in FIG. 121, an oxide film 751 which will become the gate oxide film 75 is formed entirely on the main surface of the semiconductor substrate 71 by a thermal oxide method. At this stage, since the insulation film 741 on the memory cell array portion includes the nitride film, the insulation film 741 is not oxidized and the thickness of the insulation film 741 is maintained. The thickness of the oxide film 751 is about 190 Å.

Next, at a step shown in FIG. 122, regions other than the logic portion are covered with a resist mask R263 and the oxide film 751 on the logic portion is removed by wet etching. FIG. 123 shows this condition.

FIG. 123 is a plan view viewing FIG. 122 from the upper surface side (i.e., the side on which the resist mask R263 is formed). The resist mask R263 is formed to entirely cover the memory cell array portion and the high-voltage resistant portion. However, within the logic portion, since the resist mask R263 is not formed, the active layer AL is exposed.

Next, after removing the resist mask R263, at a step shown in FIG. 124, an oxide film 761 which will become the gate oxide film 76 is formed by a thermal oxide method. At this stage, since the insulation film 741 on the memory cell array portion includes the nitride film, the insulation film 741 is not oxidized and the thickness of the insulation film 741 is maintained. However, within the high-voltage resistant portion, the oxide film 751 grows and gains film thickness. The thickness of the oxide film 761 is about 60 Å. The oxide film 751 grows about 250 Å.

Next, at a step shown in FIG. 125, a doped polysilicon layer 791 is formed, as a gate electrode material, entirely on the main surface of the semiconductor substrate 71 by a CVD method. The thickness of the doped polysilicon layer 791 is about 2,000 Å. Phosphorus (P) is used as an impurity. The concentration of the impurity is about $5 \times 10^{10}$/cm$^3$.

Next, at a step shown in FIG. 126, a resist mask R264 is formed on the doped polysilicon layer 791 and patterned. FIG. 127 shows this condition.

FIG. 127 is a plan view viewing FIG. 126 from the upper surface side (i.e., the side on which the resist mask R264 is formed). The resist mask R264 is formed to be perpendicular to the active layer AL which has a rectangular configuration.

As a result of patterning, the gate oxide film 76 and gate electrode 79 are formed within the logic portion, the gate oxide film 76 and gate electrode 79 are formed within the high-voltage resistant portion, and the tunnel oxide film 73, the floating gate electrode 77 and the control gate electrode 78 are formed within the memory cell array portion.

Following this, after forming the LDD layers 177 by implanting ions into the logic portion and the high-voltage resistant portion, the side wall oxide film 80 of about 1,000 Å in thickness is formed on a side surface of the gate oxide film 76 and gate electrode 79, on a side surface of the gate oxide film 76 and gate electrode 79, and on a side surface of the tunnel oxide film 73, the floating gate electrode 77, the inter-layer insulation film 74 and the control gate electrode 78. Using the side wall oxide film 80 as a mask, by ion implantation, the source/drain layers 176 are formed. In this manner, the structure of the flash memory which is shown in FIG. 111 is obtained.

Now, the LDD layers 177 are obtained by implanting arsenic ions, for instance, with the energy of 30 keV and at a dose of $1 \times 10^{13}$/cm$^2$. Meanwhile, the source/drain layers 176 are obtained by injecting arsenic ions, for instance, with the energy of 50 keV and at a dose of $5 \times 10^{15}$/cm$^2$ and thereafter annealing at 850° C. for 30 minutes.

Although this is followed by formation of a capacitor, an inter-layer insulation film, a wiring layer and the like to form the LOGIC in FLASH, this will not be described nor is shown in the drawings.

<Problems With Conventional LOGIC in FLASH>

As described above, in the conventional LOGIC in FLASH, to form transistors which are used in the logic portion, the high-voltage resistant portion and the memory cell array portion and which have different characteristics from each other within one chip, the impurity concentration of the channel dope layer is changed in accordance with each transistor and a threshold value is adjusted.

However, as the impurity concentration of the channel dope layer becomes higher, the threshold value increases. At the same time, a diffusion layer leakage increases since the impurity concentration becomes high at a junction portion between a diffusion layer and the substrate, for instance. In other words, the threshold value and the diffusion layer leakage are in a trade-off relationship with each other, and therefore, a leakage current is determined automatically once the threshold value is determined. Thus, the trade-off relationship between the two imposes a restriction on designing of the circuit.

Further, in the logic portion, in order to attain a high driving capability, it is necessary to form a thinner gate oxide film than those of the other portions. To this end, it is necessary to form a plurality of types of transistors which have different oxide film thicknesses from each other within the flash memory which is in the form of one chip, it is necessary to form the oxide films at more than one steps in some cases. For example, within the high-voltage resistant portion, at the step of removing the resist mask R263 (See FIG. 122), the insulation film 751 is grown further during formation of the oxide film 761 (See FIG. 124). That is, the oxide film 751 is formed at two steps. This leads to a higher possibility of allowing entry of an impurity or the like, which in turn degrades the reliability of the gate oxide film 75 or worsens the controllability of the film thickness. This further leads to a problem that the reliability of the N-channel MOS transistor T32 of the high-voltage resistant portion is lost, etc.

As described above, in a semiconductor device in which a plurality of types of transistors are formed within one chip, threshold values are heretofore adjusted by changing the impurity concentrations of the channel dope layers in accordance with the transistors. However, since there is a trade-off relationship between a threshold value and a diffusion layer leakage, a leakage current is determined automatically once the threshold value is determined. Thus, the trade-off relationship between the two imposes a restriction on designing of the circuit. In addition, it is necessary to form the gate oxide films at more than one steps. This leads to a higher possibility of allowing entry of an impurity or the like, which in turn degrades the reliability of the gate oxide films or worsens the controllability of the film thickness. This further leads to a problem that the reliability of the transistors is deteriorated.

SUMMARY OF THE INVENTION

A first aspect of the present invention is directed to a semiconductor device comprising at least one transistor on a semiconductor substrate, wherein at least one transistor comprises: a semiconductor layer of a first conductivity type which is formed in a surface of the semiconductor substrate; a channel dope layer of the first conductivity type which is formed selectively in the semiconductor layer; and a control electrode which is formed at a position which faces the channel dope layer, above the semiconductor layer, the control electrode comprises a polysilicon layer which internally includes an impurity of a second conductivity type and nitrogen, and the nitrogen is introduced to a lower portion of the polysilicon layer in such a manner that the impurity has a relatively high concentration in an upper portion of the polysilicon layer but has a relatively low concentration in the lower portion of the polysilicon layer.

In the semiconductor device according to the first aspect of the present invention, since the control electrode includes a polysilicon layer which internally includes an impurity of a second conductivity type and nitrogen, and since the nitrogen is introduced to an upper portion of the polysilicon layer in such a manner that the impurity has a relatively high concentration in an upper portion of the polysilicon layer but has a relatively low concentration in the lower portion of the polysilicon layer, when the device operates., a depletion layer is created within the polysilicon layer in accordance with the portion in which the concentration of the impurity is relatively low, so that the effective thickness of the gate oxide film is determined in accordance with the region in which the depletion layer is created. Hence, when a plurality of types of transistors having different characteristics from each other (e.g., different required specifications from each other) are to be formed, by changing the respective impurity concentrations, the effective thickness of the gate oxide film is changed and a threshold value is set. Thus, unlike heretofore done, it is not necessary to change the impurity concentration of the channel dope layer in accordance with characteristics of transistors, hut it is possible to fix the impurity concentration of the channel dope layer at such a value which suppresses a leakage current from a diffusion layer (i.e., diffusion layer leak) to minimum. For instance, if the impurity concentration of the channel dope layer is set so that a diffusion layer comes minimum and a threshold value is set by means of the impurity concentration and the concentration of nitrogen, a breakthrough in the trade-off relationship between the threshold value and the diffusion layer leakage is realized and a restriction upon circuitry designing is removed. Further, since it is possible to change the effective thickness of the gate oxide film, it is not necessary to form the gate oxide films of the transistors which have different breakdown voltages from each other into different thicknesses from each other.

According to a second aspect of the invention, in the semiconductor device of the first aspect, at least one transistor includes at least two types of transistors, and at least two types of transistors are structured so that concentrations of the nitrogen are different between at least two types of transistors.

Accordingly, in the second aspect of the invention, since concentrations of the nitrogen are different between at least two types of transistors, the distributions of the impurity concentrations within the polysilicon layers are different from each other. That is, if the impurity concentrations are the same, in the transistor in which the nitrogen concentration is higher, the distribution of the impurity concentration changes more abruptly than in the other transistor. As a result, a depletion layer is created in a wider area within the polysilicon layers during a device operation, and the effective thicknesses of the gate oxide films become thick. Hence, application to a transistor which is required to have the thickest gate oxide film makes it possible to form the actual gate oxide film thin. Further, since it is possible to change the effective thicknesses of the gate oxide films by changing the nitrogen concentrations, it is not necessary to form a number of types of gate oxide films which have different thicknesses from each other.

According to a third aspect of the invention, in the semiconductor device of the second aspect, at least two types of transistors include first to third types of transistor, the transistor of the first type comprises: a pair of first semiconductor regions of the second conductivity type formed selectively and independently of each other within the semiconductor layer of the first type of transistor; and a first gate oxide film which is formed on the semiconductor layer of the first type of transistor, between the pair of first semiconductor regions, the channel dope layer of the first type of transistor is formed between the pair of first semiconductor regions, the control electrode of the first type of transistor includes: a first polysilicon layer which is formed on the first gate oxide film; and a first nitrogen-introduced region which is formed within the first polysilicon layer. The second type of transistor comprises: a pair of second semiconductor regions of the second conductivity type formed selectively and independently of each other within the semiconductor layer of the second type of transistor; and a second gate oxide film which is formed on the semiconductor layer of the second type of transistor, between the pair of second semiconductor regions, the channel dope layer of the second type of transistor is formed between the pair of second semiconductor regions, the control electrode of the second type of transistor includes: a second polysilicon layer which is formed on the second gate oxide film; and a second nitrogen-introduced region which is formed within the second polysilicon layer, the third type of transistor comprises: a pair of third semiconductor regions of the second conductivity type formed selectively and independently of each other within the semiconductor layer of the third type of transistor; and a third gate oxide film which is formed on the semiconductor layer of the third type of transistor, between the pair of third semiconductor regions; the channel dope layer of the third type of transistor is formed between the pair of third semiconductor regions, the control electrode of the third type of transistor includes: a third polysilicon layer which is formed on the third gate oxide film; and a third nitrogen-introduced region which is formed within the third polysilicon layer, concentrations of the first to third nitrogen-introduced regions are different from each other, the first to the second gate oxide films have the same thickness, and the channel dope layers of the transistors of the first to the third types have the same impurity concentrations.

Accordingly, in the third aspect of the invention, the first to third nitrogen-introduced regions have different concentrations from each other, the first to the third gate oxide films have the same thickness, and the first to the third channel dope layers have the same impurity concentration. Hence, in a DRAM, when the first type of transistor is applied as a sense amplifier circuit, the second type of transistor as a peripheral circuit and the third type of transistor as a memory cell array, if the impurity concentrations of the gate electrodes are the same and the concentrations of the first to third nitrogen-introduced regions are respectively changed, it is possible to change the effective thicknesses of the gate oxide films and to set a threshold value. Hence, unlike heretofore done, it is not necessary to change the impurity concentrations of the channel dope layers in accordance with characteristics of transistors, but it is possible to fix the impurity concentrations of the channel dope layers at such a value which suppresses a leakage current from a diffusion layer (i.e., diffusion layer leakage) to minimum. For instance, if the impurity concentrations of the channel dope layers are set so that a diffusion layer leakage becomes minimum and a threshold value is set by means of the impurity concentrations of the first to third nitrogen-introduced regions and the concentration of nitrogen, a breakthrough in the trade-off relationship between the threshold value and the diffusion layer leakage realized and a restriction upon circuitry designing is removed. Further, to change the concentrations of the first to third nitrogen-introduced regions is less influential over the other structures than a case where the impurity concentration of the channel dope layer which is formed within the semiconductor substrate. More precisely, ion implantation to a semiconductor substrate, particularly implantation at a high dose, is a cause of deterioration in the crystal quality of the semiconductor substrate. However, since the control electrode which is located at an outer-most position is processed in the present invention, such a problem is not created.

According to a fourth aspect of the invention, in the semiconductor device of the second aspect, at least two types of transistors includes first to third types of transistors, the first type of transistor comprises: a pair of first semiconductor regions of the second conductivity type formed selectively and independently of each other within the semiconductor layer of the first type of transistor; and a first gate oxide film which is formed on the semiconductor layer of the first type of transistor, between the pair of first semiconductor regions, the channel dope layer of the first type of transistor is formed between the pair of first semiconductor regions, the control electrode of the first type of transistor includes: a first polysilicon layer which is formed on the first gate oxide film; and a first nitrogen-introduced region which is formed within the first polysilicon layer. The second type of transistor comprises: a pair of second semiconductor regions of the second conductivity type formed selectively and independently of each other within the semiconductor layer of the second type of transistor; and a second gate oxide film which is formed on the semiconductor layer of the second type of transistor, between the pair of second semiconductor regions, the channel dope layer of the second type of transistor is formed between the pair of second semiconductor regions, the control electrode of the second type of transistor includes: a second polysilicon layer which is formed on the second gate oxide film; and a second nitrogen-introduced region which is formed within the second polysilicon layer. The third type of transistor comprises: a pair of third semiconductor regions of the second conductivity type formed selectively and independently of each other within the semiconductor layer of the third type of transistor; a third gate oxide film which is formed on the semiconductor layer of the third type of transistor, between the pair of third semiconductor regions; a floating gate electrode which is formed on the third gate oxide film; and an inter-layer insulation film which is formed on the floating gate electrode, the channel dope layer of the third type of transistor is formed between the pair of third semiconductor regions, the control electrode of the third type of transistor includes: a third polysilicon layer which is formed on the third gate oxide film; and a third nitrogen-introduced region which is formed within the third polysilicon layer, a concentration of the first nitrogen-introduced region is higher than those of the second and the third nitrogen-introduced regions, the first and the second gate oxide films have the same thickness which is a first thickness, while the third gate oxide film has a second thickness which is thicker than the first thickness, and the channel dope layers of the transistors of the first to the third types have the same impurity concentrations.

Accordingly, in the fourth aspect of the invention, concentration of said first nitrogen-introduced region is higher than those of said second and said third nitrogen-introduced regions, said first and said second gate oxide films have the same thickness which is a first thickness, while said third gate oxide film has a second thickness which is thicker than said first thickness, and said channel dope layers of said first and said third types of transistors have the same impurity concentration. Hence, in a flash memory, for instance, when the first type of transistor is applied to a circuit which is required to have a high breakdown voltage, the second type of transistor to a peripheral circuit and the third type of transistor to a memory cell array, it is not necessary to form the gate oxide films of transistors which have different breakdown voltages from each other into different thicknesses from each other. Further, in a LOGIC in FLASH, the first type of transistor may be applied to a circuit which is required to have a high breakdown voltage, the second type of transistor to a logic circuit and the third type of transistor to a memory cell array. In addition, since it is possible to set threshold values by changing the effective thicknesses of the gate oxide films, it is not necessary to change the impurity concentrations of the channel dope layers depending on characteristics of the transistors, and it is possible to fix the concentrations at such values with which a leakage current from a diffusion layer (i.e., diffusion leakage layers) can be suppressed as small as possible. Hence, by setting the impurity concentrations of the channel dope layers at such values with which a diffusion layer leakage is as small as possible while adjusting the breakdown voltage characteristics and the threshold values by means of the nitrogen concentrations, it is possible to satisfy the requirements regarding the breakdown voltages, to break the trade-off relationship between the threshold values and the diffusion layer leakage, and hence, to eliminate a restriction imposed on circuit designing. Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

According to a fifth aspect of the invention, in the semiconductor device of the second aspect, at least two types of transistors include first third types of transistors, the first type of transistor comprises: a pair of first semiconductor regions of the second conductivity type formed selectively and independently of each other within the semiconductor layer of the first type of transistor; and a first gate oxide film which is formed on the semiconductor layer of the first type of transistor, between the pair of first semiconductor regions, the channel dope layer is formed between the pair of first semiconductor regions, the control electrode of the first type of transistor includes: a first polysilicon layer which is formed on the first gate oxide film; and a first nitrogen-introduced region which is formed within the first polysilicon layer. The second type of transistor comprises: a pair of second semiconductor regions of the second conductivity type formed selectively and independently of each other within the semiconductor layer of the second type of transistor; and a second gate oxide film which is formed on the semiconductor layer of the second type of transistor, between the pair of second semiconductor regions, the channel dope layer of the second type of transistor is formed between the pair of second semiconductor regions, the second control electrode of the second type of transistor includes: a second polysilicon layer which is formed on the second gate oxide film; and a second nitrogen-introduced region which is formed within the second polysilicon layer. The third type of transistor comprises: a pair of third semiconductor regions of the second conductivity type formed selectively and independently of each other within the semiconductor layer of the third type of transistor; a third gate oxide film which is formed on the semiconductor layer of the third type of transistor, between the pair of third semiconductor regions; the channel dope layer of the third type of transistor is formed between the pair of third semiconductor regions, the control electrode of the third type of transistor includes: a third polysilicon layer which is formed on the third gate oxide film; and a third nitrogen-introduced region which is formed within the third polysilicon layer, a concentration of the third nitrogen-introduced region is higher than those of the first and the second nitrogen-introduced regions, the first to the third gate oxide films have the same thickness, and the channel dope layers of the transistors of the first and the third types have the same impurity concentrations.

Accordingly, in the fifth aspect of the invention, the concentration of the third nitrogen-introduced region is higher than those of the first and the second nitrogen-introduced regions, the first to the third gate oxide films have the same thickness, and the channel dope layers of the transistors of the first to the third types have the same impurity concentration. Hence, in a LOGIC in DRAM, for instance, by applying the first type of transistor to a logic circuit, the second type of transistor to a sense amplifier circuit and the third type of transistor to a memory cell array, in the memory cell array where the nitrogen concentration is the highest, a depletion layer is created in a large area within the control electrodes, so that the oxide film thickness becomes effectively thick and the threshold value is high. Thus, by setting the impurity concentrations of the channel dope layers of the transistors of the first to the third types at such values with which a diffusion layer leakage is as small as possible while setting the threshold values by means of the nitrogen concentrations, it is possible to break the trade-off relationship between the threshold values and the diffusion layer leakage and hence to eliminate a restriction imposed on circuit designing.

A sixth aspect of the present invention is directed to a semiconductor device including at least one transistor on a semiconductor substrate, wherein at least one transistor comprises: an active region which is defined by a field oxide film which is selectively formed on a major surface of the semiconductor substrate; an oxide film which is formed on the active region; and a control electrode which is formed on the oxide film and the field oxide film, the control electrode internally including a polysilicon layer into which an impurity of the same conductivity type as a source/drain layer and nitrogen are introduced, and the nitrogen is selectively introduced to a lower portion of the polysilicon layer on an edge portion of said active region in such a manner that the impurity has a relatively high concentration in an upper portion of the polysilicon layer but has a relatively low concentration in the lower portion of the polysilicon layer.

Accordingly, in the sixth aspect of the invention, since nitrogen is selectively introduced to a lower portion of the polysilicon layer in such a manner that the impurity has a relatively high concentration in an upper portion of the polysilicon layer but has a relatively low concentration in the lower portion of the polysilicon layer, a depletion layer is created within the polysilicon layers during a device operation in accordance with the portion in which the concentration of the impurity is relatively low, so that the effective thickness of the gate oxide film is determined in accordance with the region in which the depletion layer is created. Hence, during a device operation, a range in which the depletion layer is formed becomes larger within the polysilicon layer in an edge portion of the active region, the effective thickness of the oxide film becomes thick, and the threshold value is partially increased. In the case where an SOI substrate is used as the semiconductor substrate, for instance, a problem of a decreased threshold value due to the structure of the edge portion is solved.

According to a seventh aspect of the invention, in the semiconductor device of the sixth aspect, nitrogen is introduced at a dose of $1 \times 10^{15}/cm^2$ to $1 \times 10^{16}/cm^2$.

Accordingly, in the seventh aspect of the invention, the control electrode is formed on the oxide film and the field oxide film and internally includes the first polysilicon layer into which nitrogen is introduced and the second polysilicon layer into which the impurity of the same conductivity type as the source/drain layer are introduced. Hence, when the transistor operates, a depletion layer is created within the first polysilicon layer, the oxide film becomes effectively thick, and a threshold value becomes high. Therefore, even when the thickness of the oxide film is not appropriate for a voltage which is applied to a gate electrode, an electric field upon the oxide film is small, which in turn prevents dielectric breakdown of the oxide film and improves the reliability of the transistor.

An eighth aspect of the invention is directed to a semiconductor device including at least one transistor on a semiconductor substrate, wherein at least one transistor comprises: an active region which is defined by a field oxide film which is selectively formed on a major surface of the semiconductor substrate; an oxide film which is formed on the active region; and a control electrode which is formed on the oxide film and the field oxide film, the control electrode internally including a first polysilicon layer into which nitrogen is introduced and a second polysilicon layer into which an impurity of the same conductivity type as a source/drain layer is introduced.

According to the semiconductor device of the eighth aspect of the invention, the nitrogen concentration which is appropriate for the semiconductor device of the sixth or the seventh aspect is obtained.

According to a ninth aspect of the invention, in the semiconductor device of the eighth aspect, nitrogen is introduced at a dose of $1 \times 10^{15}/cm^2$ to $1 \times 10^{36}/cm^2$.

According to the method of manufacturing a semiconductor device of the ninth aspect of the invention, the impurity has such a distribution of the concentration that the concentration is relatively high in an upper portion of the polysilicon layer but is relatively low in the lower portion of the polysilicon layer. Therefore, the method of manufacturing a semiconductor device of the ninth aspect of the invention is appropriate to manufacture the semiconductor device of the first aspect of the invention.

A tenth aspect of the invention is directed to a method of manufacturing a semiconductor device in which there is at least one transistor on a semiconductor substrate, comprising the steps of: (a) forming a semiconductor layer of a first conductivity type within a surface of the semiconductor substrate, at a position where at least one transistor is formed; (b) selectively forming a channel dope layer of the first conductivity type within the semiconductor layer of at least one transistor, by ion implantation; and (c) forming a control electrode above the semiconductor layer of at least one transistor, at a position facing the channel dope layer, wherein the step (c) includes a step (c-1) of forming a polysilicon layer which includes an impurity of a second conductivity type and nitrogen, and the step (c-1) includes a step of introducing the nitrogen to a lower portion of the polysilicon layer.

According to the method of manufacturing a semiconductor device of the tenth aspect of the invention, it is possible to obtain a manufacturing method which is appropriate to manufacture the semiconductor device of the third aspect of the invention.

According to an eleventh aspect of the invention, in the method of manufacturing a semiconductor device of the tenth aspect, at least one transistor includes first to third types of transistors, the step (c) comprises the steps of: forming an oxide film on the semiconductor layers of the first to the third types of transistors; forming a first polysilicon layer on the oxide film; introducing an impurity of the second conductivity type into the first polysilicon layer, to thereby form a second polysilicon layer; introducing nitrogen into a lower portion of the second polysilicon layer at a dose n1, to thereby form a first nitrogen region; masking over the second polysilicon layer at a position at which the first type of transistor is formed and introducing nitrogen into the first nitrogen region within a remaining portion of the second polysilicon layer at a dose n2 to thereby form a second nitrogen region; masking over the second polysilicon layer at a position at which the second type of transistor is formed and introducing nitrogen into the second nitrogen region within a remaining portion of the second polysilicon layer at a dose n3 to thereby form a third nitrogen region; and selectively removing the second polysilicon layer and the oxide film by patterning, to thereby form: a first gate oxide film and the control electrode of the first type of transistor, on the semiconductor layer of the first type of transistor; a second gate oxide film and the control electrode of the second type of transistor, on the semiconductor layer of the second type of transistor; and a third gate oxide film and the control electrode of the third type of transistor, on the semiconductor layer of the third type of transistor.

According to the method of manufacturing a semiconductor device of the eleventh aspect of the invention, it is possible to obtain a manufacturing method which is appropriate to manufacture the semiconductor device of the fourth aspect of the invention.

According to a twelfth aspect of the invention, in the method of manufacturing semiconductor device of the tenth aspect, at least one transistor includes a first to third types of transistors, the step (c) comprises the steps of: forming a first oxide film having a first thickness on the semiconductor layers of the first to the third types of transistors; selectively forming a first polysilicon layer which uniformly has an impurity of the second conductivity type on the first oxide film on the semiconductor layer of the third types of transistor; selectively forming an insulation film on the first polysilicon layer while removing the first oxide film at positions where the first and the second types of transistors are formed; forming a second oxide film having a second thickness which is thinner than the first thickness on the semiconductor layer of the first of transistor and the second types of transistor; forming a second polysilicon layer on the second oxide film and the insulation film; introducing nitrogen into a lower portion of the second polysilicon layer at a dose n1 to thereby form a first nitrogen region; masking over the second polysilicon layer at a position at which the second and the third types of transistors are formed and introducing nitrogen into the first nitrogen region within a remaining portion of the second polysilicon layer at a dose n2 to thereby form a second nitrogen region; and selectively removing the second polysilicon layer and the first and the second oxide films by patterning, to thereby form: a first gate oxide film and the control electrode of the first type of transistor, on the semiconductor layer of the first type of transistor; a second gate oxide film and the control electrode of the second type of transistor, on the semiconductor layer of the second type of transistor; and a third gate oxide film, a floating gate electrode, an inter-layer insulation film and the control electrode of the third type of transistor, on the semiconductor layer of the third type of transistor.

According to the method of manufacturing a semiconductor device of the twelfth aspect of the invention, it is possible to obtain a manufacturing method which is appropriate to manufacture the semiconductor device of the fifth aspect of the invention.

Accordingly, an object of the present invention is to provide for a semiconductor device in which there is no trade-off relationship between a threshold value and a diffusion layer leakage and it is not necessary to form gate oxide films at more than one steps, and to provide for a method of manufacturing such a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

In general, a gate electrode (of polysilicon) forming a MOS transistor is doped with an N-type impurity or a P-type impurity. This aims at reducing the resistance of a gate by means of doping with the impurity. Further, whether to use an N-type impurity or a P-type impurity depends on the type of a well layer. That is, when a P-type gate electrode is selected for an N-type well or an N-type gate electrode is selected for a P-type well, it is possible to suppress a threshold value.

Figure 1:
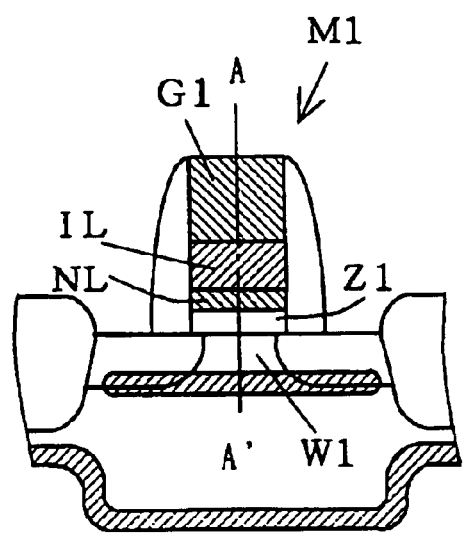
FIG. 1 is a diagram for describing the function of nitrogen within a gate electrode.

FIG. 1 shows a structure of a MOS transistor M1 which is formed by doping a gate electrode with an impurity by ion implantation. It is known that in such a gate electrode, introduction of nitrogen in the vicinity of an interface between the gate electrode and a gate oxide film realizes an effect of improving the reliability of an oxide film and suppressing a phenomena that later heating processing allows the impurity to pass through the gate electrode and diffuse into a substrate.

Hence, in the MOS transistor M1 shown in FIG. 1, an impurity layer IL and a nitrogen-introduced layer NL are formed both of which have a distribution of concentration.

Figure 2:
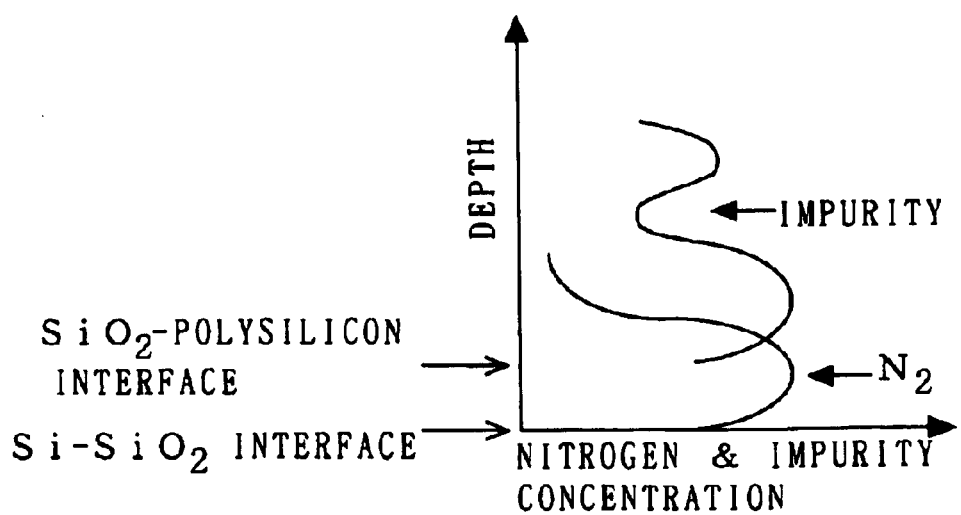
FIG. 2 is a diagram for describing distributions of an impurity and nitrogen within the gate electrode.

FIG. 2 shows an impurity profile and a nitrogen profile of the MOS transistor M1. In FIG. 2, the impurity concentration of a gate electrode G1 of the MOS transistor M1 shown in FIG. 1 taken along line A–A' has a distribution that the concentration surges in the form of a curve at an interface between a gate oxide film (SiO$_2$) Z1 and the gate electrode (polysilicon) G1, reaches a first peak, decreases in the form of a curve, surges in the form of a curve again, reaches a second peak, and decreases in the form of a curve again.

Meanwhile, the nitrogen concentration has a distribution that the concentration surges in the form of a curve at an interface between a well layer W1 (Si) and the gate oxide film (SiO$_2$) Z1, reaches a peak at the interface between the gate oxide film (SiO$_2$) Z1 and the gate electrode (polysilicon) G1, and decreases in the form of a curve.

In FIG. 2, the nitrogen concentration and the impurity concentration are measured along a horizontal axis, whereas a distance (i.e., depth) in the direction of line A–A' is measured along a vertical axis. In FIG. 2, an Si—SiO$_2$ interface is the interface between the well layer W1 and the gate oxide film Z1, and SiO$_2$-polysilicon interface is the interface between the gate oxide film Z1 and the gate electrode G1.

As described earlier, since nitrogen has a function of suppressing diffusion of an impurity, the higher the concentration of nitrogen which is introduced in the vicinity of the interface between the gate electrode G1 and the gate oxide film Z1 is, the lower the impurity concentration in the vicinity of this interface becomes. It is known that if an impurity concentration becomes too low within a gate electrode, a depletion layer is created within the gate electrode when a transistor operates. Excessive introduction of nitrogen causes a problem that a depletion layer is developed.

Figure 3:
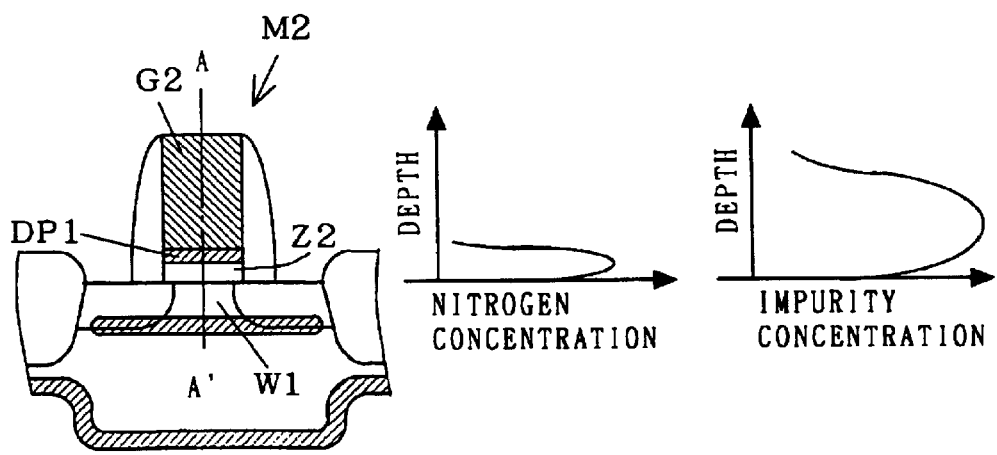
FIGS. 3 and 4 are diagrams for describing the function of nitrogen within a gate electrode.

A phenomena that excessive introduction of nitrogen creates a depletion layer will be described with reference to FIGS. 3 and 4. FIG. 3 shows a condition of a depletion layer DP1 which is formed within a gate electrode G2 in a MOS transistor M2 which has a relatively low nitrogen concentration, and a nitrogen profile and an impurity profile taken along line A–A' of the gate electrode G2.

Figure 4:
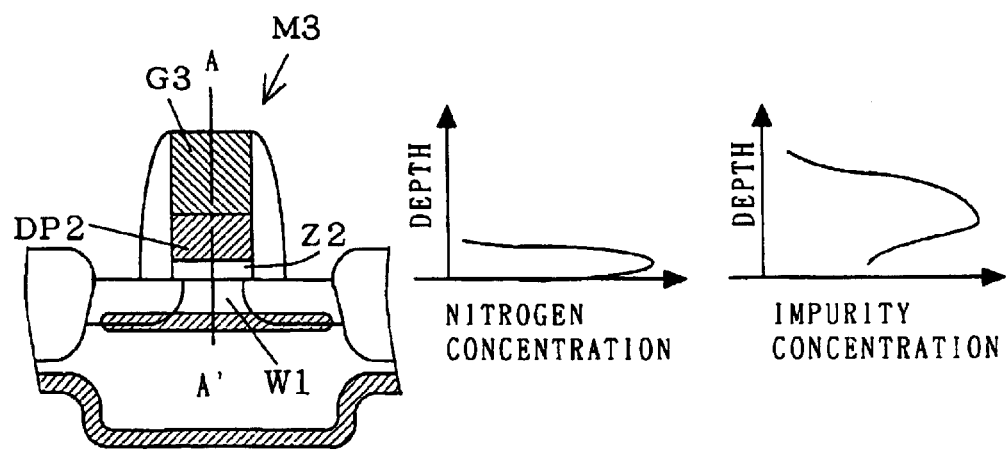

FIG. 4 shows a condition of a depletion layer DP2 which is formed within a gate electrode G3 in a MOS transistor M3 which has a relatively high nitrogen concentration, and a nitrogen profile and an impurity profile taken along line A–A' of the gate electrode G3.

Comparing the two drawings, it is understood that the higher the nitrogen concentration in the vicinity of the interface between the gate electrode and the gate oxide film is, the lower the impurity concentration in the vicinity of this interface becomes, and that the depletion layer DP2 within the gate electrode G3 is formed in a larger area than the depletion layer DP1 within the gate electrode G2.

When a depletion layer is developed, a voltage drop occurs within the depletion layer. Hence, a voltage which is applied upon an element becomes lower than an applied voltage. In short, an oxide film thickness becomes effectively thicker. This creates problems such as an increased threshold value and a decreased drain current.

The present invention makes a positive use of a depletion layer which is formed within a gate electrode, so that a plurality of types of transistors are formed within one chip without excessively introducing nitrogen and hence by deteriorating the reliability of a gate oxide film and suppression of a gate impurity diffusion.

In the following, preferred embodiments of the present invention will be described in relation to examples of a DRAM, a flash memory, a logic in DRAM, and a LOGIC in flash memory.

<First Preferred Embodiment>

<1-1. Structure of Device>

Figure 5:
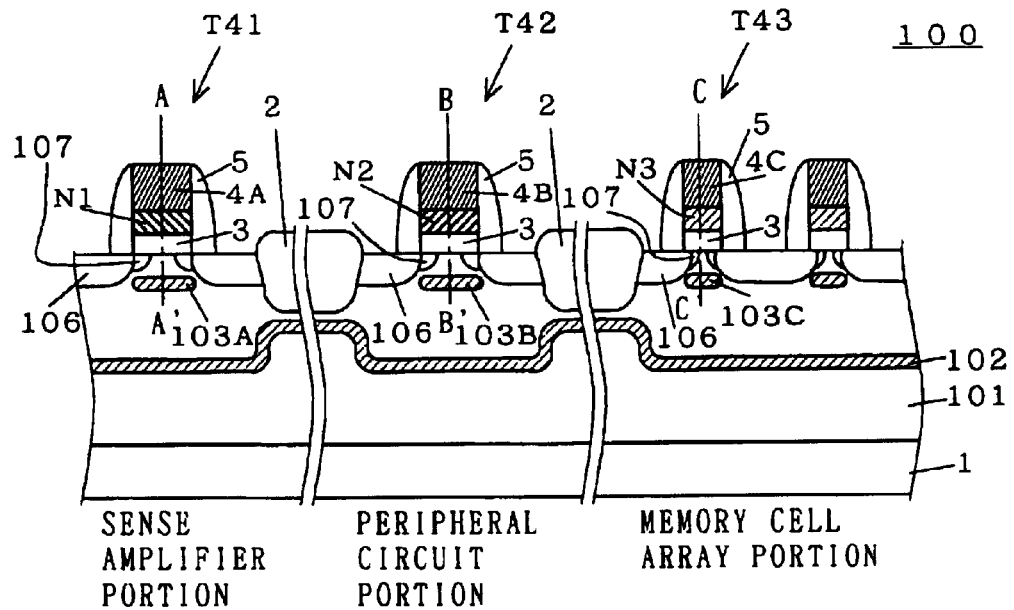
FIG. 5 is a cross sectional view showing a structure of a first preferred embodiment of the present invention.

FIG. 5 shows a partial structure of a DRAM 100 in which a plurality of types of transistors are formed, as a first preferred embodiment of the present invention. In general, a DRAM comprises not only a memory cell array portion for storing data, but also a sense amplifier portion and a peripheral circuit portion (e.g., an address buffer, an X decoder, a Y decoder, a row/column clock circuit, an I/O pass circuit, a refresh circuit, etc.).

Any these portions are formed by transistors, and different characteristics are required from the respective transistors. For example, with respect to threshold values, while a threshold value for a transistor of the memory cell array portion is about 1V and a threshold value for transistors of the peripheral circuit portions are about 0.8V, a threshold value for the transistor of the sense amplifier portion must be suppressed as low as 0.4V.

FIG. 5 shows cross sections of N-channel MOS transistors T41 to T43 which are used for the sense amplifier portion, the peripheral circuit portion, and the memory cell array portion.

In FIG. 5, the N-channel MOS transistors T41 to T43 formed within a P-type well layer 101 which is formed on the same semiconductor substrate 1 (of the P-type). The well layer 101 is element-separated by a channel cut layer 102 and a LOCOS layer 2 in such a manner that the N-channel MOS transistors T41 to T43 are formed in regions which are created by element separation.

The N-channel MOS transistor T41 of the sense amplifier portion comprises a pair of source/drain layers 106 formed within the well layer 101 independently of each other hut parallel to each other and a pair of low dope drain layers (hereinafter "LDD layers") 107 formed adjacent to edge portions facing each other of the source/drain layers 106.

The gate oxide film 3 is formed on the LDD layers 107, and a gate electrode 4A is formed on the gate oxide film 3. A side wall oxide film 5 is formed on a side surface of the gate oxide film 3 and the gate electrode 4A. Within the well layer 101 under the gate electrode 4A, a channel dope layer 103A is formed.

In the gate electrode 4A, a nitrogen-introduced region N1 is formed in the vicinity of an interface with the gate oxide film 3.

The N-channel MOS transistor T42 of the peripheral circuit portion comprises a pair of source/drain layers 106 formed within the well layer 101 independently of each other hut parallel to each other and a pair of LDD layers 107.

The gate oxide film 3 is formed on the LDD layers 107, and a gate electrode 4B is formed on the gate oxide film 3. The side wall oxide film 5 is formed on a side surface of the gate oxide film 3 and the gate electrode 4B. Within the well layer 101 under the gate electrode 4B, a channel dope layer 103B is formed.

In the gate electrode 4B a nitrogen-introduced region N2 is formed in the vicinity of an interface with the gate oxide film 3.

The N-channel MOS transistor T43 of the memory cell array portion comprises a pair of source/drain layers 106 formed within the well layer 101 independently of each other hut parallel to each other and a pair of LDD layers 107.

A gate oxide film 3 is formed on the source/drain layers 106 and the LDD layers 107, and a gate electrode 4C is formed on the gate oxide film 3. The side wall oxide film 5 is formed on a side surface of the gate oxide film 3 and the gate electrode 4C. Within the well layer 101 under the gate electrode 4C, a channel dope layer 103C is formed. The memory cell array portion has a gate array structure in which adjacent gates share one source/drain layer 106. Such structures are arranged successively.

In the gate electrode 4C, a nitrogen-introduced region N3 is formed in the vicinity of an interface with the gate oxide film 3.

Table 5 shows figures regarding the structures of the N-channel MOS transistors T41 to T43.

progressively more abruptly in this order as indicated by line B–B' and line C–C', respectively. This is because diffusion and activation of an impurity is suppressed more in a gate electrode in which a larger amount of nitrogen is introduced.

Since the impurity doses are the same between the channel dope layers 103A to 103C of the N-channel MOS transistors T41 to T43, the A–A' line, the B–B' line and the C–C' line overlap each other.

TABLE 5

|  | SENSE AMPLIFIER PORTION | | | PERIPHERAL CIRCUIT PORTION (T42) | | | MEMORY CELL ARRAY PORTION (T43) | | |
| --- | --- | --- | --- | --- | --- | --- | --- | --- | --- |
| FIELD OXIDE FILM THICKNESS | 4000 Å | | | 4000 Å | | | 4000 Å | | |
| GATE OXIDE FILM THICKNESS | 100 Å | | | 100 Å | | | 100 Å | | |
| GATE ELECTRODE FILM THICKNESS | 2000 Å | | | 2000 Å | | | 2000 Å | | |
| SIDE WALL | 1000 Å | | | 1000 Å | | | 1000 Å | | |
| WELL | B | 700 keV | $1 \times 10^{13}/cm^2$ | B | 700 keV | $1 \times 10^{13}/cm^2$ | B | 700 keV | $1 \times 10^{13}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $1 \times 10^{12}/cm^2$ | B | 50 keV | $1 \times 10^{12}/cm^2$ | B | 50 keV | $1 \times 10^{12}/cm^2$ |
| LDD | As | 30 keV | $1 \times 10^{13}/cm^2$ | As | 30 keV | $1 \times 10^{13}/cm^2$ | As | 30 keV | $1 \times 10^{13}/cm^2$ |
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| GATE IMPLANTATION | P | 30 keV | $5 \times 10^{15}/cm^2$ | P | 30 keV | $5 \times 10^{15}/cm^2$ | P | 30 keV | $5 \times 10^{15}/cm^2$ |
|  | N | 10 keV | $1 \times 10^{15}/cm^2$ | N | 10 keV | $3 \times 10^{15}/cm^2$ | N | 10 keV | $1 \times 10^{16}/cm^2$ |
| HEATING | | | | 850° C. 60 min | | | | | |

In Table 5, impurity doses for forming the gate electrodes of the N-channel C, transistors T41, T42 and T43 are equally $5 \times 10^{15}/cm^2$. Phosphorus (P) is implanted as an impurity for each electrode with the implantation energy of 30 keV.

Doses of nitrogen are $1 \times 10^{15}/cm^2$, $3 \times 10^{15}/cm^2$ and $1 \times 10^{16}/cm^2$, respectively. The implantation energy is equally 10 keV.

Figure 6:
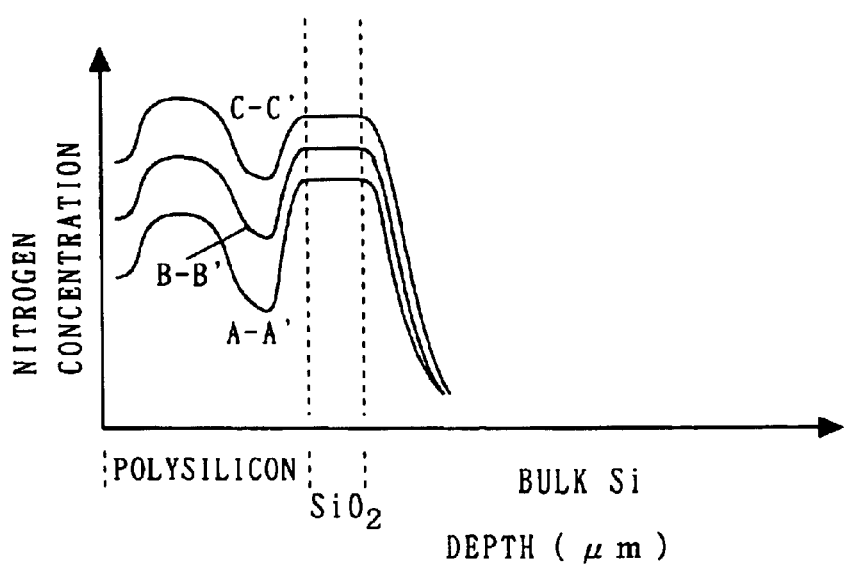
FIG. 6 is a diagram for describing a nitrogen distribution according to the first preferred embodiment of the present invention.
Figure 7:
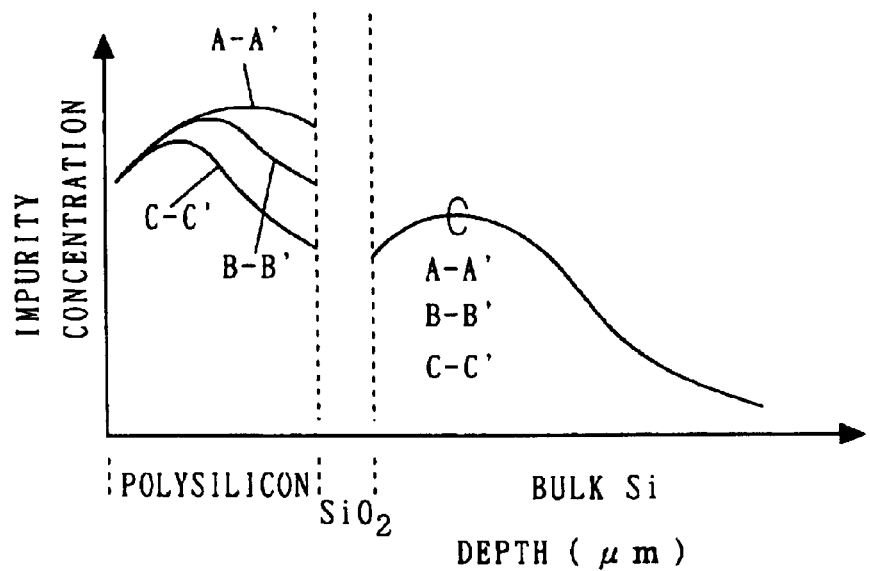
FIG. 7 is a diagram for describing an impurity distribution according to the first preferred embodiment of the present invention.

FIGS. 6 and 7 show nitrogen profiles and impurity profiles of the N-channel MOS transistors T41, T42 and T43 forming the sense amplifier portion, the peripheral circuit portion and the memory cell array portion, all of which are shown in FIG. 5, taken at cross sectional portions along line A–A', line B–B' and line C–C', respectively.

In FIGS. 6 and 7, a position (i.e., depth) in a cross sectional direction is shown along a horizontal axis and nitrogen concentrations and impurity concentrations are shown along a vertical axis. There are the gate electrode (polysilicon layer), the gate oxide film (SiO$_2$ layer) and the well layer (bulk silicon layer) in this order along the horizontal axis from the left-hand side.

As shown in Table 5, since the nitrogen doses are different from each other among gate electrodes 4A to 4C of the N-channel MOS transistors T41 to T43, and therefore, the nitrogen concentrations are different from each other. The nitrogen concentrations are progressively higher in the order of higher threshold values which are expected in the gate electrodes. In short, as indicated at the A–A' line in FIG. 6, the transistor T41 of the sense amplifier portion has the lowest value, exceeded by the transistor T42 of the peripheral circuit portion (B–B' line) and the transistor T43 of the memory cell array portion (C–C' line) in this order.

Further, nitrogen is present in each gate oxide film, and a relationship regarding the concentrations is maintained. The profile is such that nitrogen does not almost exist in a portion in the well layer other than in the vicinity of the interface with the gate oxide films.

In addition, as shown in FIG. 7, with respect to the impurity profiles in the gate electrodes, the profile of the transistor T41 of the sense amplifier portion is the flattest as indicated by line A–A', and the profile of the transistor T42 of the peripheral circuit portion and the profile of the transistor T43 of the memory cell array portion change Diffusion and activation of an impurity is suppressed more in a gate electrode in which a larger amount of nitrogen is introduced, so that the impurity concentration in the vicinity of the gate oxide films becomes lower. Hence, in the memory cell array portion in which the impurity concentration is the lowest, the depletion layer is the largest at the gate electrode, the effective thickness of the oxide film is the thickest, and the threshold value is high.

Figure 8:
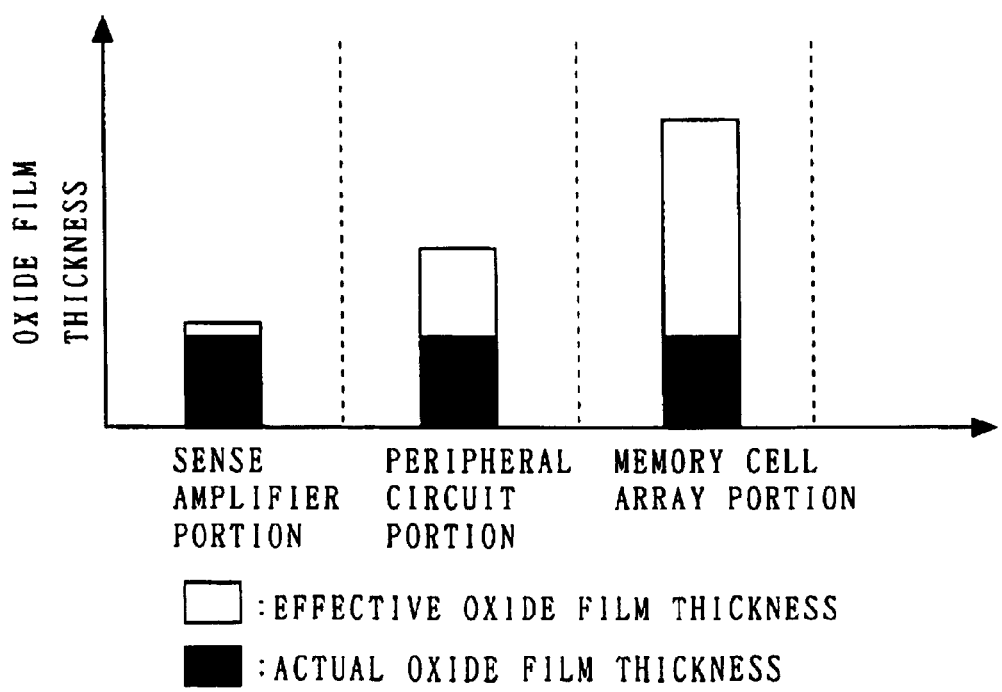
FIG. 8 is a diagram for describing a thickness of a gate oxide film in the first preferred embodiment of the present invention.

FIG. 8 shows actual thicknesses and effective thicknesses of the respective gate oxide films. FIG. 8 shows the N-channel MOS transistors of the sense amplifier portion, the peripheral circuit portion and the memory cell array portion in this order from the left-hand side along the horizontal axis. As clearly shown in FIG. 8, the effective thicknesses of the respective gate oxide films are progressively thicker in the order of the sense amplifier portion, the peripheral circuit portion and the memory cell array portion.

<1-2. Manufacturing Method>

In the following, a description will be given on a method of manufacturing the N-channel MOS transistors T41, T42 and T43 of the sense amplifier portion, the peripheral circuit portion and the memory cell array portion which form the DRAM 100 which is shown in FIG. 5, with reference to FIGS. 9 to 15.

Figure 9:
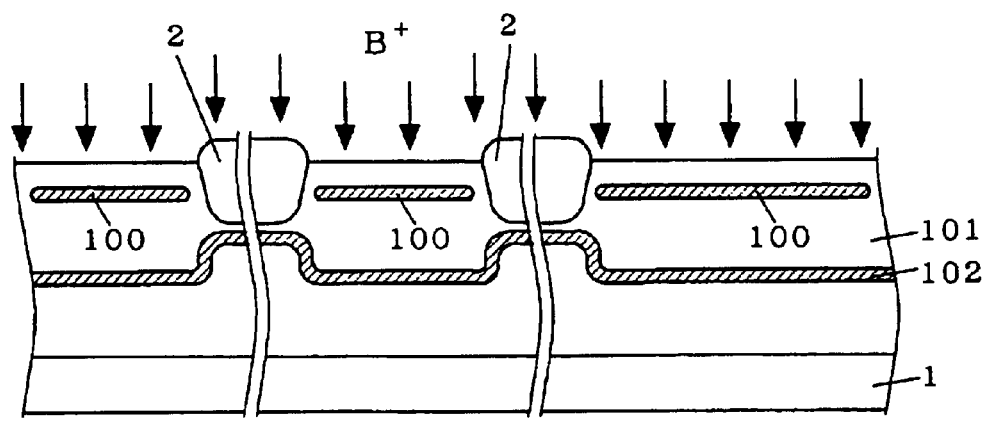
FIGS. 9 to 15 are diagrams showing manufacturing steps according to the first preferred embodiment of the present invention.

First, at a step shown in FIG. 9, a LOCOS layer (i.e., field oxide film) 2 is formed into a thickness of 4,000 Å, for instance, by a LOCOS method on a surface of the semiconductor substrate 1 of the P-type. Following this, boron ions, for instance, are implanted with the energy of 700 keV and at a dose of $1 \times 10^{13}/cm^2$, thereby forming a P-type well region 1011 within the semiconductor substrate 1. Although an N-type well region as well is formed in the semiconductor substrate 1 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 102 within the semiconductor substrate 1. The channel cut layer 102 is formed in such a shape which together with the LOCOS layer 2 creates the element-separated regions.

Next, at a predetermined position within the well region 101, a channel dope layer 100 which will become the channel dope layers 103A to 103C is formed. At this stage, the channel dope layer 100 is formed also in regions within the transistors T2 and T3 of the peripheral circuit portion and the memory cell array portion. The channel dope layer 100 is formed by implanting boron ions, for instance, with the energy of 50 keV and at a dose of $1\times10^{12}/cm^2$.

Figure 10:
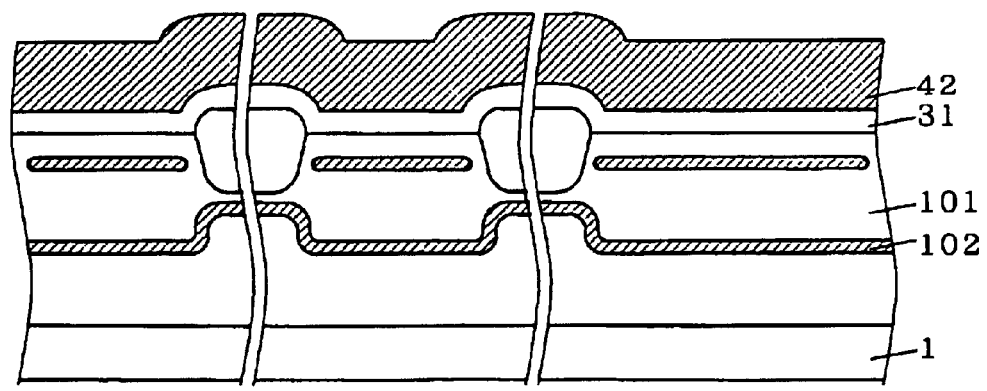

Next, at a step shown in FIG. 10, after forming an oxide film 31 which will become the gate oxide film 3 on a main surface of the semiconductor substrate 1 by a thermal oxide method, a (non-doped) polysilicon layer 42 is formed as a gate electrode material on the gate oxide film 3 by a CVD method. The oxide film 31 has a thickness of about 100 Å, whereas the polysilicon layer 42 has a thickness of about 2,000 Å.

Figure 11:
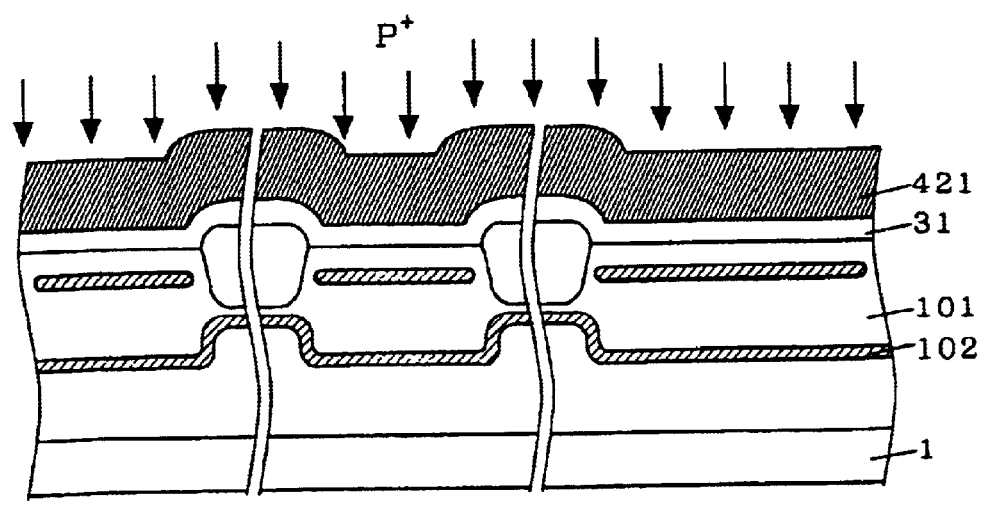

Next, at a step shown in FIG. 11, impurity ions are implanted into the polysilicon layer 42 by ion implantation, whereby a doped polysilicon layer 421 is formed. The doped polysilicon layer 421 is formed by implanting phosphorus ions, for instance, with the energy of 30 keV and at a dose of $5\times10^{15}/cm^2$.

Figure 12:
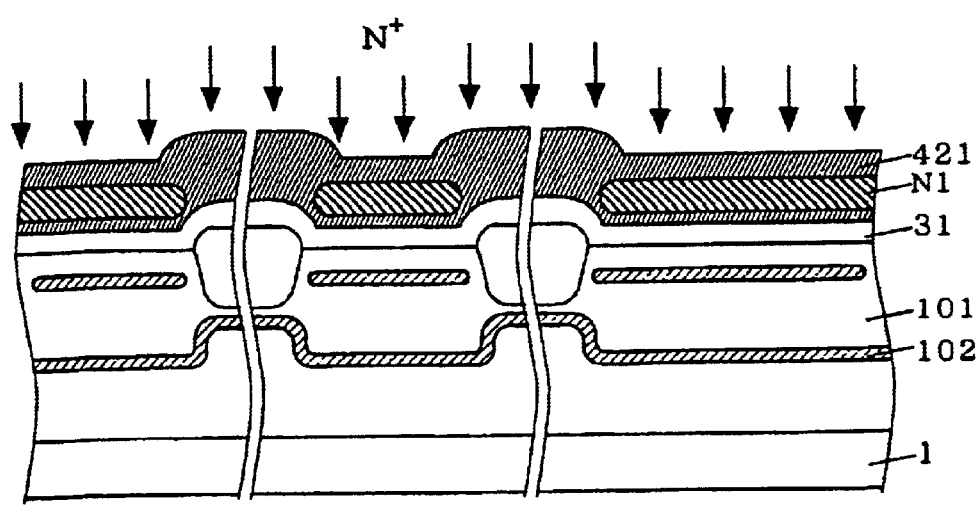

Next, at a step shown in FIG. 12, nitrogen ions are implanted into the doped polysilicon layer 421 by ion implantation in accordance with the N-channel MOS transistor T41 of the sense amplifier portion, which has the lowest nitrogen concentration within the gate electrode, thereby forming a nitrogen-introduced layer N1. At this stage, the nitrogen-introduced layer N1 is formed also the doped polysilicon layer 421 in the peripheral circuit portion and the memory cell array portion. The nitrogen-introduced layer N1 is formed by implanting nitrogen ions with the energy of 10 keV and at a dose of $1\times10^5/cm^2$, for instance.

Figure 13:
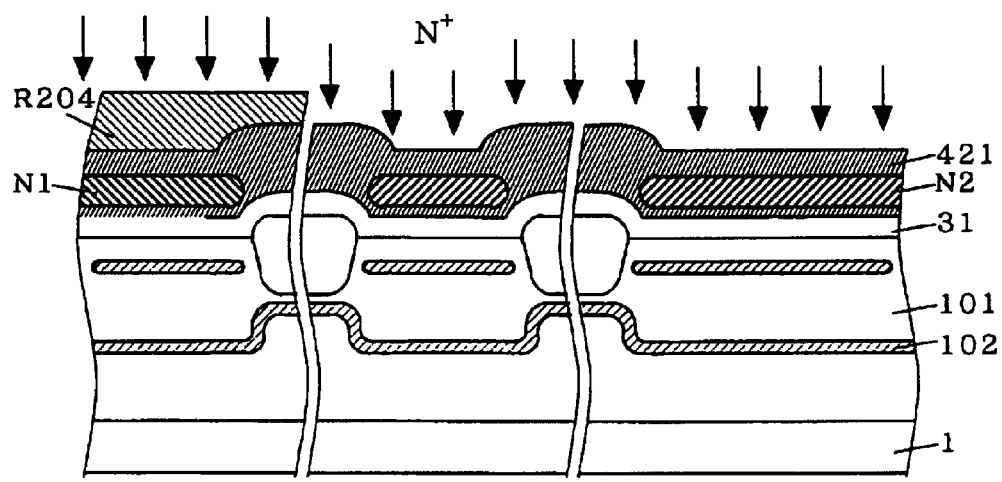

Next, at a step shown in FIG. 13, a resist mask R204 is formed on the sense amplifier portion. Nitrogen ions are additionally implanted in a selective fashion into the doped polysilicon layer 421 of the peripheral circuit portion and the memory cell array portion, thereby forming a nitrogen-introduced region N2 which has a concentration which is in accordance with the N-channel MOS transistor T42 of the peripheral circuit portion. At this stage, the nitrogen-introduced region N2 is formed also the doped polysilicon layer 421 in the memory cell array portion. The nitrogen-introduced region N2 is formed by implanting nitrogen ions with the energy of 10 keV and at a dose of $2\times10^{15}/cm^2$, for instance.

Figure 14:
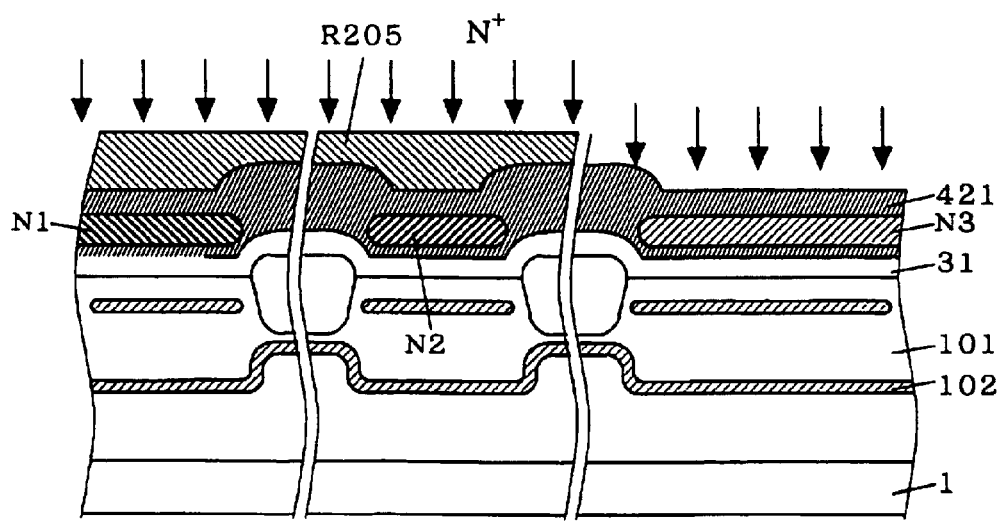

Next, after removing the resist mask R204, at a step shown in FIG. 14, a resist mask R205 is formed on the sense amplifier portion and the peripheral circuit portion and nitrogen ions are additionally implanted in a selective fashion into the doped polysilicon layer 421 of the memory cell array portion, thereby forming a nitrogen-introduced region N3 which has a concentration which is in accordance with the N-channel MOS transistor T43 of the memory cell array portion. The nitrogen-introduced region N3 is formed bay implanting nitrogen ions with the energy of 10 keV and at a dose of $7\times10^{15}/cm^2$, for instance.

Figure 15:
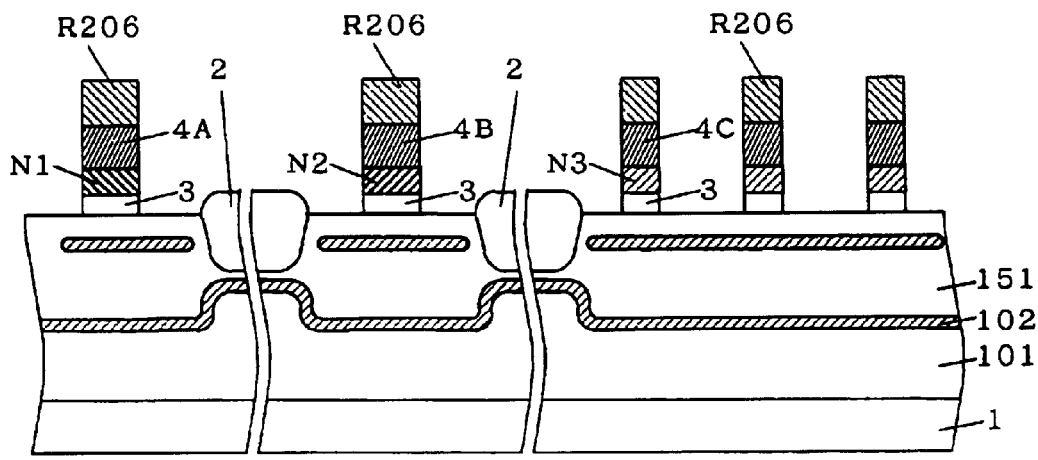

Next, at a step shown in FIG. 15, a resist mask R206 is formed on the doped polysilicon layer 421 and patterned so that the gate electrodes 4A to 4C and the gate oxide film 3 are formed.

Next, after forming the LDD layers 107 in the sense amplifier portion, the peripheral circuit portion and the memory cell array portion by ion implantation, the side wall oxide film 5 is formed on a side surface of the gate oxide film 3 and the gate electrodes 4A to 4C into a thickness of about 1,000 Å. Using the side wall oxide film 5 as a mask, by ion implantation, the source/drain layers 106 are formed. In this manner, the structure of the DRAM 100 which is shown in FIG. 5 is obtained.

The LDD layers 107 are obtained by injecting arsenic (As) ions, for instance, with the energy of 30 keV and at a dose of $1\times10^{13}/cm^2$. Meanwhile, the source/drain layers 106 are obtained by injecting arsenic ions, for instance, with the energy of 50 keV and at a dose of $5\times10^{15}/cm^2$ and thereafter annealing at 850° C. for 60 minutes.

While the nitrogen-introduced regions N1 to N3 are in contact with the gate oxide film 3 in FIG. 15, this is a result of diffusion of the introduced nitrogen by heating processing during formation of the source/drain layer and the like, and subsequent aggregation of the introduced nitrogen in the vicinity of the interface with the gate oxide film 3 which contains a number of crystal defects.

Although this is followed by formation of a capacitor, an inter-layer insulation film, a wiring layer and the like to form the DRAM, this will not be described nor is shown in the drawings.

<1-3. Characteristic Function and Effect>

As described above, the DRAM 100 according to the first preferred embodiment of the present invention has such a structure in which the nitrogen concentrations of the gate electrodes are changed among the plurality of types of transistors having different characteristics from each other (e.g., having different required specifications from each other) so that the effective thicknesses of the respective gate oxide films are changed and the threshold values are set. This eliminates the necessity of changing the impurity concentrations of the channel dope layers in accordance with the characteristics of the transistors, and therefore, it is possible to fix the concentrations at such values with which a leakage current (i.e., diffusion layer leakage) from a diffusion layer can be suppressed as small as possible.

Hence, by setting the impurity concentrations of the channel dope layers at such values with which a diffusion layer leakage is as small as possible while setting threshold values by means of the nitrogen concentrations of the gate electrodes, it is possible to break the trade-off relationship between the threshold values and the diffusion layer leakage and hence to eliminate a restriction imposed on circuit designing.

To change the impurity concentrations of the gate electrodes independently is less influential over the other structures than to change the nitrogen concentrations of the channel dope layers which are formed within the semiconductor substrate. That is, when ions are to be implanted into the semiconductor substrate, in particular, when implantation at a high dose is to be executed, this causes crystal deterioration of the semiconductor substrate. However, in the present invention, since nitrogen ions are implanted into the gate electrodes which are located in the outer-most layer, this problem does not occur. It is only necessary to set an implantation range in such a manner that the nitrogen ions will not reach the gate oxide films.

Although the foregoing has described that the impurity concentrations of the channel dope layers 103A to 103C are the same, the nitrogen concentrations do not have to be the same with each other. For instance, when it is not possible to adjust the threshold values sufficiently only by changing the impurity concentrations of the gate electrodes, the threshold values may be adjusted by changing the impurity concentrations of the channel dope layers 103A to 103C. Since this is an auxiliary process, an increase in the impurity concentrations is small. This does not largely increase the diffusion layer leakage, nor allows ion implantation to cause crystal deterioration of the semiconductor substrate.

Further, although there are a number of crystal defects in the vicinity of the interface between the gate electrodes and the gate oxide film, as nitrogen is introduced into the gate electrodes, nitrogen atoms are combined with dangling bonds, one cause of creating crystal defects, so that the crystal defects are recovered. Hence, the reliability of the gate oxide film is improved.

Moreover, since the nitrogen-introduced regions N1 to N3 are formed in the vicinity of the interface with the gate oxide film 3 within the gate electrodes 4A to 4C, it is possible to suppress punch-through of the impurity which is implanted into the gate electrodes. That is, the implanted impurity is diffused by heating or other processing which is performed later, since the implanted impurity has a concentration profile. When the implanted impurity diffuses excessively, in some cases, the implanted impurity pass through the gate oxide film, reaching to the silicon substrate. This phenomena is called "punch-through." If punch-through occurs, the impurity concentration changes in the channel regions, and therefore, basic electric characteristics such as a threshold value are changed. However, the nitrogen-introduced regions N1 to N3 prevent this.

<1-4. Modifications>

The foregoing has described the manufacturing method of manufacturing the DRAM 100 according to the first preferred embodiment described with reference to FIGS. 9 to 15, in relation to an example where impurity ions are implanted into the polysilicon layer 42 by ion implantation to thereby form the doped polysilicon layer 421 (See FIG. 11).

However, the doped polysilicon layer may be formed by in-situ doping in which an impurity is introduced at the same time when the polysilicon layer is formed by using stacking material gas with gas which contains an impurity such as phosphorus during formation of the polysilicon layer by a CVD method. This method may be used to form the polysilicon layer, which is a major material of the gate electrodes, in second to fourth preferred embodiments which will be described later.

The impurity concentration is uniform within the doped polysilicon layer which is formed in this manner, so that diffusion of the impurity due to heating processing or the like is suppressed.

Further, the foregoing has described the manufacturing method of manufacturing the DRAM 100 according to the first preferred embodiment described with reference to FIGS. 9 to 15, also in relation to an example where the nitrogen-introduced region NJ is formed in the gate electrode 4A as well of the N-channel MOS transistor T41 of the sense amplifier portion in which an area where the depletion layer is formed is the smallest (See FIG. 12).

However, a threshold value may be adjusted by adjusting the impurity concentration of the channel dope layer, without forming the nitrogen-introduced region N1 in the gate electrode 4A.

Such a structure eliminates the step of introducing nitrogen at least once, which in turn simplifies the manufacturing processes.

While the foregoing has described the structure in which various types of transistors are formed on a single crystal substrate as the first preferred embodiment of the present invention, it is possible to achieve similar function and effect in the case where various types of transistors are formed on an SOI (silicon on insulator) substrate.

<Second Preferred Embodiment>

<2-1. Structure of Device>

Figure 16:
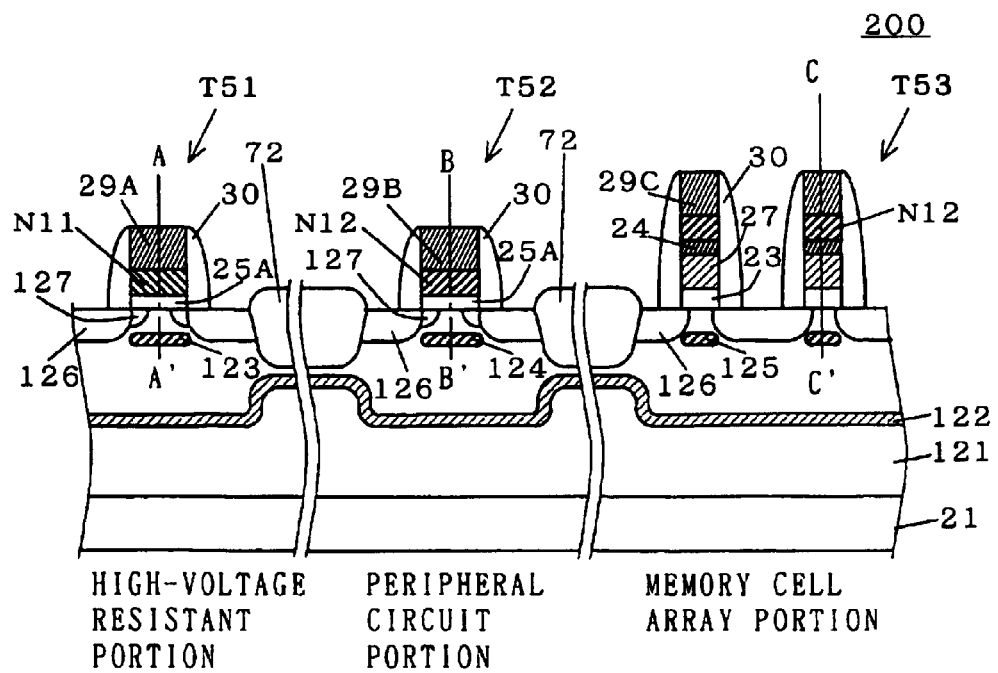
FIG. 16 is a cross sectional view showing a structure of a second preferred embodiment of the present invention.

FIG. 16 shows a partial structure of a flash memory 200 in which a plurality of types of transistors are formed, as a second preferred embodiment of the present invention. In general, a flash memory is different from a DRAM in using a high voltage, such as 10V, for writing and erasing. To this end, a flash memory comprises not only a memory cell array portion for storing data, but also a high-voltage resistant portion, such as an X decoder and a Y decoder, which is used after stepping up, a peripheral circuit portion (i.e., an address buffer, a row/column clock portion, an I/O pass portion, a data register portion, a sense amplifier portion, an operation control portion), and the like. Although any these portions are formed by transistors, due to differences between voltages used, a plurality of types of transistors which have different characteristics from each other are needed.

FIG. 16 shows cross sections of N-channel MOS transistors T51 to T53 which are used for the high-voltage resistant portion, the peripheral circuit portion, and the memory cell array portion.

In FIG. 16, the N-channel MOS transistors T51 to T53 formed within a P-type well layer 121 which is formed on the same semiconductor substrate 21 (of the P-type). The well layer 121 is element-separated by a channel cut layer 122 and a LOCOS layer 72 in such a manner that the N-channel MOS transistors T51 to T53 are formed in regions which are created by element separation.

The N-channel MOS transistor T51 of the high-voltage resistant portion comprises a pair of source/drain layers 126 formed within the well layer 121 independently of each other but parallel to each other and a pair of LDD layers 127 formed adjacent to edge portions facing each other of the source/drain layers 126.

The gate oxide film 25A is formed on the LDD layers 127, and a gate electrode 29A is formed on the gate oxide film 25A. A side wall oxide film 30 is formed on a side surface of the gate oxide film 25A and the gate electrode 29A. Within the well layer 121 under the gate electrode 29A, a channel dope layer 123 is formed.

A nitrogen-introduced region N11 is formed in the vicinity of the interface with the gate oxide film 25A within the gate electrode 29A.

The N-channel MOS transistor T52 of the peripheral circuit portion comprises a pair of source/drain layers 126 formed within the well layer 121 independently of each other but parallel to each other and a pair of LDD layers 127.

The gate oxide film 25A is formed on the LDD layers 127, and a gate electrode 29B is formed on the gate oxide film 25A. The side wall oxide film 30 is formed on a side surface of the gate oxide film 25A and the gate electrode 29B. Within the well layer 121 under the gate electrode 29B, a channel dope layer 124 is formed.

A nitrogen-introduced region N12 is formed in the vicinity of the interface with the gate oxide film 25A within the gate electrode 29B.

The N-channel MOS transistor T53 of the memory cell array portion comprises a pair of source/drain layers 126 formed within the well layer 121 independently of each other but parallel to each other. A tunnel oxide film 23 is formed on edge portions of the source/drain layers 126. A floating gate electrode 27, an inter-layer insulation film (ONO film) 24 and a control gate electrode 29C are formed in this order on the tunnel oxide film 23. The control gate electrode 29C has the same structure as the gate electrodes, and therefore, will be treated as a gate electrode in the following.

Further, the side wall oxide film 30 is formed on a side surface of the tunnel oxide film 23, the floating gate electrode 27, the inter-layer insulation film 24 and the control gate electrode 29C.

A nitrogen-introduced region N12 is formed in the vicinity of the interface with the inter-layer insulation film 24 within the gate electrode 29C.

In addition, a channel dope layer 125 is formed within the well layer 121 under the floating gate electrode 27. The memory cell array portion has a gate array structure in which adjacent gates share one source/drain layer 126. Such structures are arranged successively.

Table 6 shows figures regarding the structures of the N-channel MOS transistors T51 to T53.

Further, nitrogen is present in the gate oxide film and the inter-layer insulation film, and a relationship regarding the concentrations is maintained. The profile is such that nitrogen does not almost exist in a portion in the well layer other than in the vicinity of the interface with the gate oxide film.

Figure 18:
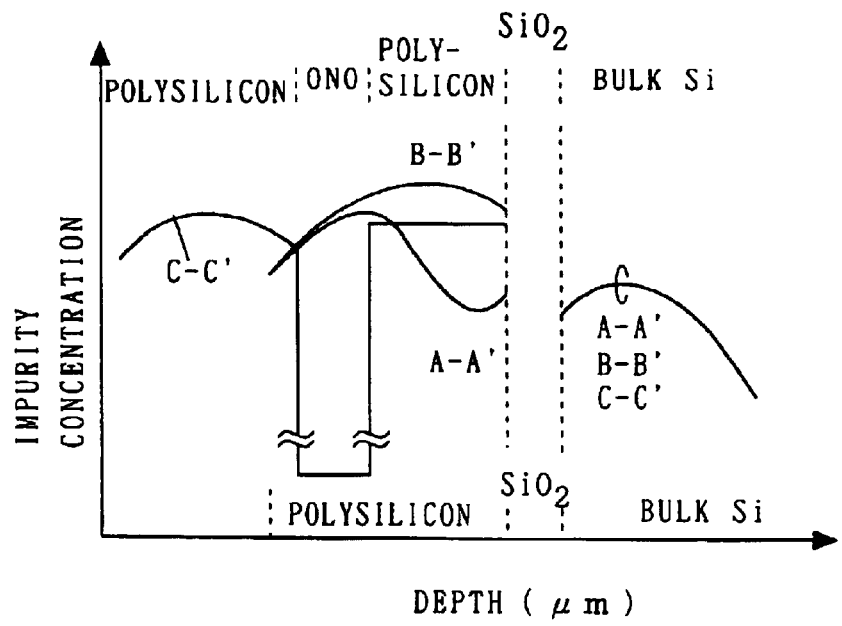
FIG. 18 is a diagram for describing an impurity distribution according to the second preferred embodiment of the present invention.

In addition, as shown in FIG. 18, with respect to the impurity profiles in the gate electrodes, the profile of the

TABLE 6

| | HIGH-VOLTAGE RESISTANT PORTION (T51) | | | PERIPHERAL CIRCUIT PORTION (T52) | | | MEMORY CELL ARRAY PORTION (T53) | | |
|---|---|---|---|---|---|---|---|---|---|
| FIELD OXIDE FILM THICKNESS | 4000 Å | | | 4000 Å | | | 4000 Å | | |
| GATE OXIDE FILM THICKNESS | 80 Å | | | 80 Å | | | 100 Å | | |
| FLOATING GATE ELECTRODE FILM THICKNESS | — | | | — | | | 1000 Å | | |
| FLOATING GATE IMPURITY CONCENTRATION | — | | | — | | | $1 \times 10^{20}/cm^3$ | | |
| INTER-LAYER INSULATION FILM THICKNESS | — | | | — | | | $TEOS/Si_3N_4/TEOS = 100/100/100$ Å | | |
| CONTROL GATE ELECTRODE FILM THICKNESS | 2000 Å | | | 2000 Å | | | 2000 Å | | |
| SIDE WALL | 2000 Å | | | 2000 Å | | | 2000 Å | | |
| WELL | B | 700 keV | $1 \times 10^{13}/cm^2$ | B | 700 keV | $1 \times 10^{13}/cm^2$ | B | 700 keV | $1 \times 10^{13}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $5 \times 10^{12}/cm^2$ | B | 50 keV | $5 \times 10^{12}/cm^2$ | B | 50 keV | $5 \times 10^{12}/cm^2$ |
| LDD | As | 30 keV | $1 \times 10^{13}/cm^2$ | As | 30 keV | $1 \times 10^{13}/cm^2$ | | | — |
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| GATE IMPLANTATION | P | 30 keV | $5 \times 10^{15}/cm^2$ | P | 30 keV | $5 \times 10^{15}/cm^2$ | P | 30 keV | $5 \times 10^{15}/cm^2$ |
| | N | 10 keV | $1 \times 10^{16}/cm^2$ | N | 10 keV | $1 \times 10^{15}/cm^2$ | N | 10 keV | $1 \times 10^{15}/cm^2$ |
| HEATING | | | | 850° C. 60 min | | | | | |

In Table 6, the flash memory 200 is characteristic in that the gate electrode 29A of the N-channel MOS transistor T51 of the high-voltage resistant portion has the highest nitrogen concentration, and the nitrogen doses for the impurity concentration of the gate electrode 29B of the N-channel MOS transistor T52 of the peripheral circuit portion and the gate electrode 29C of the N-channel MOS transistor T53 of the memory cell array portion are the same.

Figure 17:
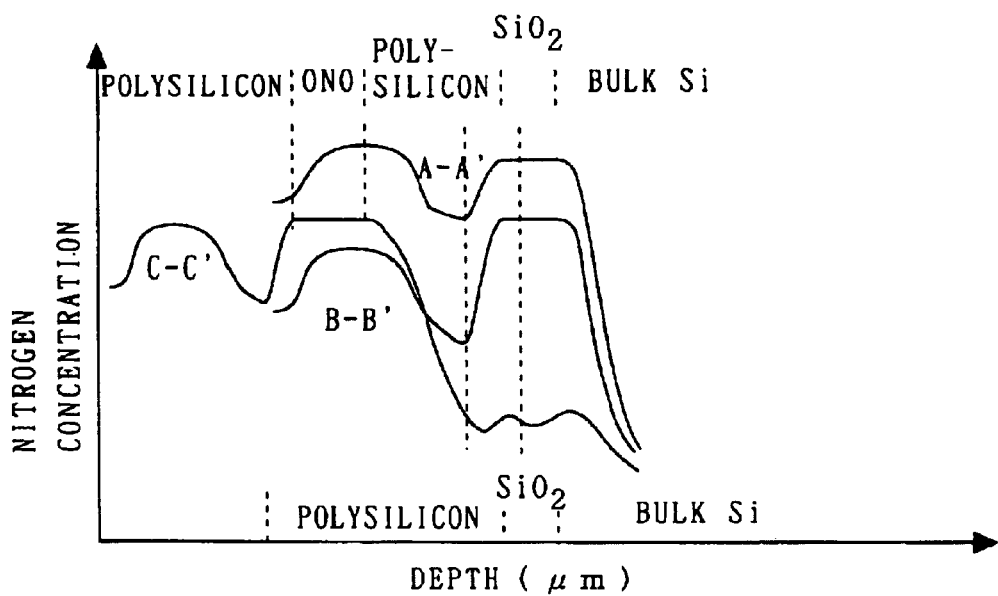
FIG. 17 is a diagram for describing a nitrogen distribution according to the second preferred embodiment of the present invention.

FIGS. 17 and 18 show impurity profiles of the N-channel MOS transistors T51, T52 and T53 forming the high-voltage resistant portion, the peripheral circuit portion and the memory cell array portion, all of which shown in FIG. 16, taken at cross sectional portions along line A–A', line B–B' and line C–C', respectively.

In FIGS. 17 and 18, a position (i.e. depth) in a cross sectional direction is shown along a horizontal axis, and a nitrogen concentration and an impurity concentration are shown along a vertical axis. The order in which the structure of the N-channel MOS transistor T53 of the memory cell array portion is fabricated is illustrated in an upper portion of FIG. 17, while the order in which the other structures are fabricated is illustrated along the horizontal axis.

The upper portions of FIGS. 17 and 18 show the control gate electrode (polysilicon layer), the inter-layer insulation film (ONO film), the floating gate electrode (polysilicon layer), the tunnel oxide film ($SiO_2$ layer) and the well layer (hulk silicon layer) in this order from the left-hand side.

Further, FIGS. 17 and 18 show the gate electrode (polysilicon layer), the gate oxide film ($SiO_2$ layer) and the well layer (hulk silicon layer) in this order along the horizontal axis.

In FIG. 17, as indicated at the line A–A', the nitrogen concentration of the gate electrode in the high-voltage resistant portion is the highest, and the nitrogen concentration of the gate electrode in the peripheral circuit portion indicated at the line B–B' and the nitrogen concentration of the gate electrode in the memory cell array portion indicated at the line C–C' are the same.

transistor T51 of the high-voltage resistant portion is most abrupt as indicated by line A–A', and the profile of the transistor T52 of the peripheral circuit portion and the profile of the transistor T53 of the memory cell array portion change moderately. This is because diffusion and activation of an impurity is suppressed more in a gate electrode in which a larger amount of nitrogen is introduced.

Hence, in the transistor T51 of the high-voltage resistant portion, the depletion layer is the largest so that the effective thickness of the oxide film is the thickest and the high-voltage resistant portion can withstand a high voltage.

Figure 19:
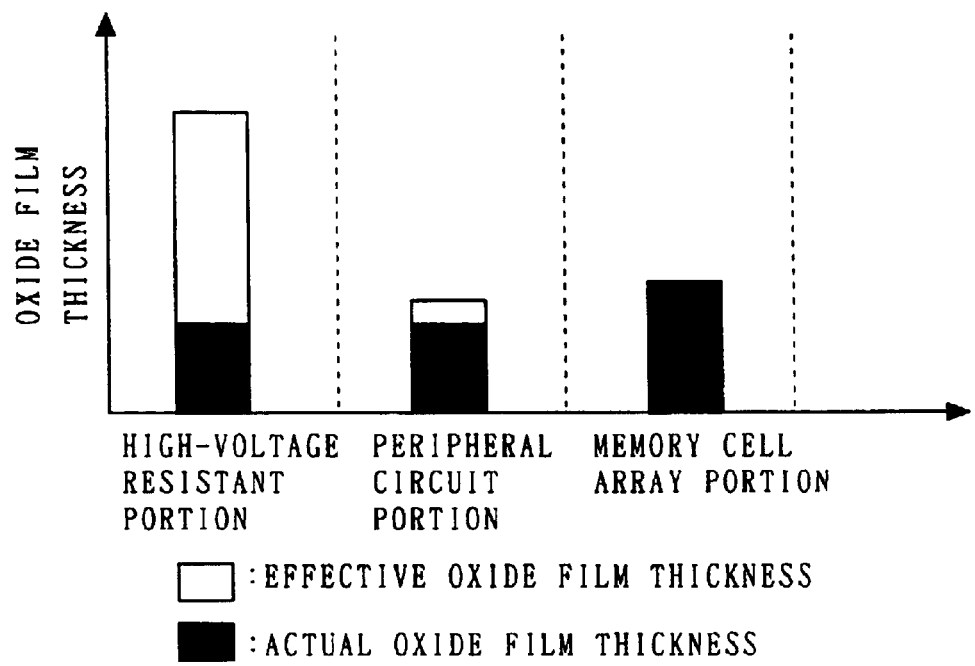
FIG. 19 is a diagram for describing a thickness of a gate oxide film in the second preferred embodiment of the present invention.

FIG. 19 shows actual thicknesses and effective thicknesses of the respective gate oxide films. FIG. 19 shows the N-channel MOS transistors of the high-voltage resistant portion, the peripheral circuit portion and the memory cell array portion in this order from the left-hand side along the horizontal axis. In the memory cell array portion, the tunnel oxide film is treated as the gate oxide film. As clearly shown in FIG. 19, among the effective thicknesses of the respective gate oxide films, the effective thickness is particularly thick in the high-voltage resistant portion.

Further, as shown in FIG. 18, in any one of the transistors of the high-voltage resistant portion (A–A' line), the peripheral circuit portion (B–B' line) and the memory cell array portion (C–C' line), the impurity concentration of the channel dope layer stays the same.

Since the floating gate electrode of the N-channel MOS transistor T53 of the memory cell array portion is formed by a CVD method, the impurity concentration remains constant.

<2-2. Manufacturing Method>

In the following, a description will be given on a method of manufacturing the N-channel MOS transistors T51, T52 and T53 of the high-voltage resistant portion, the peripheral circuit portion and the memory cell array portion, all of which shown in FIG. 16, with reference to FIGS. 20 to 33.

Figure 20:
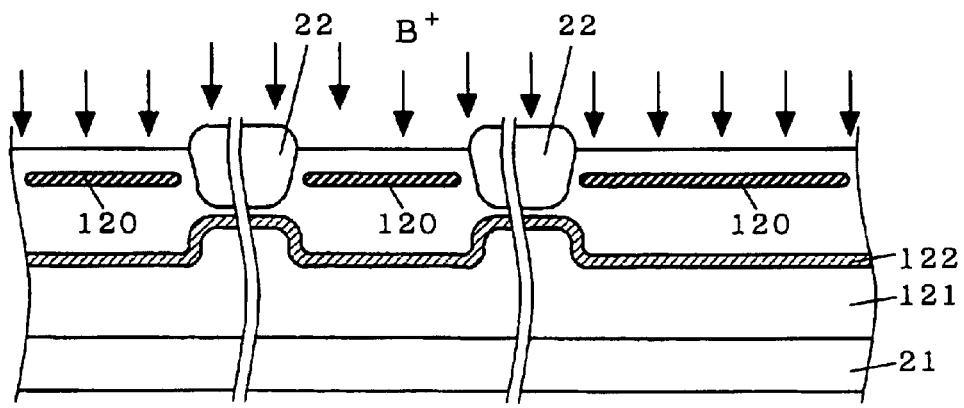
FIGS. 20 to 33 are diagrams showing manufacturing steps according to the second preferred embodiment of the present invention.

First, at a step shown in FIG. 20, a LOCOS layer (i.e., field oxide film) 22 is formed into a thickness of 4,000 Å, for instance, by a LOCOS method on a surface of the semiconductor substrate 21 of the P-type. Following this, boron ions, for instance, are implanted with the energy of 700 keV and at a dose of $1 \times 10^{13}/cm^2$, thereby forming a P-type well region 121 within the semiconductor substrate 21. Although an N-type well region as well is formed in the semiconductor substrate 21 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 122 within the semiconductor substrate 21. The channel cut layer 122 is formed in such a shape which together with the LOCOS layer 22 creates the element-separated regions.

Next, at a predetermined position in the high-voltage resistant portion, the peripheral circuit portion and the memory cell array portion within the well region 121, a channel dope layer 120 is formed. The channel dope layer 120 is formed by implanting boron ions, for instance, with the energy of 50 keV and at a dose of $5 \times 10^{12}/cm^2$.

Figure 21:
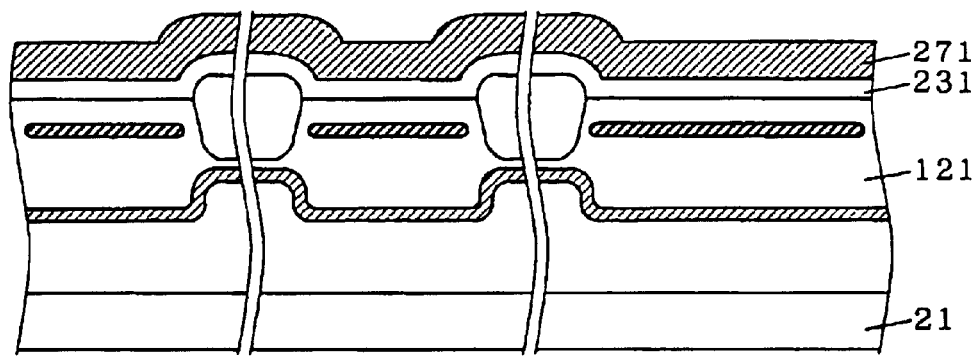

Next, at a step shown in FIG. 21, after forming an oxide film 231 which will become the tunnel oxide film 23 on a main surface of the semiconductor substrate 21 by a thermal oxide method, a doped polysilicon layer 271, for instance, is formed as a gate electrode material on the oxide film 231 by a CVD method. The oxide film 231 has a thickness of about 100 Å, whereas the doped polysilicon layer 271 has a thickness of about 1,000 Å. Phosphorus (P) is used as an impurity. The concentration of the impurity is about $1 \times 10^{20}/cm^3$.

Figure 22:
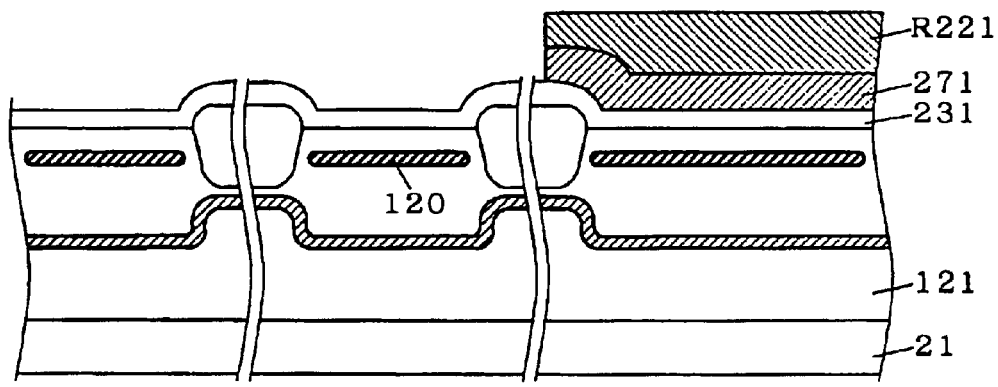
Figure 23:
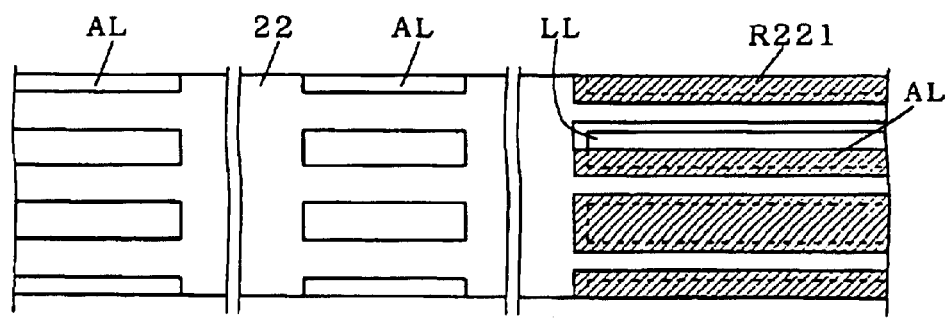

Next, at a step shown in FIG. 22, a resist mask R221 is formed selectively on the doped polysilicon layer 271 within the memory cell array portion. In this case, the resist mask R221 is formed along the gate-width direction of the memory cell array portion. A portion of the doped polysilicon layer 271 which is not covered with the resist mask R221 is removed by anisotropic etching. FIG. 23 shows this condition.

FIG. 23 is a plan view viewing FIG. 22 from the upper surface side (i.e., the side on which the resist mask R221 is formed). Within the memory cell array portion, the resist mask R221 is formed as rectangle islands which are arranged regularly. The resist mask R221 is formed to cover an active layer AL which has a configuration like a rectangular island and an LOCOS layer LL around the same. Within the high-voltage resistant portion and the peripheral circuit portion, since the resist mask is not formed, the active layer AL is exposed.

Although FIG. 23 partially omits the resist mask R221 so that the active layer AL and the LOCOS layer LL are visible, this is only for the clarity of illustration of the structure below the resist mask R221 and merely for the convenience of illustration.

Figure 24:
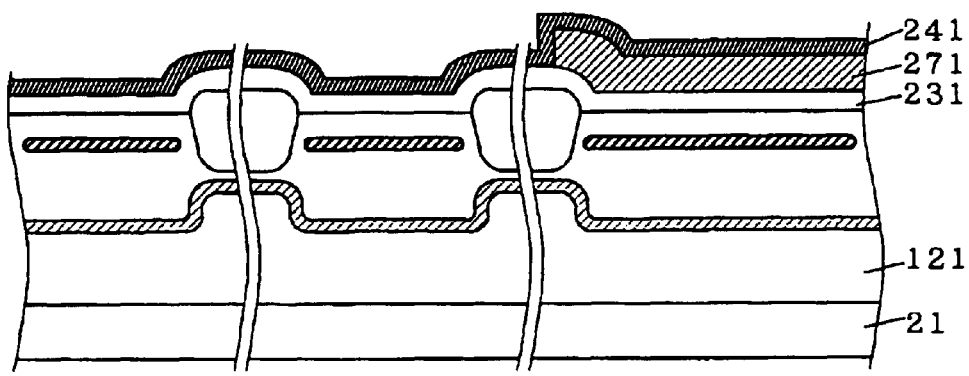

Next, after removing the resist mask R221, at a step shown in FIG. 24, an insulation film 241, which will become the inter-layer insulation film 24 which insulates the floating gate from the control gate, is formed on the doped polysilicon layer 271 by a CVD method. The inter-layer insulation film 24 is referred to as "ONO film" in some cases. The insulation film 241 is formed on the high-voltage resistant portion and the peripheral circuit portion as well. This film has a structure in which a TEOS (tetraethyl orthosilicate) film, a nitride film ($Si_3N_4$) film, a TEOS film each having a thickness of 100 Å are stacked in this order.

Figure 25:
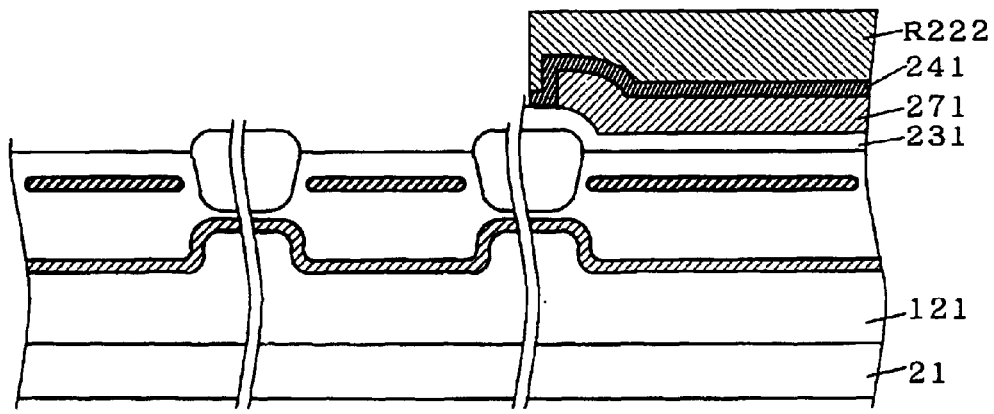
Figure 26:
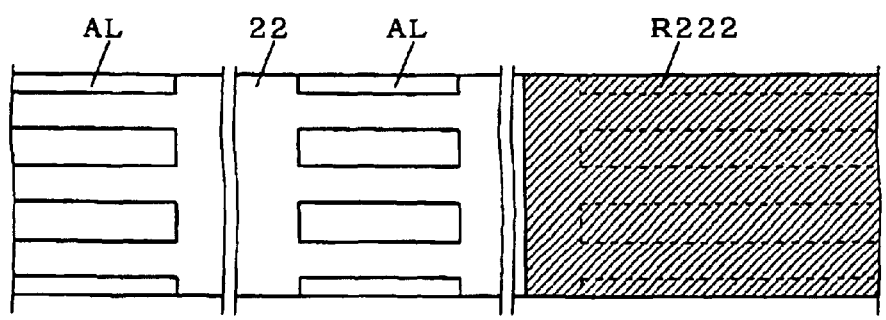

Next, at a step shown in FIG. 25, a resist mask R222 is formed on the insulation film 241 of the memory cell array portion, and the insulation film 241 in all other regions is removed. In this case, in the other regions, the oxide film 231 is removed as well. FIG. 26 shows this condition.

FIG. 26 is a plan view viewing FIG. 25 from the upper surface side (i.e., the side on which the resist mask R222 is formed). The resist mask R222 is formed to entirely cover the memory cell array portion. However, within the high-voltage resistant portion and the peripheral circuit portion, since the resist mask R222 is not formed, the active layer AL is exposed.

Figure 27:
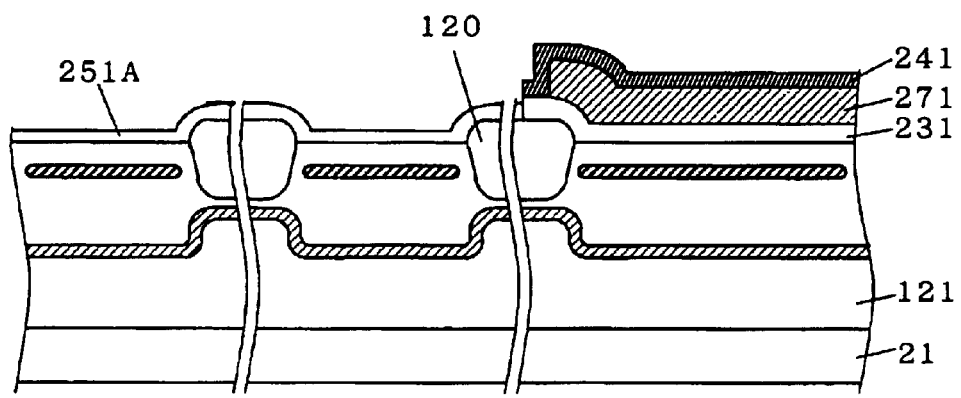

Next, after removing the resist mask R222, at a step shown in FIG. 27, an oxide film 251A which will become the gate oxide film 25A is formed entirely on the main surface of the semiconductor substrate 21 by a thermal oxide method. At this stage, since the insulation film 241 on the memory cell array portion includes the nitride film, the insulation film 241 is not oxidized and the thickness of the insulation film 241 is maintained. The thickness of the oxide film 251A is about 80 Å.

Figure 28:
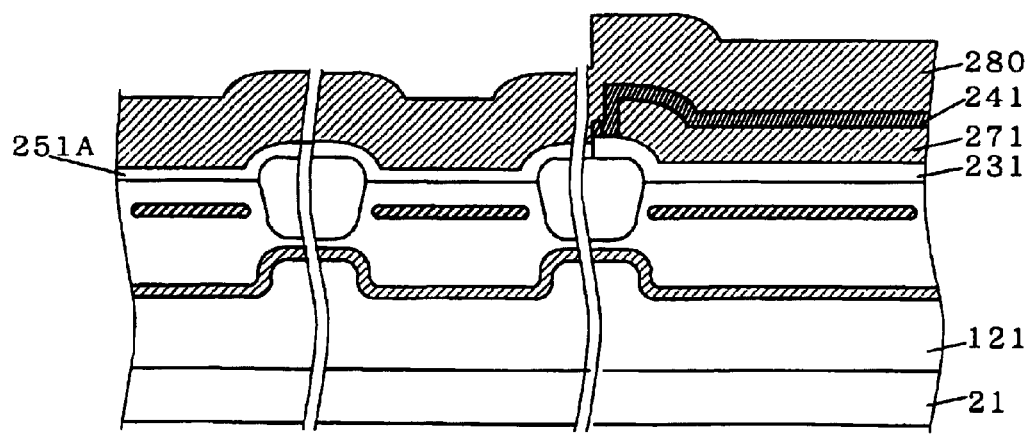

Next, at a step shown in FIG. 28, a (non-doped) polysilicon layer 280 is formed entirely on a main surface of the semiconductor substrate 21 as a gate electrode material by a CVD method. The polysilicon layer 280 has a thickness of about 2,000 Å.

Figure 29:
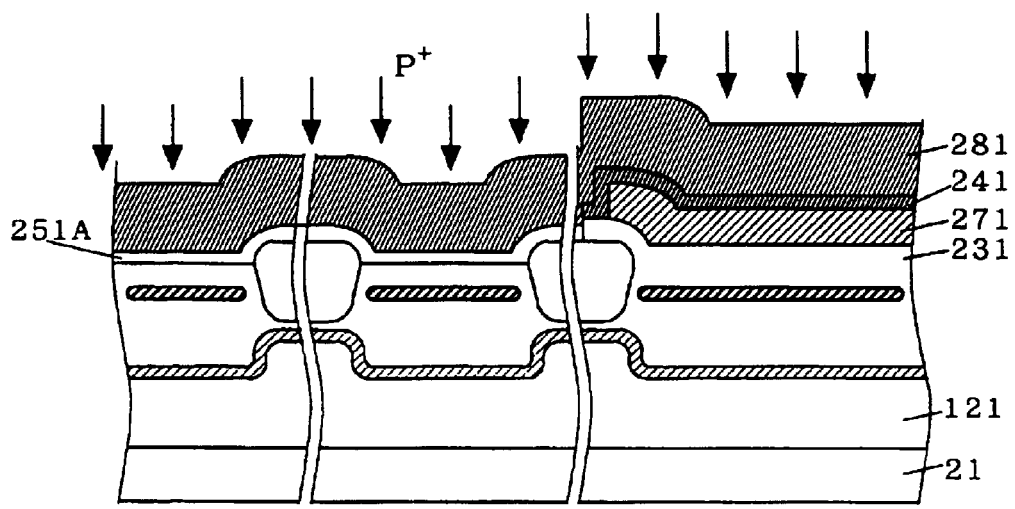

Next, at a step shown in FIG. 29, impurity ions are implanted into the polysilicon layer 280, thereby forming a doped polysilicon layer 281. The doped polysilicon layer 281 is formed by implanting phosphorus ions, for instance, with the energy of 30 keV and at a dose of $5 \times 10^{15}/cm^2$.

Figure 30:
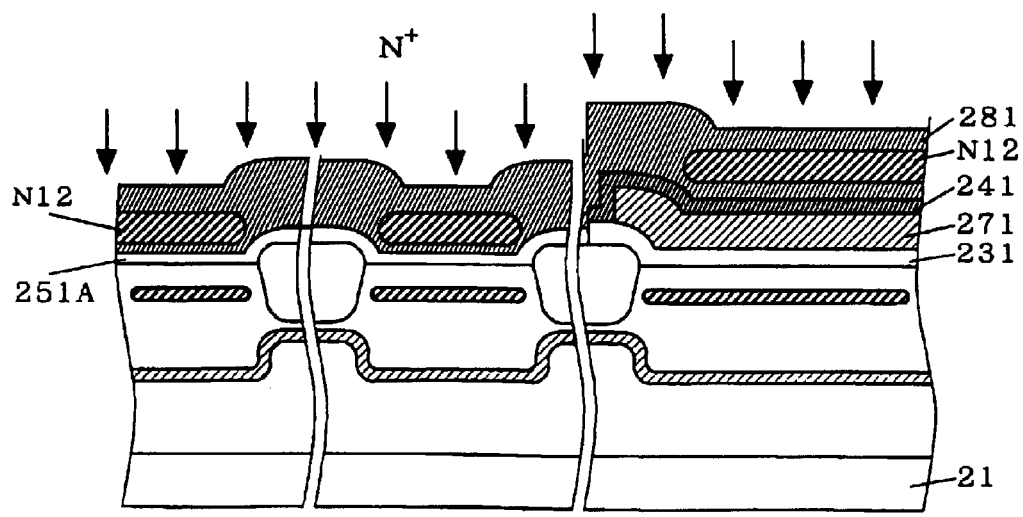

Next, at a step shown in FIG. 30, nitrogen ions are introduced into the doped polysilicon layer 281 in accordance with the N-channel MOS transistors T52 and T53 of the peripheral circuit portion and the memory cell array portion, each of which has a low nitrogen concentration in the gate electrode, thereby forming a nitrogen-introduced region N12. At this stage, the nitrogen-introduced region N12 is formed also in the doped polysilicon layer 281 on the high-voltage resistant portion. The nitrogen-introduced region N12 is formed by implanting nitrogen ions with the energy of 10 keV and at a dose of $1 \times 10^{15}/cm^2$, for instance.

Figure 31:
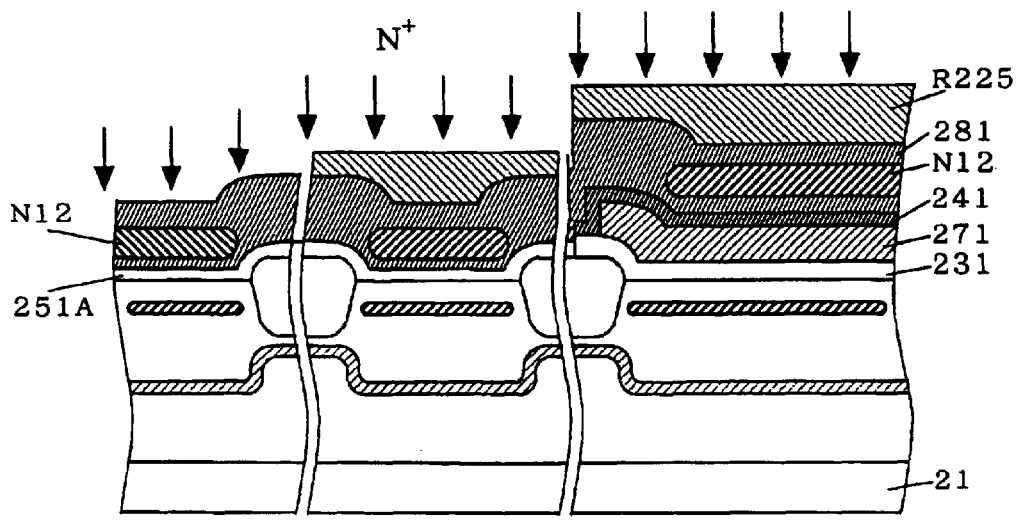

Next, at a step shown in FIG. 31, a resist mask R225 is formed on the peripheral circuit portion and the memory cell array portion. Nitrogen ions are additionally implanted in a selective fashion into the doped polysilicon layer 281 of the high-voltage resistant portion, thereby forming a nitrogen-introduced region N11 which has a concentration which is in accordance with the N-channel MOS transistor T51 of the high-voltage resistant portion. The nitrogen-introduced region N11 is formed by implanting nitrogen ions with the energy of 10 keV and at a dose of $9 \times 10^{15}$/ $cm^2$, for instance.

Figure 32:
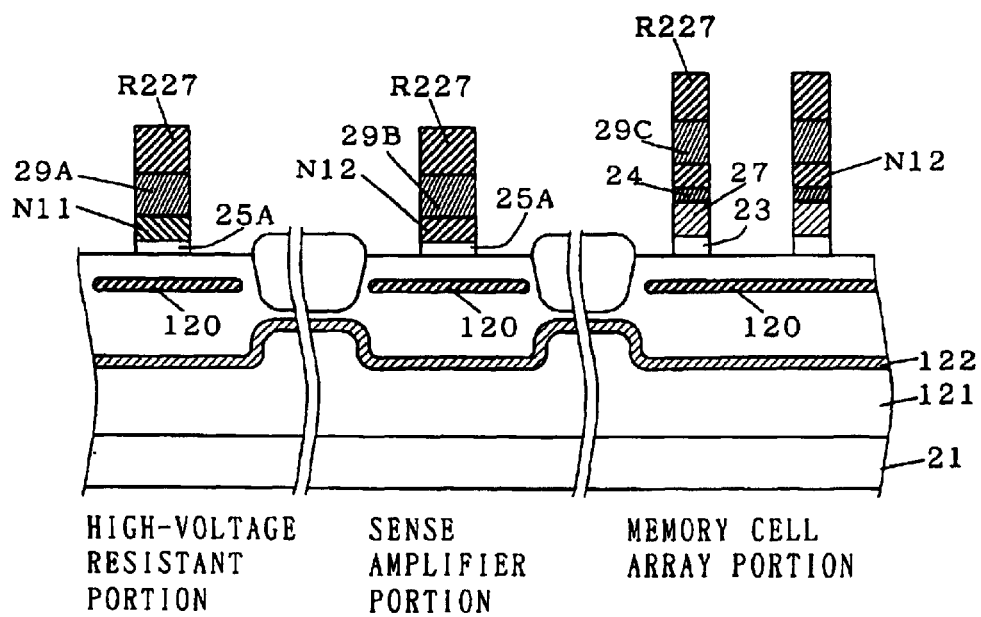
Figure 33:
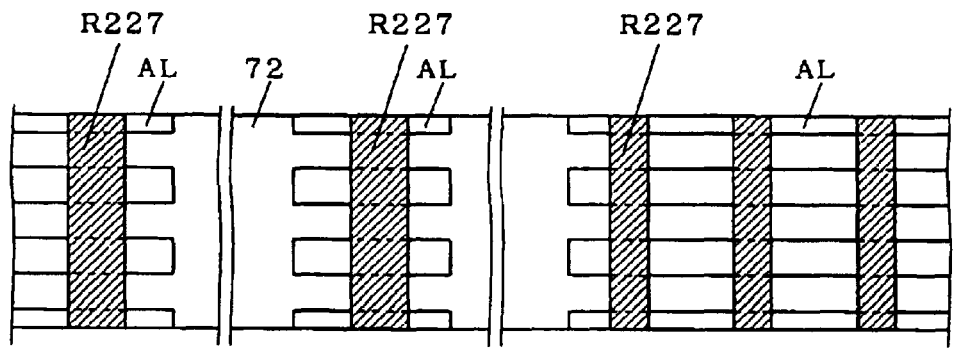

Next, after removing the resist mask R225, at a step shown in FIG. 32, a resist mask R227 is formed on the doped polysilicon layer 281 and patterned. FIG. 33 shows this condition.

FIG. 33 is a plan view viewing FIG. 32 from the upper surface side (i.e., the side on which the resist mask R227 is formed). The resist mask R227 is formed to be perpendicular to the active layer AL which has a rectangular configuration.

As a result of patterning, the gate oxide film 25A and gate electrode 29A are formed within the high-voltage resistant portion, the gate oxide film 25A and gate electrode 29B are formed within the peripheral circuit portion, and the tunnel oxide film 23, the floating gate electrode 27, the inter-layer insulation film 24 and the control gate electrode 29C are formed within the memory cell array portion.

Following this, after forming the LDD layers 127 by implanting ions into the high-voltage resistant portion and the peripheral circuit portion, the side wall oxide film 30 of about 1,000 Å in thickness is formed on a side surface of the gate oxide film 25A and gate electrode 29A, on a side surface of the gate oxide film 25A and gate electrode 29B, and on a side surface of the tunnel oxide film 23, the floating gate electrode 27, the inter-layer insulation film 24 and the control gate electrode 29C. Using the side wall oxide film 3(0 as a mask, by ion implantation, the source/drain layers 126 are formed. In this manner, the structure of the flash memory which is shown in FIG. 16 is obtained.

Now, the LDD layers 127 are obtained by implanting arsenic ions, for instance, with the energy of 30 keV and at a dose of $1\times10^3/cm^2$. Meanwhile, the source/drain layers 126 are obtained by injecting arsenic ions, for instance, with the energy of 50 keV and at a dose of $5\times10^{15}/cm^2$ and thereafter annealing at 850° C. for 60 minutes.

Although this is followed by formation of a capacitor, an inter-layer insulation film, a wiring layer and the like to form the flash memory, this will not be described nor is shown in the drawings.

<2-3. Characteristic Function and Effect>

As described above, the flash memory 200 according to the second preferred embodiment of the present invention has such a structure in which the nitrogen concentrations of the gate electrodes are changed among the plurality of types of transistors having different characteristics from each other (e.g., having different required specifications from each other) so that the effective thicknesses of the respective gate oxide films are changed. Hence, it is not necessary to form the gate oxide films which have different breakdown voltages from each other to have different thicknesses from each other.

Further, since it is possible to set the threshold values by changing the effective thicknesses of the gate oxide films, it is not necessary to change the impurity concentrations of the channel dope layers in accordance with the characteristics of the transistors, and therefore, it is possible to fix the concentrations at such values with which a leakage current (i.e., diffusion layer leakage) from a diffusion layer can be suppressed as small as possible.

Hence, by setting the impurity concentrations of the channel dope layers at such values with which a diffusion layer leakage is as small as possible while adjusting the breakdown voltage characteristics and the threshold values by means of the nitrogen concentrations of the gate electrodes, it is possible to satisfy the requirements regarding the breakdown voltages, to break the trade-off relationship between the threshold values and the diffusion layer leakage, and hence, to eliminate a restriction imposed on circuit designing.

Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

That is, in the structure shown in FIG. 16, since the thicknesses of the gate oxide films of the transistors of the high-voltage resistant portion and the peripheral circuit portion are the same with each other, there two types of the gate oxide films. Further, with respect to the steps for forming the oxide films, there are only the step for forming the oxide film 231 (See FIG. 21) and the step for forming the oxide film 251A (See FIG. 27). Since the oxide films are formed by carrying out thermal oxidation once at either steps, unlike in the conventional manufacturing method described with reference to FIGS. 83 to 96, it is not necessary to form one oxide film at more than one stage and there is no concern that an impurity may be mixed in or the controllability of controlling film thickness may deteriorate.

Further, although there are a number of crystal defects in the vicinity of the interface between the gate electrodes and the gate oxide film, as nitrogen is introduced into the gate electrodes, nitrogen atoms are combined with dangling bonds, cause of creating crystal defects, so that the crystal defects are recovered. Hence, the reliability of the gate oxide film is improved.

Moreover, since the nitrogen-introduced regions N11 and N12 are formed in the vicinity of the interface with the gate oxide film 25A within the gate electrodes 29A and 29B, and since the nitrogen-introduced region N12 is formed in the vicinity of the interface with the inter-layer insulation film 24 within the control gate electrode 29C, it is possible to suppress punch-through of the impurity which is implanted into the gate electrodes.

While the foregoing has described the structure in which various types of transistors are formed on a single crystal substrate as the second preferred embodiment of the present invention, it is possible to achieve similar function and effect in the case where various types of transistors are formed on an SOI (silicon C) on insulator) substrate.

<Third Preferred Embodiment>

<3-1. Structure of Device>

Figure 34:
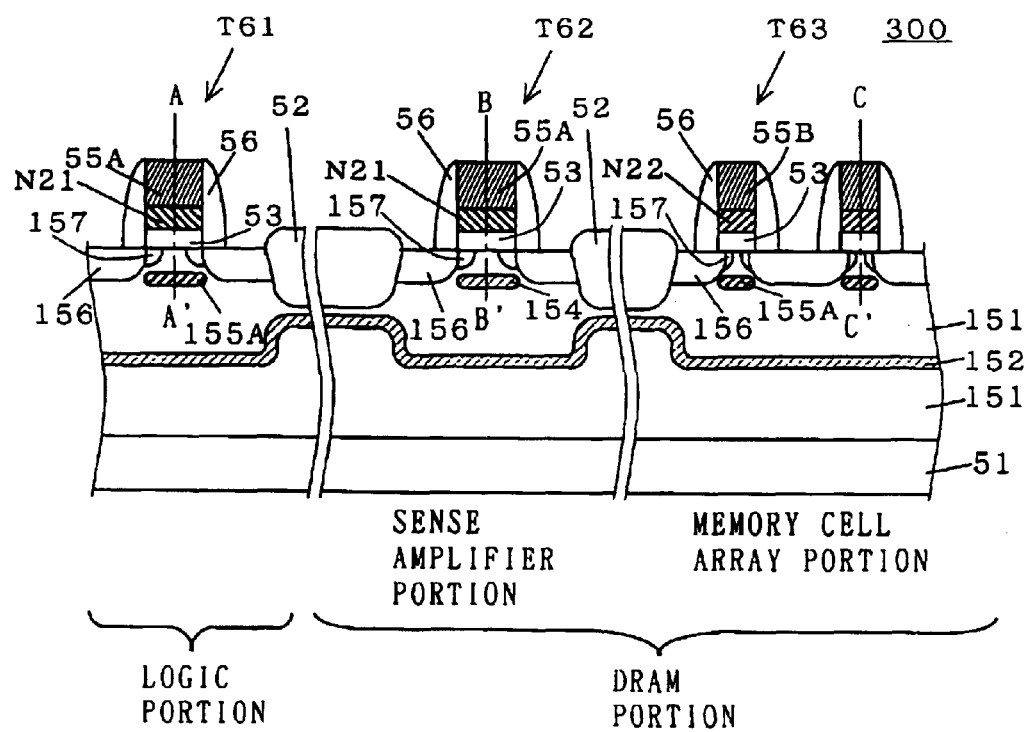
FIG. 34 is a cross sectional view showing a structure of a third preferred embodiment of the present invention.

FIG. 34 shows a partial structure of a DRAM which comprises a logic circuit (hereinafter "LOGIC in DRAM") 300, as a third preferred embodiment of the present invention.

A LOGIC in DRAM is a device which executes a high performance and requires only a low cost, since a logic circuit is formed within the same chip so that the DRAM and the logic circuit, which have been heretofore formed as separate chips, are combined with each other.

In general, a LOGIC in DRAM is roughly divided into a logic portion and a DRAM portion. A requirement to the logic portion is an operation at a high speed, that is, a high driving capability and a low capacity. Meanwhile, as described earlier in relation to the first preferred embodiment, the DRAM portion includes a memory cell array portion in which a low leakage current is demanded, a sense amplifier portion in which an operation at a low voltage is demanded, etc. That is, a plurality of types of transistors which have different characteristics from each other are needed within a LOGIC in DRAM which is formed as one chip.

FIG. 34 shows cross sections of N-channel MOS transistors T61 to T63 which are used for the logic portion, the sense amplifier portion and the memory cell array portion.

In FIG. 34, the N-channel MOS transistors T61 to T63 are formed within a P-type well layer 151 which is formed on the same semiconductor substrate 51 (of the P-type). The well layer 151 is element-separated by a channel cut layer 152, which is formed within the well layer 151, and a LOCOS layer 52 in such a manner that the N-channel MOS transistors T61 to T63 are formed in regions which are created by element separation.

The N-channel MOS transistor T61 of the logic portion comprises a pair of source/drain layers 156 formed within the well layer 151 independently of each other but parallel to each other and a pair of LDD layers 157 formed adjacent to edge portions facing each other of the source/drain layers 156.

A gate oxide film 53 is formed on the LDD layers 157, and a gate electrode 55A is formed on the gate oxide film 53. A side wall oxide film 56 is formed on a side surface of the gate oxide film 53 and the gate electrode 55A. Within the well layer 151 under the gate electrode 55A, a channel dope layer 155A is formed.

The N-channel MOS transistor T62 of the sense amplifier portion comprises a pair of source/drain layers 156 formed within the well layer 151 independently of each other but parallel to each other and a pair of LDD layers 157.

The gate oxide film 53 is formed on the LDD layers 157, and a gate electrode 55A is formed on the gate oxide film 53. The side wall oxide film 56 is formed on a side surface of the gate oxide film 53 and the gate electrode 55A. Within the well layer 151 under the gate electrode 55A, a channel dope layer 154 is formed.

A nitrogen-introduced region N21 is formed in the vicinity of the interface with the gate oxide film 53 within the gate electrode 55A.

The N-channel MOS transistor T63 of the memory cell array portion comprises a pair of source/drain layers 156 formed within the well layer 151 independently of each other but parallel to each other and a pair of LDD layers 157.

The gate oxide film 53 is formed on the source/drain layers 156 and the LDD layers 157, and the gate electrode 55B is formed on the gate oxide film 53. The side wall oxide film 56 is formed on a side surface of the gate oxide film 53 and the gate electrode 55B.

A nitrogen-introduced region N22 is formed in the vicinity of the interface with the gate oxide film 53 within the gate electrode 55B.

Within the well layer 151 under the gate electrode 55B, a channel dope layer 155A is formed. The memory cell array portion has a gate array structure in which adjacent gates share one source/drain layer 156. Such structures are arranged successively.

Table 7 shows figures regarding the structures of the N-channel MOS transistors T61 to T63.

Figure 35:
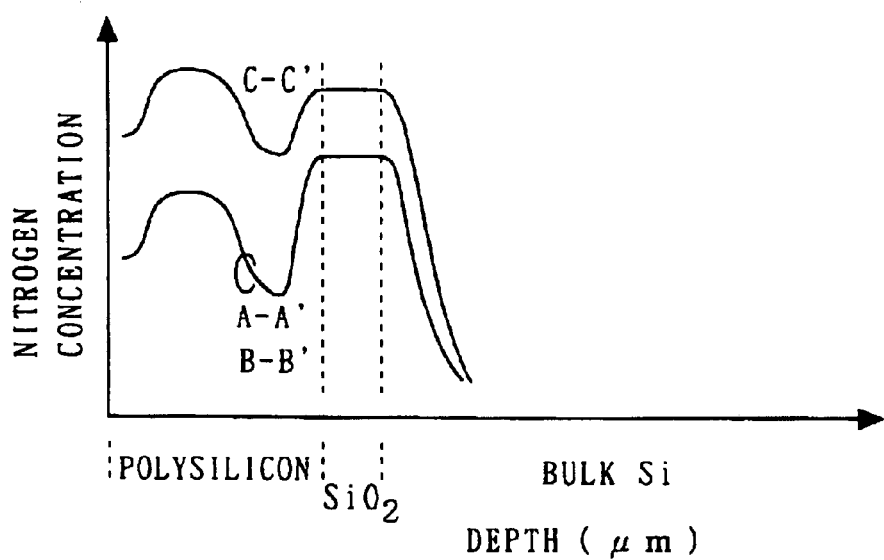
FIG. 35 is a diagram for describing a nitrogen distribution according to the third preferred embodiment of the present invention.
Figure 36:
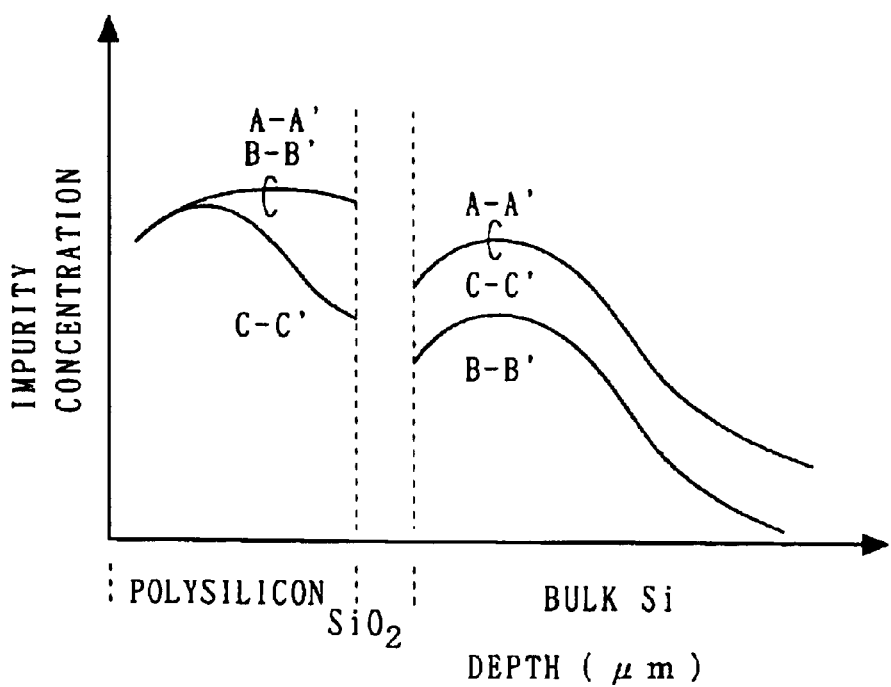
FIG. 36 is a diagram for describing an impurity distribution according to the third preferred embodiment of the present invention.

In FIGS. 35 and 36, a position (i.e., depth) in a cross sectional direction is shown along a horizontal axis, and a nitrogen concentration and an impurity concentration are shown along a vertical axis. There are the gate electrode (polysilicon layer), the gate oxide film ($SiO_2$ layer) and the well layer (hulk silicon layer) in this order along the horizontal axis from the left-hand side.

As shown in Table 7, the nitrogen concentrations are different from each other in the gate electrodes 55A and 55B of the transistors T61 to T63, and therefore, the nitrogen concentrations are accordingly different from each other. Thus, in the transistor of the memory cell array portion which is expected to have the highest threshold value, the nitrogen concentration in the nitrogen-introduced region is the highest. That is, as shown in FIG. 35, the concentration is the highest in the transistor T63 of the memory cell array portion as indicated by line C–C', and the concentrations in the transistor T61 of the logic portion (line A–A') and the transistor T62 of the sense amplifier portion (line B–B') are the same and lower than that of the transistor T63.

Further, nitrogen is present in each gate oxide film, and a relationship regarding the concentrations is maintained. The profile is such that nitrogen does not almost exist in a portion in the well layer other than in the vicinity of the interface with the gate oxide film.

Moreover, as indicated by line A–A' and line B–B' in FIG. 36, the impurity concentrations within the gate electrodes are the same between the transistors T61 and T62, and therefore, the line A–A' and line B–B' are one atop the other. The A–A' and B–B' line are relatively flat. The transistor T63 of the memory cell array portion has the profile indicated by line C–C' which changes abruptly.

Since the impurity doses for the channel dope layers 155A of the N-channel MOS transistors T61 and T63 are the same, the line A–A' and the line C–C' are one atop the other.

Diffusion and activation of an impurity is suppressed more in a gate electrode in which a larger amount of nitrogen

TABLE 7

| | LOGIC PORTION (T61) | | SENSE AMPLIFIER PORTION (T22) | | MEMORY CELL ARRAY PORTION (T23) | |
|---|---|---|---|---|---|---|
| FIELD OXIDE FILM THICKNESS | 4000 Å | | 4000 Å | | 4000 Å | |
| GATE OXIDE FILM THICKNESS | 60 Å | | 60 Å | | 60 Å | |
| GATE ELECTRODE FILM THICKNESS | 2000 Å | | 2000 Å | | 2000 Å | |
| SIDE WALL | 1000 Å | | 1000 Å | | 1000 Å | |
| WELL | B  700 keV | $1 \times 10^{15}/cm^2$ | B  700 keV | $1 \times 10^{15}/cm^2$ | B  700 keV | $1 \times 10^{15}/cm^2$ |
| CHANNEL CUT | B  130 keV | $5 \times 10^{12}/cm^2$ | B  130 keV | $5 \times 10^{12}/cm^2$ | B  130 keV | $5 \times 10^{12}/cm^2$ |
| CHANNEL DOPE | B  50 keV | $5 \times 10^{12}/cm^2$ | B  50 keV | $1 \times 10^{12}/cm^2$ | B  50 keV | $5 \times 10^{12}/cm^2$ |
| LDD | As  30 keV | $1 \times 10^{13}/cm^2$ | As  30 keV | $1 \times 10^{13}/cm^2$ | As  30 keV | $1 \times 10^{13}/cm^2$ |
| SOURCE/DRAIN | As  50 keV | $5 \times 10^{15}/cm^2$ | As  50 keV | $5 \times 10^{15}/cm^2$ | As  50 keV | $5 \times 10^{15}/cm^2$ |
| GATE IMPLANTATION | P  30 keV | $5 \times 10^{15}/cm^2$ | P  30 keV | $5 \times 10^{15}/cm^2$ | P  30 keV | $5 \times 10^{15}/cm^2$ |
| | N  10 keV | $1 \times 10^{15}/cm^2$ | N  10 keV | $1 \times 10^{15}/cm^2$ | N  10 keV | $5 \times 10^{15}/cm^2$ |
| HEATING | | | 850° C. 30 min | | | |

In Table 7, impurity doses for forming the gate electrodes of the N-channel transistors T61, T62 and T63 are equally $5 \times 10^{15}/cm^2$. Phosphorus (P) is implanted as an impurity for each electrode with the implantation energy of 30 keV.

Nitrogen doses are $1 \times 10^{15}/cm^2$, $1 \times 10^{15}/cm^2$ and $5 \times 10^{15}/cm^2$, respectively. The implantation energy is equally 10 keV.

FIGS. 35 and 36 show impurity profiles of the N-channel MOS transistors T61, T62 and T63 of the logic portion, the sense amplifier portion and the memory cell array portion, all of which shown in FIG. 34, taken at cross sectional portions along line A–A', line B–B' and line C–C', respectively.

is introduced, so that the impurity concentration becomes lower. Hence, in the memory cell array portion in which the impurity concentration is the lowest, the depletion layer is the largest at the gate electrode, the effective thickness of the oxide film is the thickest, and the threshold value is high.

Figure 37:
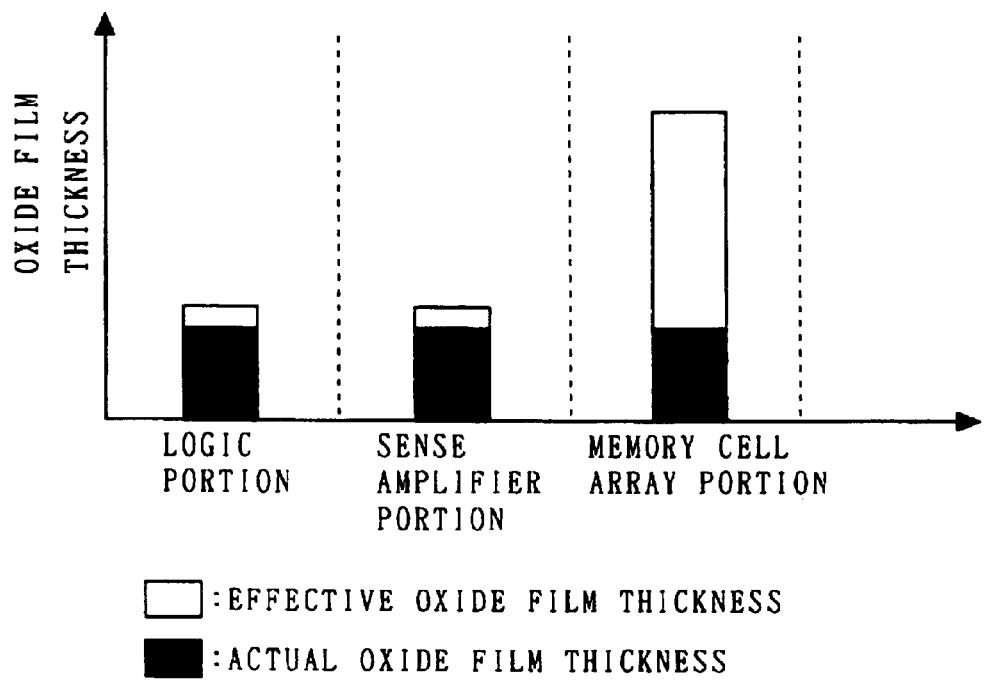
FIG. 37 is a diagram for describing a thickness of a gate oxide film in the third preferred embodiment of the present invention.

FIG. 37 shows the actual thicknesses and the effective thicknesses of the respective gate oxide films. In FIG. 37, the N-channel MOS transistors of the logic portion, the sense amplifier portion and the memory cell array portion are shown in this order along the horizontal axis from the left-hand side. As shown in FIG. 37, although the actual thicknesses of the transistors are the same with each other, among the effective thicknesses of the transistors, the effective thickness is particularly thick in the memory cell array portion.

<3-2. Manufacturing Method>

In the following, a description will be given on a method of manufacturing the N-channel MOS transistors T61, T62 and T63 of the logic portion, and of the sense amplifier portion and the memory cell array portion of the flash memory portion, which are shown in FIG. 34, with reference to FIGS. 38 to 44.

Figure 38:
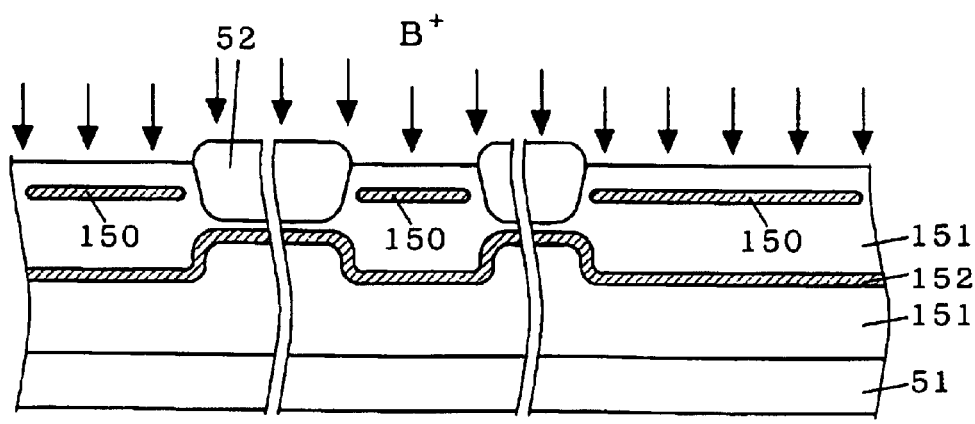
FIGS. 38 to 44 are diagrams showing manufacturing steps according to the third preferred embodiment of the present invention.

First, at a step shown in FIG. 38, a LOCOS layer (i.e., field oxide film) 52 is formed into a thickness of 4,000 Å, for instance, by a LOCOS method, on a surface of the semiconductor substrate 51 of the P-type. Following this, boron ions, for instance, are implanted with the energy of 700 keV and at a dose of $1 \times 10^{13}/cm^2$, thereby forming a P-type well region 151 within the semiconductor substrate 51. Although an N-type well region as well is formed in the semiconductor substrate 51 in order to form P-channel MOS transistors, this is not shown and a description will be omitted. Next, boron ions, for example, are implanted with the energy of 130 keV and at a dose of $5 \times 10^{12}/cm^2$, thereby forming the channel cut layer 152 within the semiconductor substrate 51. The channel cut layer 152 is formed in such a shape which together with the LOCOS layer 52 creates the element-separated regions.

Next, the channel dope layer 150 which has the lowest impurity concentration is formed within the well region 151 of the transistor T62 of the sense amplifier portion. At this stage, the channel dope layer 150 is also formed in the transistors T61 and T63 of the logic portion and the memory cell array portion. The channel dope layer 150 is formed by implanting boron ions, for instance, with the energy of 50 keV and at a dose of $1 \times 10^{12}/cm^2$.

Figure 39:
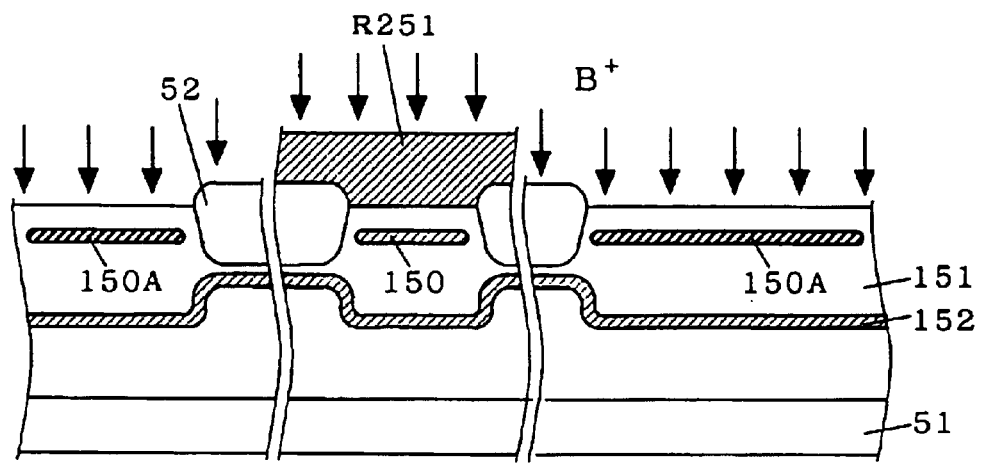

Next, at a step shown in FIG. 39, a resist mask R251 is formed on the sense amplifier portion. An impurity is additionally implanted in a selective fashion into the channel dope layer 150 of the logic portion and the memory cell array portion, thereby forming the channel dope layer 150A which has an impurity concentrations in accordance with the transistor T63 of the memory cell array portion. The channel dope layer 150A is formed by implanting boron ions, for instance, with the energy of 50 keV and at a dose of $4 \times 10^{12}/cm^2$.

Figure 40:
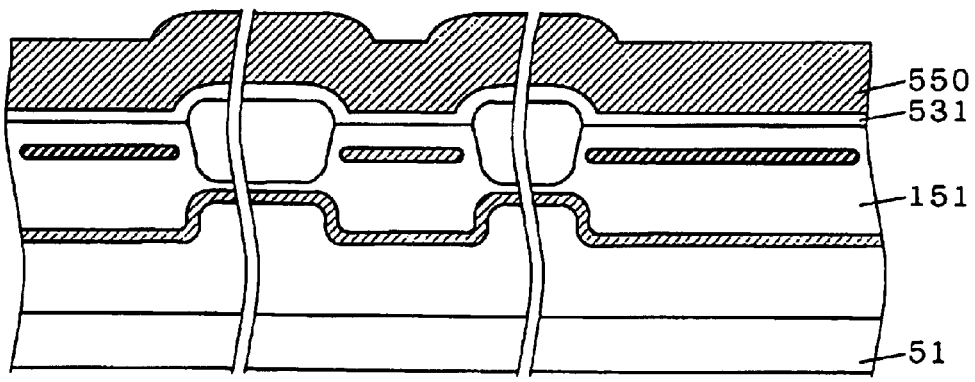

Next, at a step shown in FIG. 40, after forming an oxide film 531 which will become the gate oxide film 53 on the main surface of the semiconductor substrate 51 by a thermal oxide method, a (non-doped) polysilicon layer 550 is formed on the oxide film 531 as a gate electrode material by a CVD method. The oxide film 531 has a thickness of about 60 Å, whereas the polysilicon layer 550 has a thickness of about 2,000 Å.

Figure 41:
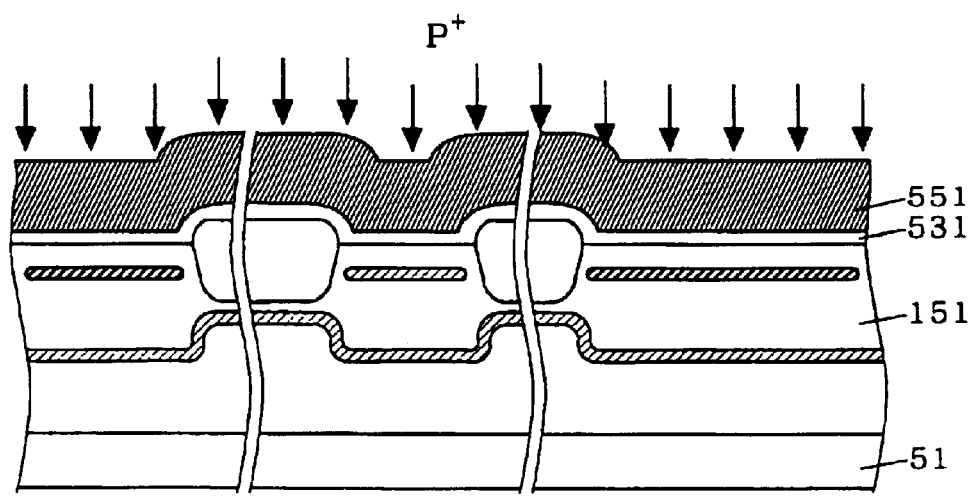

Next, at a step shown in FIG. 41, impurity ions are implanted into the polysilicon layer 550, thereby forming a doped polysilicon layer 551. The doped polysilicon layer 551 is formed by implanting phosphorus ions, for instance, with the energy of 30 keV and at a dose of $5 \times 10^{15}/cm^2$.

Figure 42:
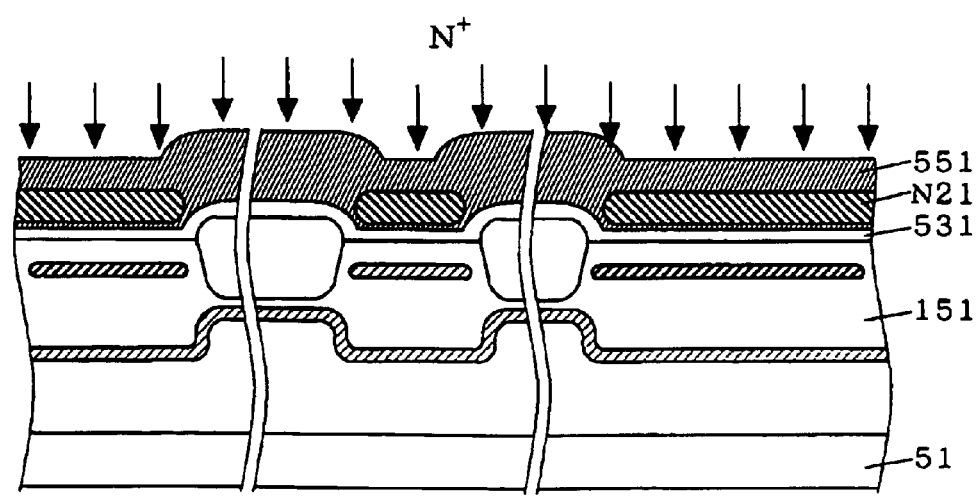

Next, at a step shown in FIG. 42, nitrogen ions are introduced into the doped polysilicon layer 551 in accordance with the N-channel MOS transistors T61 and T62 of the logic portion and the sense amplifier portion, each of which has a low impurity concentration in the gate electrode, thereby forming a nitrogen-introduced region N21. At this stage, the nitrogen-introduced region N21 is formed also in the doped polysilicon layer 551 on the memory cell array portion. The nitrogen-introduced region N21 is formed by implanting nitrogen ions with the energy of 10 keV and at a dose of $1 \times 10^{15}/cm^2$, for instance.

Figure 43:
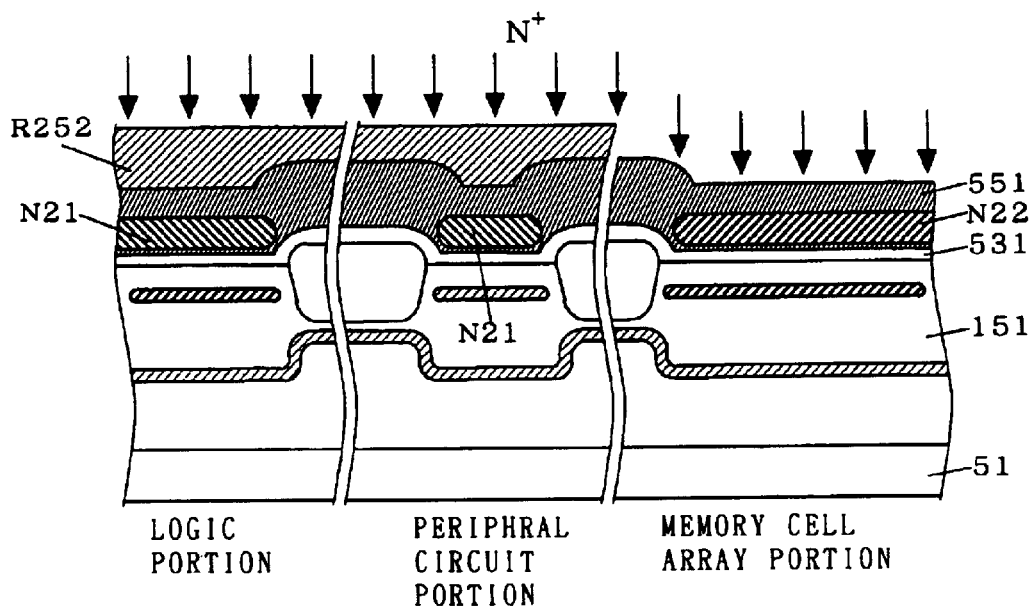

Next, at a step shown in FIG. 43, a resist mask R252 is formed on the logic portion and the sense amplifier portion. Nitrogen ions are additionally implanted in a selective fashion into the doped polysilicon layer 551 of the memory cell array portion, thereby forming a nitrogen-introduced region N22 which has a concentration which is in accordance with the N-channel MOS transistor T63 of the memory cell array portion. The nitrogen-introduced region N22 is formed by implanting nitrogen ions with the energy of 10 keV and at a dose of $4 \times 10^{15}/cm^2$, for instance.

Figure 44:
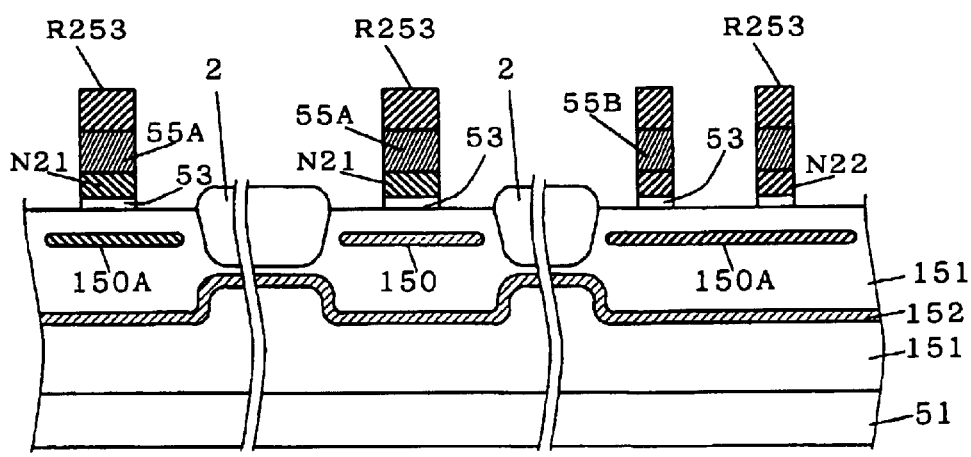

Next, at a step shown in FIG. 44, after removing the resist mask R252, a resist mask R253 is formed on the doped polysilicon layer 551 and patterned.

Following this, after forming the LDD layers 157 by implanting ions into the logic portion, the sense amplifier portion and the memory cell array portion, the side wall oxide film 56 of about 1,000 Å in thickness is formed on a side surface of the gate oxide film 53 and gate electrodes 55A, 55B. Using the side wall oxide film 56 as a mask, by ion implantation, the source/drain layers 156 are formed. In this manner, the structure of the LOGIC in DRAM 300 which is shown in FIG. 34 is obtained.

Now, the LDD layers 157 are obtained by implanting arsenic (As) ions, for instance, with the energy of 30 keV and at a dose of $1 \times 10^{13}/cm^2$. Meanwhile, the source/drain layers 156 are obtained by injecting arsenic ions, for instance, with the energy of 50 keV and at a dose of $5 \times 10^{15}/cm^2$ and thereafter annealing at 850° C. for 30 minutes.

Although this is followed by formation of a capacitor, an inter-layer insulation film, a wiring layer and the like to form the LOGIC in DRAM, this will not be described nor is shown in the drawings.

<3-3. Characteristic Function and Effect>

As described above, the LOGIC in DRAM 300 according to the third preferred embodiment of the present invention has such a structure in which the impurity concentrations of the gate electrodes and the nitrogen concentrations of the channel dope layers are changed among the plurality of types of transistors having different characteristics from each other (e.g., having different required specifications from each other) so that the effective thicknesses of the respective gate oxide films are changed and the threshold values are set.

That is, as shown in FIG. 35, in the memory cell array portion where the nitrogen concentration in the gate electrode is high, diffusion and activation of the impurity is suppressed, a depletion layer is created in a large area within the gate electrode, so that the oxide film thickness becomes effectively thicker and the threshold value is high.

Further, as shown in FIG. 36, in the sense amplifier portion, by ensuring a lower impurity concentration in the channel dope layer, it is possible to suppress a leakage current (i.e., diffusion layer leakage) from a diffusion layer as small as possible.

Thus, by setting the impurity concentrations of the channel dope layers at such values with which a diffusion layer leakage is as small as possible while setting the threshold values by means of the nitrogen concentrations of the gate electrodes, it is possible to break the trade-off relationship between the threshold values and the diffusion layer leakage and hence to eliminate a restriction imposed on circuit designing.

Further, although there are a number of crystal defects in the vicinity of the interface between the gate electrodes and the gate oxide film, as nitrogen is introduced into the gate electrodes, nitrogen atoms are combined with dangling bonds, one cause of creating crystal defects, so that the crystal defects are recovered. Hence, the reliability of the gate oxide film is improved.

Moreover, since the nitrogen-introduced regions N21 and N22 are formed in the vicinity of the interface with the gate oxide film 53 within the gate electrodes 55A and 55B, it is possible to suppress punch-through of the impurity which is implanted into the gate electrodes.

While the foregoing has described the structure in which various types of transistors are formed on a single crystal substrate as the third preferred embodiment of the present invention, it is possible to achieve similar function and effect in the case where various types of transistors are formed on an SOI (silicon on insulator) substrate.

<Fourth Preferred Embodiment>

<4-1. Structure of Device>

Figure 45:
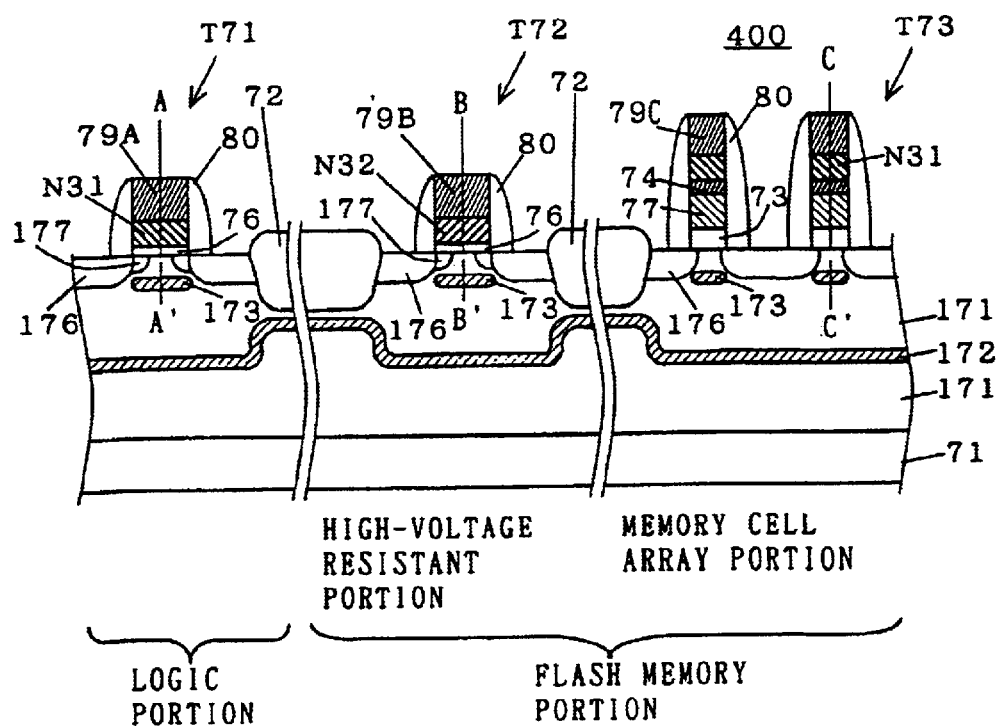
FIG. 45 is a cross sectional view showing a structure of a fourth preferred embodiment of the present invention.

FIG. 45 shows a partial structure of a flash memory which comprises a logic circuit (hereinafter "LOGIC in FLASH") 400, as a fourth preferred embodiment of the present invention.

In general, a LOGIC in FLASH is roughly divided into a logic portion and a flash memory portion. A requirement to the logic portion is an operation at a high speed, that is, a high driving capability and a low capacity.

Meanwhile, the flash memory portion includes a high-voltage resistant portion in which a high voltage is applied, a cell array portion in which a tunnel oxide film needs to be highly reliable, and the like. That is, a plurality of types of transistors which have different characteristics from each other are needed within a LOGIC in FLASH which is formed as one chip.

FIG. 45 shows cross sections of N-channel MOS transistors T71 to T73 which are used for the logic portion, the high-voltage resistant portion and the memory cell array portion.

In FIG. 45, the N-channel MOS transistors T71 to T73 are formed within a P-type well layer 171 which is formed on the same semiconductor substrate 71 (of the P-type). The well layer 171 is element-separated by a channel cut layer 171 which is formed within the well layer 171 and a LOCOS layer 72 in such a manner that the N-channel MOS transistors T71 to T73 are formed in regions which are created by element separation.

The N-channel MOS transistor T71 of the logic portion comprises a pair of source/drain layers 176 formed within the well layer 171 independently of each other but parallel to each other and a pair of LDD layers 177 formed adjacent to edge portions facing each other of the source/drain layers 176.

A gate oxide film 76 is formed on the LDD layers 177, and a gate electrode 79A is formed on the gate oxide film 76. A side wall oxide film 80 is formed on a side surface of the gate oxide film 76 and the gate electrode 79A. Within the well layer 171 under the gate electrode 79A, a channel dope layer 173 is formed.

A nitrogen-introduced region N31 is formed in the vicinity of the interface with the gate oxide film 76 within the gate electrode 79A.

The N-channel MOS transistor T72 of the high-voltage resistant portion of the flash memory portion comprises a pair of source/drain layers 176 formed within the well layer 171 independently of each other but parallel to each other and a pair of LDD layers 177.

A gate oxide film 76 is formed on the LDD layers 177, and a gate electrode 79B is formed on the gate oxide film 76. The side wall oxide film 81) is formed on a side surface of the gate oxide film 76 and the gate electrode 79B. Within the well layer 171 under the gate electrode 79B, a channel dope layer 173 is formed.

A nitrogen-introduced region N32 is formed in the vicinity of the interface with the gate oxide film 76 within the gate electrode 79B.

The N-channel MOS transistor T73 of the memory cell array portion of the flash memory portion comprises a pair of source/drain layers 176 formed within the well layer 171 independently of each other but parallel to each other. A tunnel oxide film 73 is formed on edge portions of the source/drain layers 176. A floating gate electrode 77, an inter-layer insulation film 74 and a control gate electrode 79C are formed in this order on the tunnel oxide film 73. Since the control gate electrode 79C has the same structure as gate electrodes, control gate electrode 79C will be treated as a gate electrode in the following.

In the control gate electrode 79C, the nitrogen-introduced region N31 is formed in the vicinity of the interface with the inter-layer insulation film 74.

The side wall oxide film 80 is formed on a side surface of the tunnel oxide film 73, the floating gate electrode 77, the inter-layer insulation film 74 and the control gate electrode 79C.

Within the well layer 171 under the floating electrode 77, a channel dope layer 173 is formed. The memory cell array portion has a gate array structure in which adjacent gates share one source/drain layer 176. Such structures are arranged successively.

Table 8 shows figures regarding the structures of the N-channel MOS transistors T71 to T73.

TABLE 8

| | LOGIC PORTION (T71) | | | SENSE AMPLIFIER PORTION (T72) | | | MEMORY CELL ARRAY PORTION (T73) | | |
|---|---|---|---|---|---|---|---|---|---|
| FIELD OXIDE FILM THICKNESS | 4000 Å | | | 4000 Å | | | 4000 Å | | |
| GATE OXIDE FILM THICKNESS | 50 Å | | | 50 Å | | | 100 Å | | |
| FLOATING GATE ELECTRODE FILM THICKNESS | — | | | — | | | 1000 Å | | |
| FLOATING GATE IMPURITY CONCENTRATION | — | | | — | | | $1 \times 10^{20}/cm^3$ | | |
| INTER-LAYER INSULATION FILM THICKNESS | — | | | — | | | $TEOS/Si_3N_4/TEOS = 100/100/100$ Å | | |
| CONTROL GATE ELECTRODE FILM THICKNESS | 2000 Å | | | 2000 Å | | | 2000 Å | | |
| SIDE WALL | 1000 Å | | | 1000 Å | | | 1000 Å | | |
| WELL | B | 700 keV | $1 \times 10^{13}/cm^2$ | B | 700 keV | $1 \times 10^{13}/cm^2$ | B | 700 keV | $1 \times 10^{13}/cm^2$ |
| CHANNEL CUT | B | 130 keV | $5 \times 10^{12}/cm^2$ | B | 130 keV | $5 \times 10^{12}/cm^2$ | B | 130 keV | $5 \times 10^{12}/cm^2$ |
| CHANNEL DOPE | B | 50 keV | $5 \times 10^{12}/cm^2$ | B | 50 keV | $5 \times 10^{12}/cm^2$ | B | 50 keV | $5 \times 10^{12}/cm^2$ |

TABLE 8-continued

|  | LOGIC PORTION (T71) | | | SENSE AMPLIFIER PORTION (T72) | | | MEMORY CELL ARRAY PORTION (T73) | | |
| --- | --- | --- | --- | --- | --- | --- | --- | --- | --- |
| LDD | As | 30 keV | $1 \times 10^{13}/cm^2$ | As | 30 keV | $1 \times 10^{13}/cm^2$ | | | — |
| SOURCE/DRAIN | As | 50 keV | $5 \times 10^{15}/cm^2$ | As | 50 keV | $5 \times 10^{15}/cm^2$ | As | 50 keV | $5 \times 10^{15}/cm^2$ |
| GATE IMPLANTATION | P | 30 keV | $5 \times 10^{15}/cm^2$ | P | 30 keV | $5 \times 10^{15}/cm^2$ | P | 30 keV | $5 \times 10^{15}/cm^2$ |
| | N | 10 keV | $1 \times 10^{15}/cm^2$ | N | 10 keV | $1 \times 10^{16}/cm^2$ | N | 10 keV | $1 \times 10^{15}/cm^2$ |
| HEATING | | | | | 850° C. 30 min | | | | |

In Table 8, the thicknesses of the gate oxide films of the N-channel MOS transistors T71, T72 and T73 are 50 Å, 50 Å and 100 Å, respectively.

Moreover, impurity doses for forming the channel dope layers of the N-channel MOS transistors 171 to 173 are equally $5 \times 10^{12}/cm^2$. Boron (B) is implanted as an impurity for either layers with the implantation energy of 50 KeV.

Further, impurity doses for forming the gate electrodes of the N-channel MOS transistors T71 to T73 are equally $5 \times 10^{15}/cm^2$. Phosphorus (P) is implanted as an impurity for either layers with the implantation energy of equally 30 KeV.

Still further, nitrogen doses are $1 \times 10^{15}/cm^2$, $1 \times 10^{16}/cm^2$ and $1 \times 10^{15}/cm^2$, respectively. The implantation energy is equally 10 keV.

Figure 46:
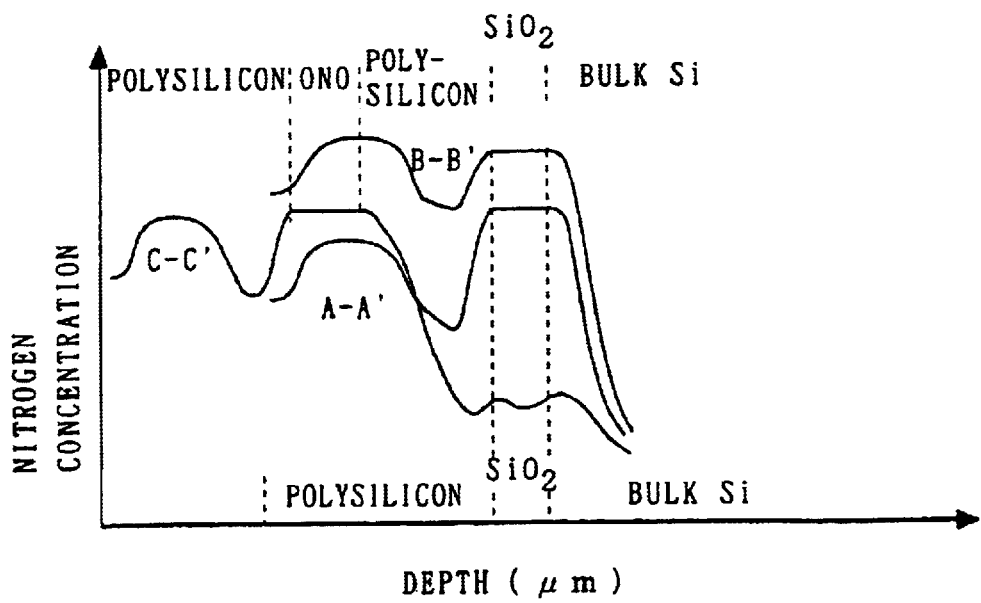
FIG. 46 is a diagram for describing a nitrogen distribution according to the fourth preferred embodiment of the present invention.
Figure 47:
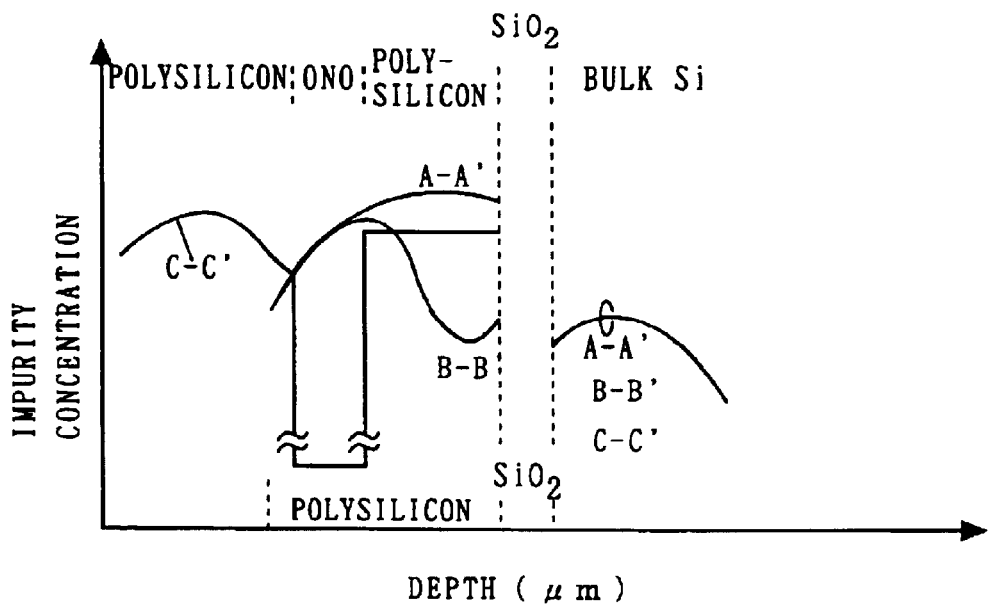
FIG. 47 is a diagram for describing an impurity distribution according to the fourth preferred embodiment of the present invention.

FIGS. 46 and 47 show nitrogen profiles and impurity profiles of the N-channel MOS transistors T71, T72 and T73 forming the logic portion, the high-voltage resistant portion and the memory cell array portion, all of which shown in FIG. 45, taken at cross sectional portions along line A–A', line B–B' and line C–C', respectively.

In FIGS. 46 and 47, a position (i.e., depth) in a cross sectional direction is shown along a horizontal axis, and a nitrogen concentration and an impurity concentration are shown along a vertical axis. The order in which the structure of the N-channel MOS transistor T73 of the memory cell array portion is fabricated is illustrated in upper portions of FIGS. 46 and 47. The upper portions of FIGS. 46 and 47 show the control gate electrode (polysilicon layer), the inter-layer insulation film (ONO film), the floating gate electrode (polysilicon layer), the tunnel oxide film ($SiO_2$ layer) and the well layer (bulk silicon layer) in this order from the left-hand side.

Further, FIGS. 46 and 47 show the gate electrode (polysilicon layer), the gate oxide film ($SiO_2$ layer) and the well layer (bulk silicon layer) in this order along the horizontal axis.

As shown in Table 8, the nitrogen dose is the highest for the gate electrode 79B of the N-channel MOS transistor T72 of the high-voltage resistant portion which is expected to have the highest threshold value, while the nitrogen doses are the same for the gate electrode 29A of the N-channel MOS transistor T71 of the logic portion and the control gate electrode 79C of the N-channel MOS transistor T73 of the memory cell array portion.

As a result, as indicated at the B–B' line in FIG. 46, the transistor T72 of the high-voltage resistant portion has the highest nitrogen concentration, and the nitrogen concentrations of the transistor T72 of the logic portion (A–A' line) and the transistor T73 of the memory cell array portion (C–C' line) are the same and lower than that of the transistor T72.

Further, nitrogen is present in the gate oxide film and the inter-layer insulation film, and a relationship regarding the concentrations is maintained. The profile is such that nitrogen does not almost exist in a portion in the well layer other than in the vicinity of the interface with the gate oxide film.

Moreover, as shown in FIG. 47, with respective to the impurity profiles of the gate electrodes, the transistor T72 of the high-voltage resistant portion has the profile which changes most abruptly as indicated at the B–B' line, and the transistor T71 of the logic portion and the transistor T73 of the memory cell array portion have profiles which change moderately as indicated at the A–A' line and the C–C' line, respectively. This is because diffusion and activation of an impurity is suppressed more in a gate electrode in which a larger amount of nitrogen is introduced.

Hence, in the transistor T72 of the high-voltage resistant portion, the depletion layer is the largest so that the effective thickness of the oxide film is the thickest and the high-voltage resistant portion can withstand a high voltage.

Figure 48:
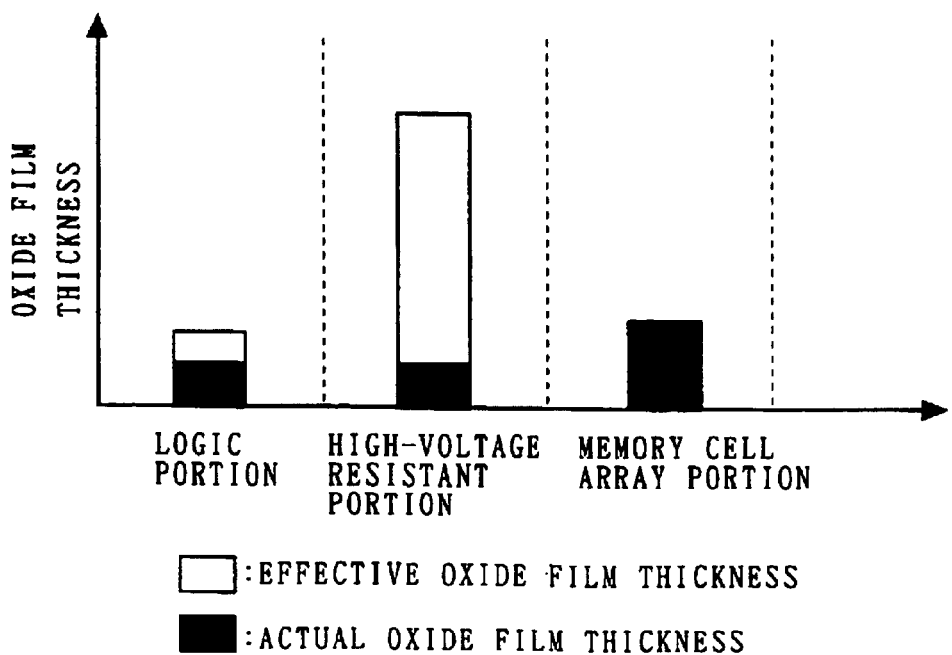
FIG. 48 is a diagram for describing a thickness of a gate oxide film in the fourth preferred embodiment of the present invention.

FIG. 48 shows actual thicknesses and effective thicknesses of the respective gate oxide films. FIG. 48 shows the N-channel MOS transistors of the logic portion, the high-voltage resistant portion and the memory cell array portion in this order from the left-hand side along the horizontal axis. In the memory cell array portion, the tunnel gate oxide film is treated as a gate oxide film. As clearly shown in FIG. 48, among the effective thicknesses of the respective gate oxide films, the effective thickness is particularly thick in the high-voltage resistant portion.

Further, as shown in FIG. 47, in any one of the transistors of the logic portion (A–A' line), the high-voltage resistant portion (B–B' line) and the memory cell array portion (C–C' line), the impurity concentration of the channel dope layer stays the same.

Since the floating gate electrode of the N-channel MOS transistor T73 of the memory cell array portion is formed by a CVD method, the impurity concentration remains constant.

<4-2. Manufacturing Method>

In the following, a description will be given on a method of manufacturing the N-channel MOS transistors 171, T72 and T73 of the logic portion, and of the high-voltage resistant portion and the memory cell array portion of the flash memory portion, all of which shown in FIG. 45, with reference to FIGS. 49 to 62.

Figure 49:
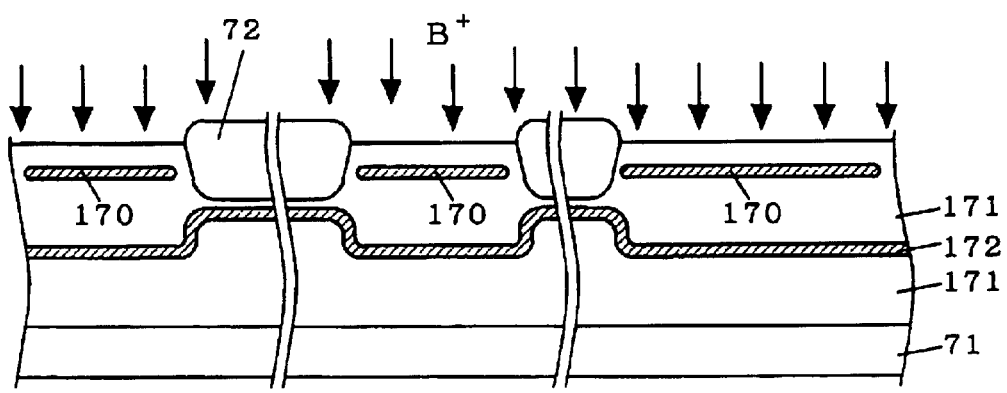
FIGS. 49 to 62 are diagrams showing manufacturing steps according to the fourth preferred embodiment of the present invention.

First, at a step shown in FIG. 49, a LOCOS layer (i.e., field oxide film) 72 is formed into a thickness of 4,000 Å, for instance, by a LOCOS method on a surface of the semiconductor substrate 71 of the P-type. Following this, boron ions, for instance, are implanted with the energy of 700 keV and at a dose of $1 \times 10^{13}/cm^2$, thereby forming a P-type well region 171 within the semiconductor substrate 71. Although an N-type well region as well is formed in the semiconductor substrate 71 in order to form P-channel MOS transistors, this is not shown and a description will be omitted. Next, boron ions, for example, are implanted with the energy of 130 keV and at a dose of $5 \times 10^{121}$ $cm^2$, thereby forming the channel cut layer 172 within the semiconductor substrate 71. The channel cut layer 172 is formed in such a shape which together with the LOCOS layer 72 creates the element-separated regions.

Next, at a predetermined position in the high-voltage resistant portion, the peripheral circuit portion and the memory cell array portion within the well region 171, a channel dope layer 170. The channel dope layer 170 is formed by implanting boron ions, for instance, with the energy of 50 keV and at a dose of $5 \times 10^{12}/cm^2$.

Figure 50:
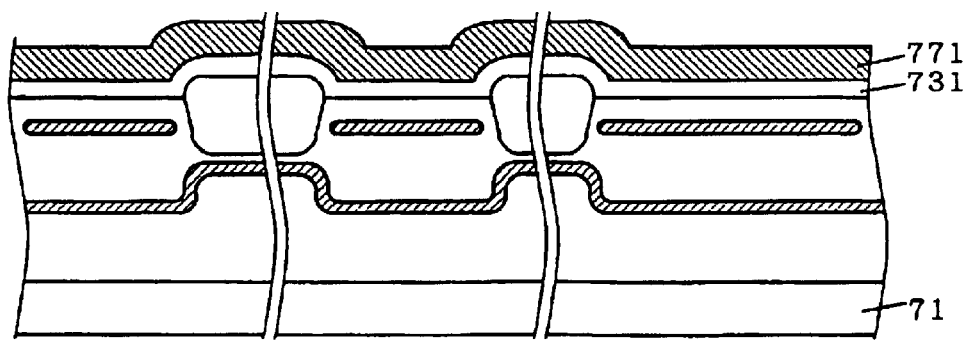

Next, at a step shown in FIG. 50, after forming an oxide film 731 which will become the tunnel oxide film 73 on a main surface of the semiconductor substrate 71 by a thermal oxide method, a doped polysilicon layer 771, for instance, is formed as a gate electrode material on the oxide film 731 by a CVD method. The oxide film 731 has a thickness of about 100 Å, whereas the doped polysilicon layer 771 has a thickness of about 1,000 Å. Phosphorus (P) is used as an impurity. The concentration of the impurity is about $1 \times 10^{20}/cm^3$.

Figure 51:
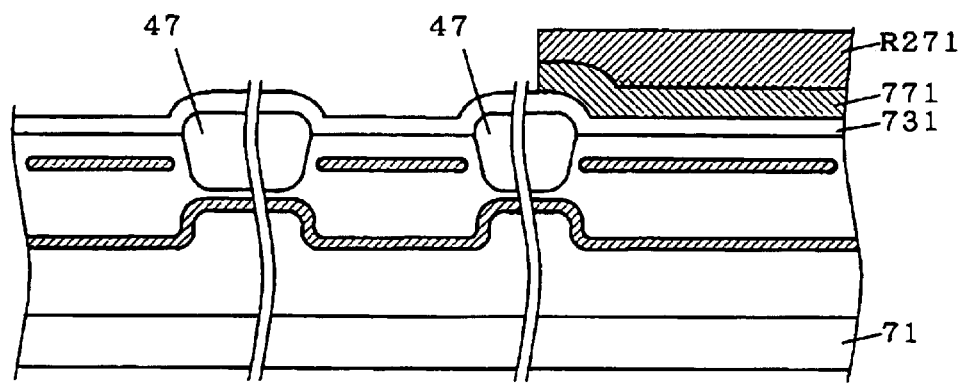
Figure 52:
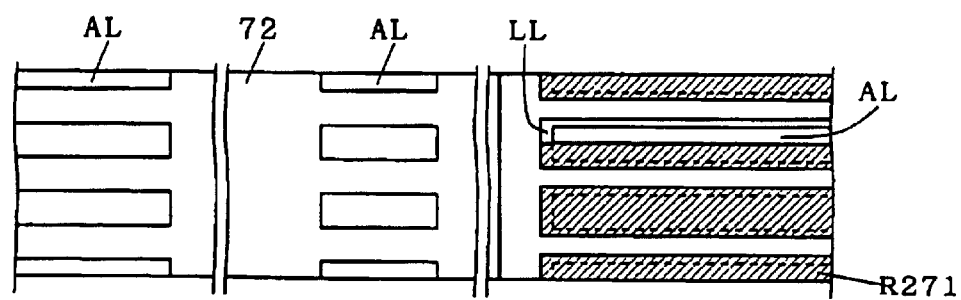

Next, at a step shown in FIG. 51, a resist mask R271 is formed selectively on the doped polysilicon layer 771 within the memory cell array portion. In this case, the resist mask R271 is formed along the gate-width direction of the memory cell array portion. A portion of the doped polysilicon layer 771 which is not covered with the resist mask R271 is removed by anisotropic etching. FIG. 52 shows this condition.

FIG. 52 is a plan view viewing FIG. 51 from the upper surface side (i.e., the side on which the resist mask R271 is formed). Within the memory cell array portion, the resist mask R271 is formed as rectangular islands which are arranged regularly. The resist mask R271 is formed to cover an active layer AL which has a configuration like a rectangular island and an LOCOS layer LL around the same. Within the high-voltage resistant portion and the logic portion, since the resist mask is not formed, the active layer AL is exposed.

Although FIG. 52 partially omits the resist mask R271 so that the active layer AL and the LOCOS layer LL are visible, this is only for the clarity of illustration of the structure below the resist mask R271 and merely for the convenience of illustration.

Figure 53:
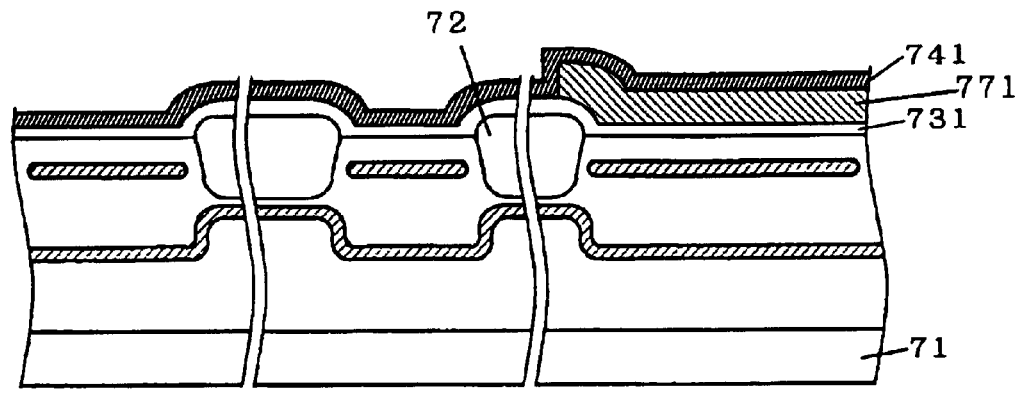

Next, after removing the resist mask R271, at a step shown in FIG. 53, an insulation film 741, which will become the inter-layer insulation film 74 which insulates the floating gate from the control gate, is formed on the doped polysilicon layer 771 by a CVD method. This film has a structure in which a TEOS (tetraethyl orthosilicate) film, a nitride film ($Si_3N_4$) film, a TEOS film each having a thickness of 100 Å are stacked in this order. The insulation film 741 is formed on the high-voltage resistant portion and the logic portion as well.

Figure 54:
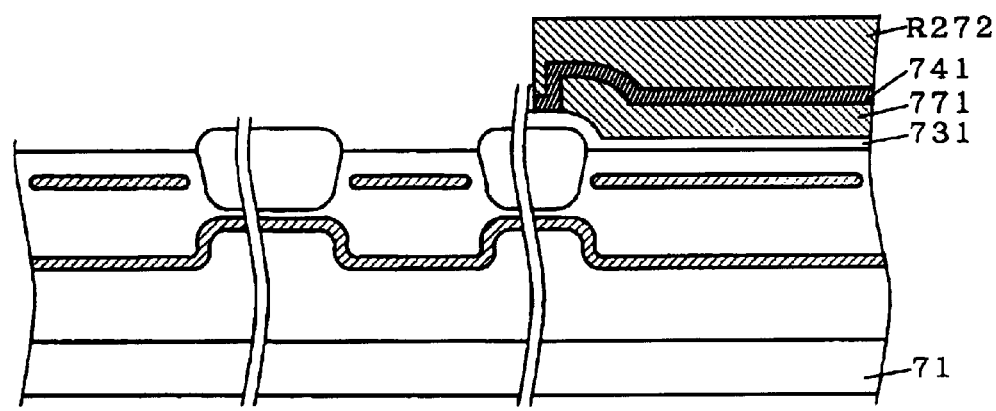
Figure 55:
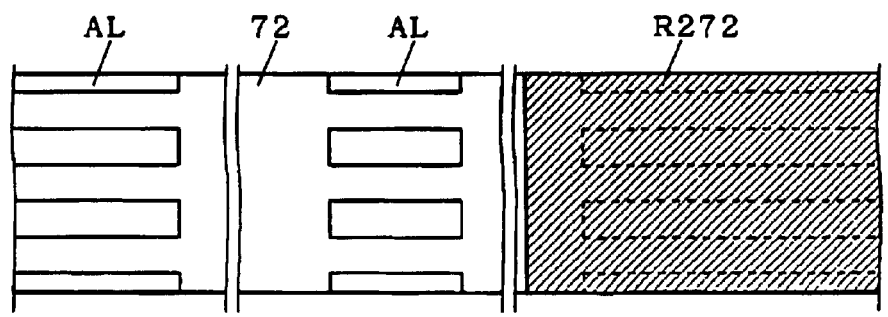

Next, at a step shown in FIG. 54, a resist mask R272 is formed on the insulation film 741 of the memory cell array portion, and the insulation film 741 in all other regions is removed. In this case, in the other regions, the oxide film 731 is removed as well. FIG. 55 shows this condition.

FIG. 55 is a plan view viewing FIG. 54 from the upper surface side (i.e., the side on which the resist mask R272 is formed). The resist mask R272 is formed to entirely cover the memory cell array portion. However, within the high-voltage resistant portion and the logic portion, since the resist mask R272 is not formed, the active layer AL is exposed.

Figure 56:
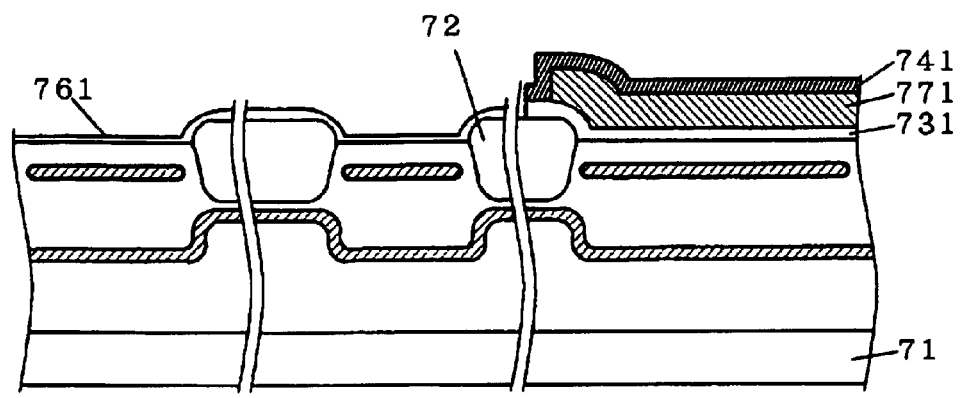

Next, after removing the resist mask R272, at a step shown in FIG. 56, an oxide film 761 which will become the gate oxide film 76 is formed entirely on the main surface of the semiconductor substrate 71 by a thermal oxide method. At this stage, since the insulation film 741 on the memory cell array portion includes the nitride film, the insulation film 741 is not oxidized and the thickness of the insulation film 741 is maintained. The thickness of the oxide film 761 is about 50 Å.

Figure 57:
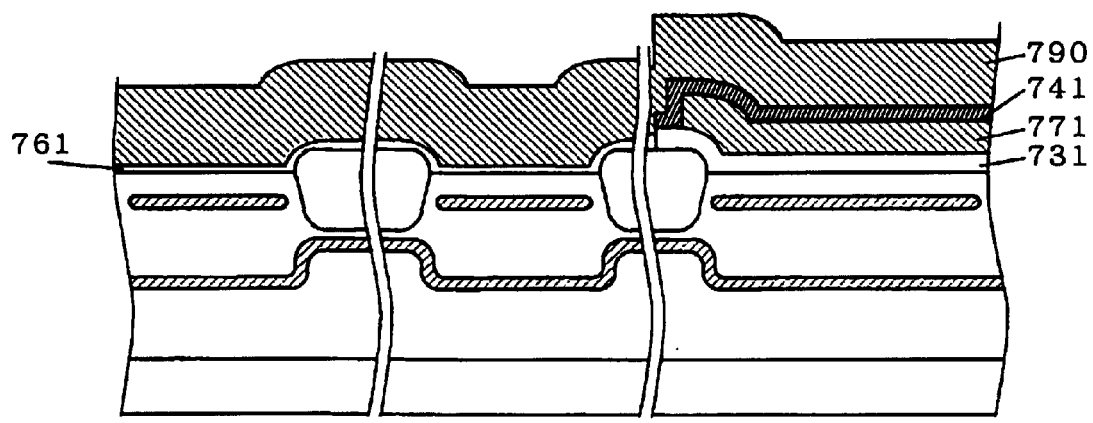

Next, at a step shown in FIG. 57, a (non-doped) polysilicon layer 790 is formed entirely on a main surface of the semiconductor substrate 71 as a gate electrode material by a CVD method. The polysilicon layer 790 has a thickness of about 2,000 Å.

Figure 58:
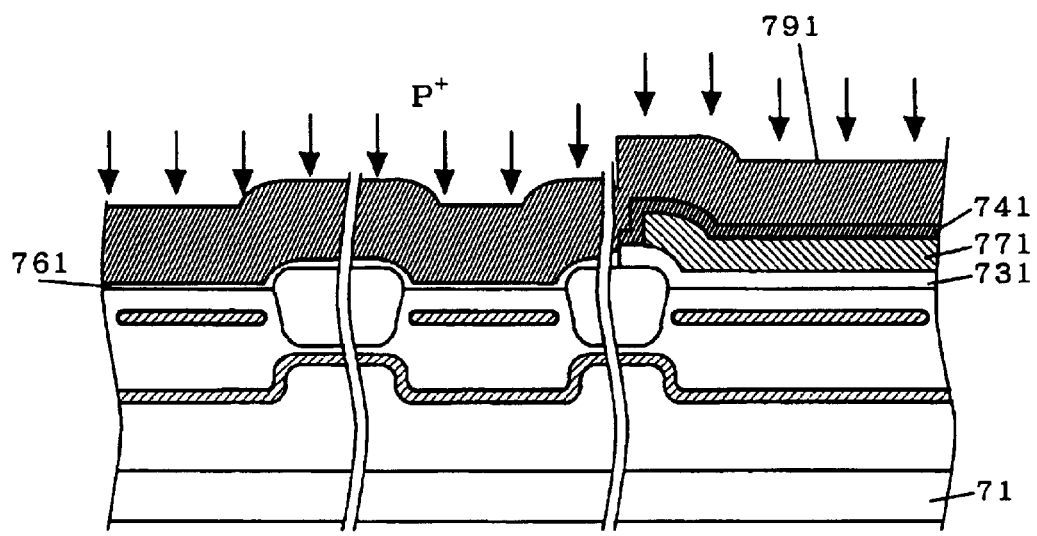

Next, at a step shown in FIG. 58, impurity ions are implanted into the polysilicon layer 790, thereby forming a doped polysilicon layer 791. At this stage, the doped polysilicon layer 791 is formed by implanting phosphorus ions, for instance, with the energy of 30 keV and at a dose of $5 \times 10^{15}/cm^2$.

Figure 59:
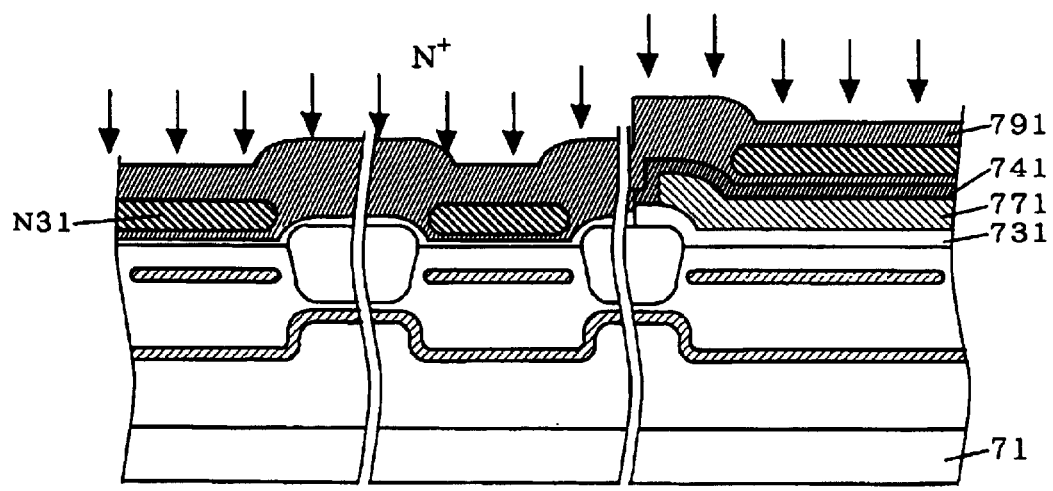

Next, at a step shown in FIG. 59, nitrogen ions are introduced into the doped polysilicon layer 791 in accordance with the N-channel MOS transistors T71 and T73 of the logic portion and the memory cell array portion, each of which has a low impurity concentration in the gate electrode, thereby forming a nitrogen-introduced region N31. At this stage, the nitrogen-introduced region N31 is formed also in the doped polysilicon layer 791 on the high-voltage resistant portion. The nitrogen-introduced region N31 is formed by implanting nitrogen ions with the energy of 10 keV and at a dose of $1 \times 10^{15}/cm^2$, for instance.

Figure 60:
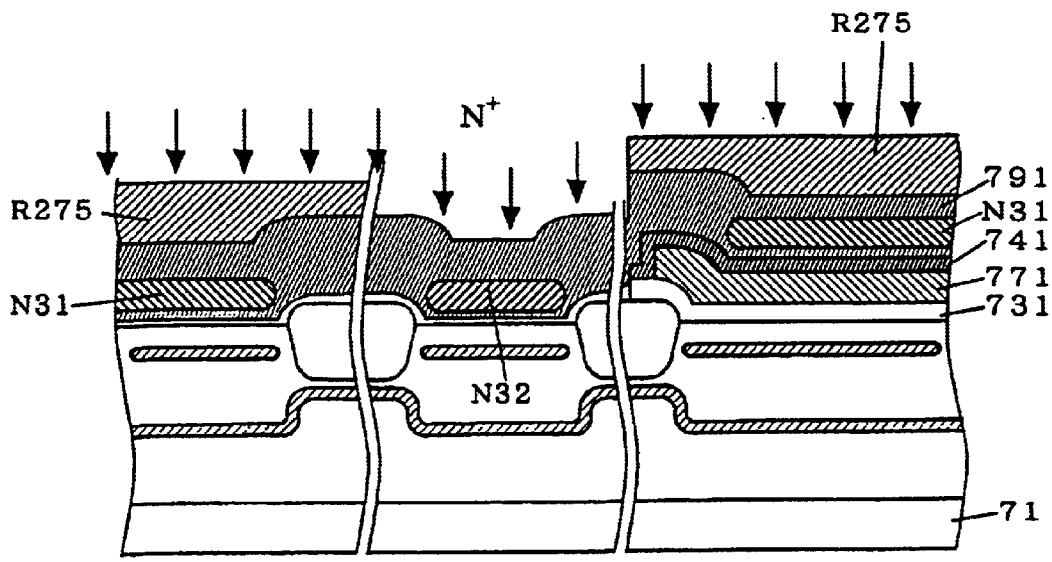

Next, at a step shown in FIG. 60, a resist mask R275 is formed on the logic portion and the memory cell array portion. Nitrogen ions are additionally implanted in a selective fashion into the doped polysilicon layer 791 of the high-voltage resistant portion, thereby forming a nitrogen-introduced region N32 which has a concentration which is in accordance with the N-channel MOS transistor T72 of the high-voltage resistant portion. The nitrogen-introduced region N32 is formed by implanting nitrogen ions with the energy of 10 keV and at a dose of $9 \times 10^{15}/cm^2$, for instance.

Figure 61:
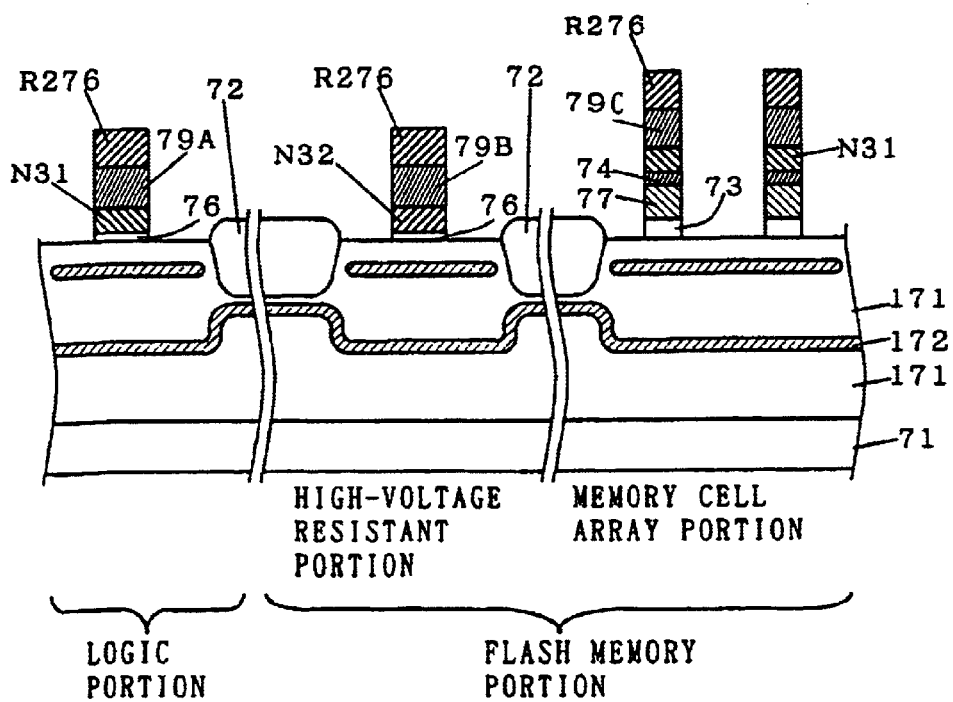
Figure 62:
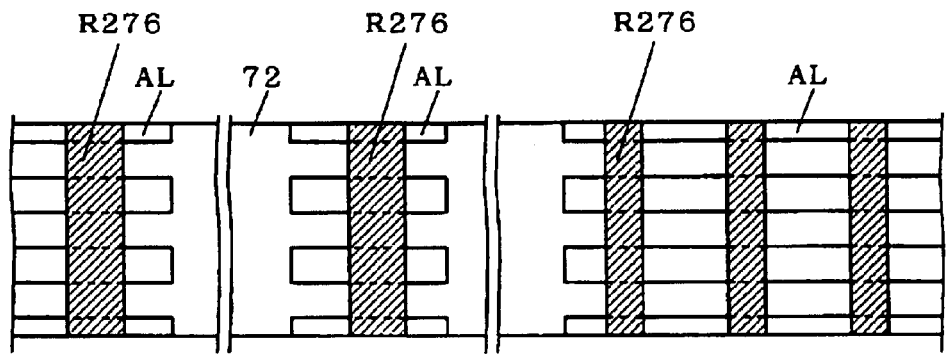

Next, after removing the resist mask R275, at a step shown in FIG. 61, a resist mask R276 is formed on the doped polysilicon layer 791 and patterned. FIG. 62 shows this condition.

FIG. 62 is a plan view viewing FIG. 61 from the upper surface side (i.e., the side on which the resist mask R276 is formed). The resist mask R276) is formed to be perpendicular to the active layer AL which has a rectangular configuration.

As a result of patterning, the gate oxide film 76 and gate electrode 79A are formed within the logic portion, the gate oxide film 76 and gate electrode 79B are formed within the high-voltage resistant portion, and the tunnel oxide film 73, the floating gate electrode 77, the inter-layer insulation film 74 and the control gate electrode 79C are formed within the memory cell array portion.

Following this, after forming the LDD layers 177 by implanting ions into the logic portion and the high-voltage resistant portion, the side wall oxide film 80 of about 1,000 Å in thickness is formed on a side surface of the gate oxide film 76 and gate electrode 79A, on a side surface of the gate oxide film 76 and gate electrode 79B, and on a side surface of the tunnel oxide film 73, the floating gate electrode 77, the inter-layer insulation film 74 and the control gate electrode 79C. Using the side wall oxide film 80 as a mask, by ion implantation, the source/drain layers 176 are formed. In this manner, the structure of the flash memory which is shown in FIG. 45 is obtained.

Now, the LDD layers 177 are obtained by implanting arsenic ions, for instance, with the energy of 30 keV and at a dose of $1 \times 10^{13}/cm^2$. Meanwhile, the source/drain layers 176 are obtained by injecting arsenic ions, for instance, with the energy of 50 keV and at a dose of $5\times10^{15}/cm^2$ and thereafter annealing at 850° C. for 30 minutes.

Although this is followed by formation of a capacitor, an inter-layer insulation film, a wiring layer and the like to form the LOGIC in FLASH, this will not be described nor is shown in the drawings.

<4-3. Characteristic Function and Effect>

As described above, the LOGIC in FLASH 400 according to the fourth preferred embodiment of the present invention has such a structure in which the nitrogen concentrations of the gate electrodes are changed among the plurality of types of transistors having different characteristics from each other (e.g., having different required specifications from each other) so that the effective thicknesses of the respective gate oxide films are changed and hence the threshold values are set.

That is, as shown in FIG. 46, in the high-voltage resistant portion where the nitrogen concentration in the gate electrode is the highest, diffusion and activation of the impurity is suppressed, a depletion layer is created in a large area within the gate electrode, so that the oxide film thickness becomes effectively thicker and the threshold value is high.

Further, since it is possible to set the threshold values by changing the effective thicknesses of the gate oxide films, it is not necessary to change the impurity concentrations of the channel dope layers in accordance with the characteristics of the transistors, and therefore, it is possible to fix the concentrations at such values with which a leakage current (i.e., diffusion layer leakage) from a diffusion layer can be suppressed as small as possible.

Hence, by setting the impurity concentrations of the channel dope layers at such values with which a diffusion layer leakage is as small as possible while adjusting the breakdown voltage characteristics and the threshold values by means of the nitrogen concentrations of the gate electrodes, it is possible to satisfy the requirements regarding the breakdown voltages, to break the trade-off relationship between the threshold values and the diffusion layer leakage, and hence, to eliminate a restriction imposed on circuit designing.

Still further, in the case of forming gate oxide films having different thicknesses from each other as well, by changing the effective thicknesses of the gate oxide films, it is possible to reduce the types of the gate oxide films. This makes it possible to simplify the manufacturing steps of manufacturing the gate oxide films and to obtain gate oxide films which are excellent in reliability and controllability of controlling film thickness.

That is, in the structure shown in FIG. 45, since the thicknesses of the gate oxide films of the transistors of the logic portion and the high-voltage resistant portion are the same with each other, there two types of the gate oxide films. Further, with respect to the steps for forming the oxide films, there are only the step for forming the oxide film 731 (See FIG. 50) and the step for forming the oxide film 761 (See FIG. 56). Since the oxide films are formed by carrying out thermal oxidation once at either steps, unlike in the conventional manufacturing method described with reference to FIGS. 114 to 127, it is not necessary to form one oxide film at more than one stage and there is no concern that an impurity may be mixed in or the controllability of controlling film thickness may deteriorate.

Further, although there are a number of crystal defects in the vicinity of the interface between the gate electrodes and the gate oxide film, as nitrogen is introduced into the gate electrodes, nitrogen atoms are combined with dangling bonds, one cause of creating crystal defects, so that the crystal defects are recovered. Hence, the reliability of the gate oxide film is improved.

Moreover, since the nitrogen-introduced regions N31 and N32 are formed in the vicinity of the interface with the gate oxide film 76 within the gate electrodes 79A and 79B, and since the nitrogen-introduced region N32 is formed in the vicinity of the interface with the inter-layer insulation film 24 within the control gate electrode 79C, it is possible to suppress punch-through of the impurity which is implanted into the gate electrodes.

While the foregoing has described the structure in which various types of transistors are formed on a single crystal substrate as the fourth preferred embodiment of the present invention, it is possible to achieve similar function and effect in the case where various types of transistors are formed on an SOI (silicon on insulator) substrate.

<Examples of Other Applications of the Invention>

While the foregoing has described the first to the fourth preferred embodiments of the present invention in relation to examples of a DRAM, a flash memory, a LOGIC in DRAM, and a LOGIC in FLASH, applications of the technical idea of the present invention are not limited to these semiconductor devices. In short, since it is possible to change the effective thicknesses of the gate oxide films to optionally set the threshold values by adjusting the nitrogen concentrations of the impurity layers within the control electrodes and therefore by optionally setting the thicknesses of the depletion layers within the control electrodes, when the present invention is applied to a case where the thicknesses of the gate oxide films are common but the effective thicknesses of the gate oxide films need to be changed in the transistors in the respective portions which are formed on the single common substrate or to a case where the concentrations in the channel dope layers need to be the same with each other but the thicknesses of the gate oxide films may be different from each other, it is possible to achieve a desired effect.

Further, although the first to the fourth preferred embodiments are related to an example in which transistors having different characteristics from each other are used in the three portions which are formed on the single common substrate, this does not means that only one type of transistor can be used in each one of the three portions. For instance, in the case of a LOGIC in DRAM, two or more types of transistors may be used in the logic portion and two or more types of transistors may be used in the sense amplifier portion as well. Alternatively, it is allowable to use two types of transistors in the logic portion while using one type of transistor in the memory cell array portion.

In addition, the present invention is effective even to a semiconductor device in which device structures cannot be clearly distinguished from each other, such as a logic portion, a high-voltage resistant portion, a sense amplifier portion and a memory cell array portion, if a structure of the semiconductor device requires a plurality of types of transistors which have different characteristics from each other.

Further, the types of transistors do not have to be three types. The structure may use transistors of three or more types of characteristics, or transistors of two types of characteristics.

In such various structures as well, by adjusting the nitrogen concentrations of the impurity layers within the control electrodes and by appropriately selecting the thicknesses of the gate oxide films and the concentrations in the channel dope layers, it is possible to achieve a desired effect.

Still further, even in the case of a semiconductor device which includes only one type of transistors, the present invention is effective to a case where threshold values are to be set optionally by changing the effective thicknesses of the gate oxide films.

<Fifth Preferred Embodiment>

While the foregoing has described the first to the fourth preferred embodiments of the present invention in relation to examples where in the sense amplifier portion, the peripheral circuit portion, the memory cell array portion and the high-voltage resistant portion of a DRAM, a flash memory, a LOGIC in DRAM, and a LOGIC in FLASH, nitrogen is introduced into the gate electrodes of the MOS transistors which form those portions, use of the depletion layers which are created as a result of introduction of nitrogen into the gate electrodes is not limited in the portions described above.

In other words, the present invention is effective to a semiconductor device in which a plurality of types of transistors need to be formed within one chip. In the following, a fifth preferred embodiment of the present invention will be described.

Figure 63:
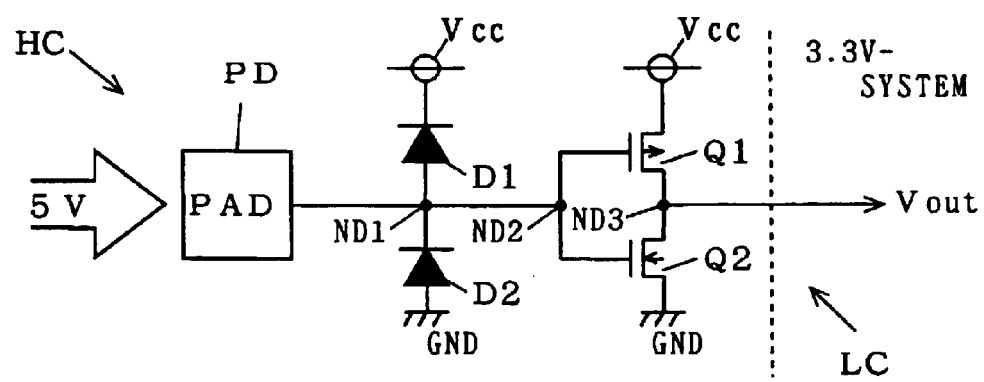
FIG. 63 is a circuitry diagram for describing a fifth preferred embodiment of the present invention.

FIG. 63 shows a regular stepdown circuit. The stepdown circuit is a circuit for stepping down a 5V-signal to 3.3V and outputting a resultant signal, and comprises a PMOS transistor Q1 and an NMOS transistor Q2 which are connected in series between a power source potential Vcc and a ground potential GND, diodes D1 and D2 which are connected in series between the power source potential Vcc and the ground potential GND, and an input pad ND which is connected to a connection point ND1 between the diodes D1 and D2. A cathode of the diode D1 is connected to the power source potential Vcc, an anode of the diode D1 is connected to a cathode of the diode D2, and an anode of the diode D2 is connected to the ground potential GND. The connection point ND1 is connected to a connection point ND2 which is connected in common to gate electrodes of the PMOS transistor Q1 and the NMOS transistor Q2, while an connection point ND3 between the PMOS transistor Q1 and the NMOS transistor Q2 is connected to a circuit system (hereinafter "3.3V-system circuit") LC.

In the stepdown circuit having such a structure, to the gate electrodes of the PMOS transistor Q1 and the NMOS transistor Q2, the 5V-signal from the input pad ND is supplied (hereinafter "5V-system circuit HC"). On the other hand, to gate electrodes of MOS transistors which form the 3.3V-system circuit LC, 3.3V which is an output from the 5V-system circuit HC is supplied.

In this manner, in the circuit systems in which different voltages are applied to the gate electrodes, the thicknesses of the gate oxide films of the MOS transistors which form the circuit systems have to be different from each other. This is because if the thicknesses of the gate oxide films of the MOS transistors of the 5V-system circuit HC are made the same as those of the gate oxide films of the MOS transistors of the 3.3V-system circuit LC, a problem regarding an insulating capability is created. Conversely, if the thicknesses of the gate oxide films of the MOS transistors of the 3.3V-system circuit LC are made the same as those of the gate oxide films of the MOS transistors of the 5V-system circuit HC, operation speeds of the MOS transistors of the 3.3V-system circuit LC become slow, and therefore, a problem in terms of an operation characteristic is created.

To deal with this, MOS transistors in which gate oxide films having different thicknesses from each other are customarily used. This requires a step for forming the gate oxide films which have different thicknesses from each other, which makes manufacturing steps complex.

However, according to the present invention, it is not necessary to change the thicknesses of the gate oxide films between the 5V-system circuit HC and the 3.3V-system circuit LC, and therefore, the manufacturing steps are simplified.

<5-1. Structure of Device>

Figure 64:
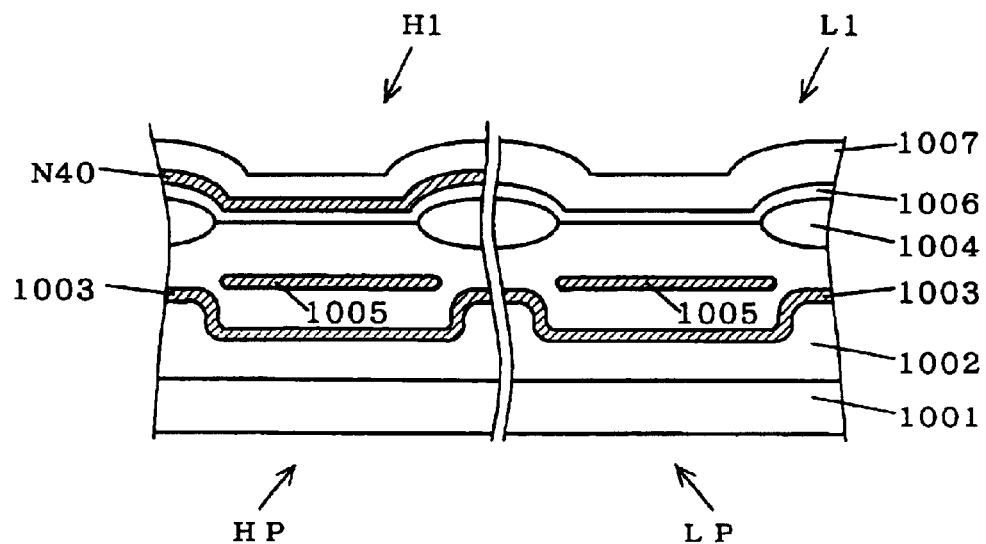
FIG. 64 is a diagram showing a structure of the fifth preferred embodiment of the present invention.

FIG. 64 shows a manufacturing step for manufacturing a high-voltage circuit portion HP, which is formed by a MOS transistor H1 in which a relatively high voltage is applied to a gate electrode, and for manufacturing a low voltage circuit portion LP, which is formed by a MOS transistor L1 in which a relatively low voltage is applied to a gate electrode, as the fifth preferred embodiment of the present invention.

In FIG. 64, MOS transistors H1 and L1 are formed within a well layer 1002 which is formed on the same semiconductor substrate 1001. The well layer 1002 is element-separated by a channel cut layer 1003 which is formed within the well layer 1002 and a LOCOS layer 1004. A channel dope layer 1005 is formed in regions which are element-separated by the channel cut layer 1003 and the LOCOS layer 1004.

An oxide film 1006 is formed on a main surface of the semiconductor substrate 1001, and a polysilicon layer 1007 is formed on the oxide film 1006. An impurity is introduced into the polysilicon layer 1007 by ion implantation. With respect to the type of the impurity, when the MOS transistors are to be of the N-channel type, phosphorus (P) ions, for instance, are implanted with the energy of 30 keV and at a dose of $5 \times 10^{15}/cm^2$. On the other hand, when the MOS transistors are to be of the P-channel type, boron (B) ions, for instance, are implanted with the energy of 10 keV and at a dose of $5 \times 10^{15}/cm^2$. The thickness of the oxide film 1006 is an appropriate thickness which is suitable to a voltage which is applied to a gate electrode of the MOS transistor L1.

A nitrogen-introduced region N40 is formed in the vicinity of the oxide film 1006, within the polysilicon layer 1007 of the high-voltage circuit portion HP.

Figure 65:
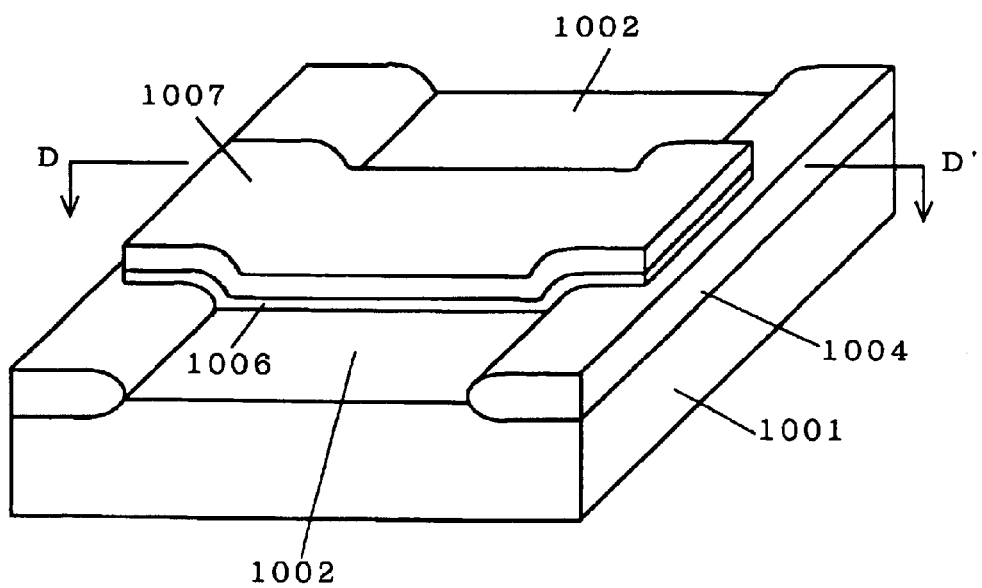
FIG. 65 is a perspective view of a MOS transistor, describing the fifth preferred embodiment of the present invention.

FIG. 65 is a partial perspective view showing the low voltage circuit portion LP. In FIG. 65, a cross sectional taken along line D–D' corresponds to the low voltage circuit portion LP which is shown in FIG. 65. Within the well layer 1002 which is located externally to the both sides of the polysilicon layer 1007, a source/drain region will be formed at a later time.

Nitrogen ions are implanted with the energy of 10 keV and at a dose of $1 \times 10^{16}/cm^2$, to form the nitrogen-introduced region N40. At this stage, a resist mask is formed on the polysilicon layer 1007 of the low voltage circuit portion LP, so that nitrogen will not be implanted.

Thus, since the nitrogen-introduced region N40 is formed in the vicinity of the oxide film 1006 within the polysilicon layer 1007 of the high-voltage circuit portion HP, diffusion of the impurity in the vicinity of the oxide film 1006 is suppressed, so that the impurity concentration becomes low in the vicinity of the oxide film 1006. Therefore, when the MOS transistor H1 operates, a depletion layer is created within the gate electrode, the oxide film becomes effectively thicker, and the threshold value becomes higher. Hence, even when the thickness of the oxide film 1006 is not appropriate to a voltage which is supplied to the gate electrode of the MOS transistor H1, an electric field upon the oxide film 1006 is small. This prevents dielectric breakdown of the oxide film 1006, and improves the reliability of the MOS transistor H1.

On the other hand, since the nitrogen ions are not implanted into the polysilicon layer 1007 of the MOS transistor L1, when the MOS transistor L1 operates, a depletion layer is not formed within the gate electrode, and hence, the oxide film does not become effectively thicker.

<5-2. Characteristic Function and Effect>

As described above, even when there are the high-voltage circuit portion HP which is formed by the MOS transistor H1 in which a relatively high voltage is applied to the gate electrode and the low voltage circuit portion LP which is formed by the MOS transistor L1 in which a relatively low voltage is applied to the gate electrode, it is only necessary to form the oxide films in such a manner that the oxide films are appropriate to the MOS transistor L1. This simplifies the manufacturing steps than where it is necessary to form the oxide films separately.

Further, a nitrogen-introduced region is not formed within the polysilicon layer 1007 on the MOS transistor H1 in the low voltage circuit portion LP, a depletion layer is not formed and the thickness of the oxide film 1006 is the same as the effective thickness. In addition, since the thickness of the oxide film 1006 is set thin in accordance with the MOS transistor L1, when a gate voltage is applied, the number of carriers which are created within the well layer 1002 is increased, the source/drain current increases, and the operation speed becomes faster, thus obtaining a MOS transistor which has excellent operation characteristics.

While the foregoing has described an example where nitrogen ions are not implanted into the polysilicon layer 1007 on the MOS transistor L1, nitrogen ions may not be implanted into the polysilicon layer 1007 on the MOS transistor H1.

Figure 66:
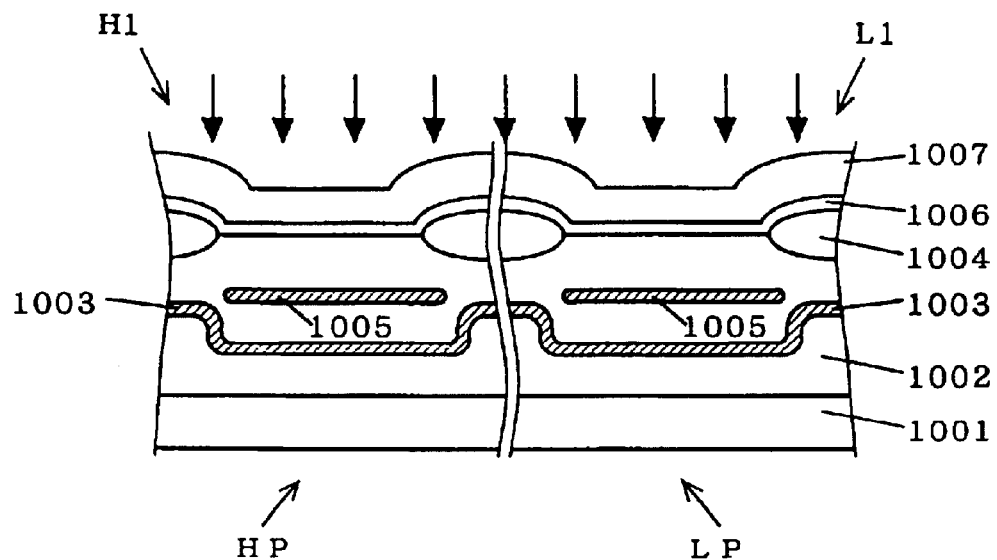
FIGS. 66 and 67 are diagrams showing a manufacturing step according to the fifth preferred embodiment of the present invention.

More specifically, as shown in FIG. 66, with respect to impurity implantation into the polysilicon layer 1007, the impurity is implanted into the polysilicon layer 1007 of the high-voltage circuit portion HP and the low voltage circuit portion LP at a relatively low dose, $5 \times 10^{14}/cm^2$, for example. With respect to the type of the impurity, when the MOS transistors need to be the N-channel type, phosphorus (P) ions, for instance, are implanted with the energy of 30 keV. On the other hand, when the MOS transistors need to be the P-channel type, boron (B), for instance, are implanted with the energy of 10 keV.

Figure 67:
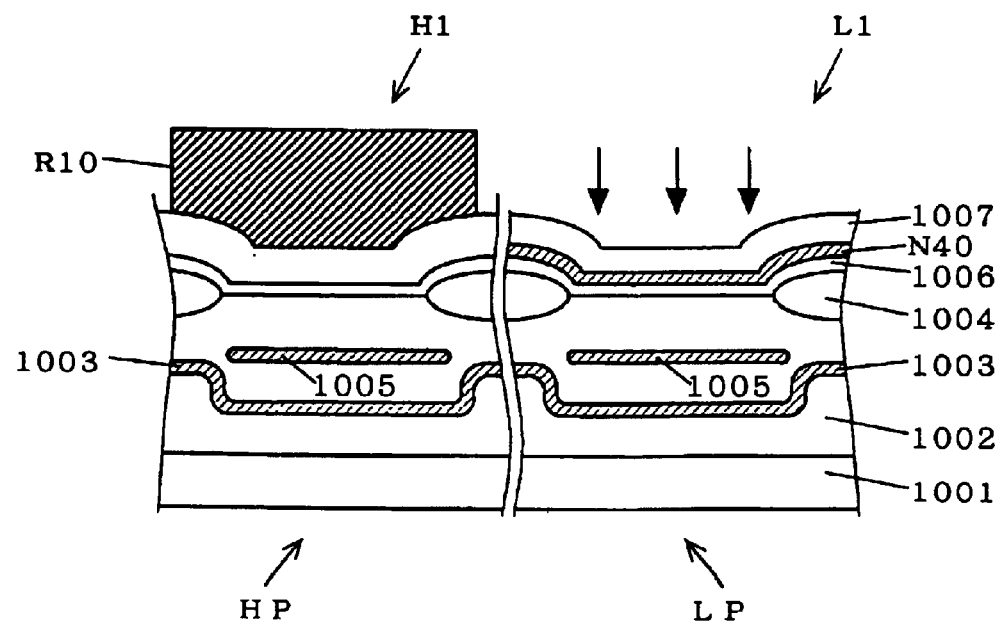

Next, as shown in FIG. 67, a resist mask R10 is formed so as to cover the polysilicon layer 1007 of the high voltage circuit portion HP from above. If impurity ions are implanted, the impurity is additionally implanted into the polysilicon layer 1007 of the low-voltage circuit portion LP. A dose is about $5 \times 10^{15}/cm^2$.

Following this, nitrogen ions are implanted with the energy of 10 keV and at a dose of $1 \times 10^{15}/cm^2$, thereby forming the nitrogen-introduced region N40.

In such a structure, within the polysilicon layer 1007 of the high voltage circuit portion HP, since the impurity concentration is low, a depletion layer is created in a large area and the effective thickness of the oxide film 1006 becomes thick. On the other hand, in the polysilicon layer 1007 of the low-voltage circuit portion LP, since the impurity concentration is high, the nitrogen-introduced region N40 as well suppresses creation of a depletion layer during a device operation. Since nitrogen is introduced into the polysilicon layer 1007 of the low-voltage circuit portion LP, diffusion of the impurity toward the high voltage circuit portion HP is prevented. An impurity may not be introduced into the polysilicon layer 1007 of the high voltage circuit portion HP at all.

<5-3. First Modification>

Although the foregoing has described the fifth preferred embodiment of the present invention in relation to an example where the polysilicon layer 1007 of one layer is formed on the MOS transistor H1 of the low-voltage circuit portion LP and the high-voltage circuit portion HP and nitrogen ions are implanted into the polysilicon layer 1007, the polysilicon layer may have a dual-layer structure as described below.

Figure 68:
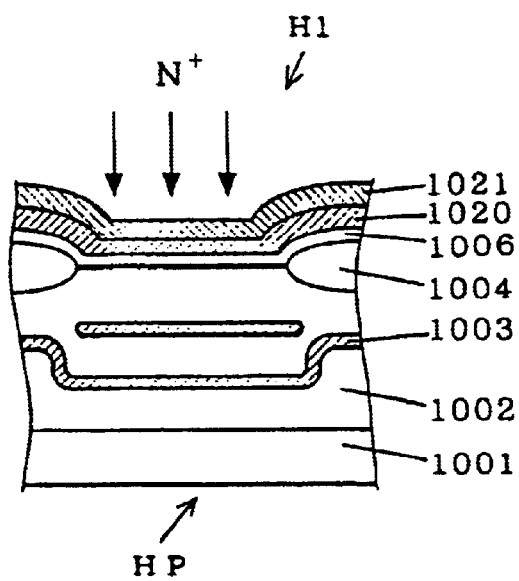
FIG. 68 is a diagram showing a first modification of the fifth preferred embodiment of the present invention.

FIG. 68 shows a principal portion of the high-voltage circuit portion HP. In FIG. 68, a non-doped polysilicon layer 1020 and a doped polysilicon layer 1021 are formed in this order on the oxide film 1006.

In this condition, when nitrogen ions are implanted from above into the doped polysilicon layer 1021, a nitrogen-introduced region (not shown) is formed within the non-doped polysilicon layer 1020 of the high voltage circuit portion HP.

As a result, the impurity does not diffuse into the non-doped polysilicon layer 1020 from the doped polysilicon layer 1021, and therefore, when the MOS transistor H1 of the high voltage circuit portion HP operates, a depletion layer is created within the non-doped polysilicon layer 1020, the oxide film 1006 becomes effectively thicker and a threshold value becomes higher. Hence, even when the thickness of the oxide film 1006 is not appropriate to a voltage which is supplied to the gate electrode of the MOS transistor H1, an electric field upon the oxide film 1006 is small. This prevents dielectric breakdown of the oxide film 1006, and improves the reliability of the MOS transistor H1.

The nitrogen ions are implanted with the energy of 10 keV and at a dose of $1 \times 10^{15}/cm^2$.

<5-4. Second Modification>

Although the foregoing has described the fifth preferred embodiment of the present invention in relation to an example where impurity ions are implanted into the entire region (including the region on the LOCOS layer 1004) of the polysilicon layer 1007 on the active region on the MOS transistor H1 of the high-voltage L circuit portion HP, nitrogen ions may be implemented locally into only an edge portion of the polysilicon layer 1007 as described below.

Figure 69:
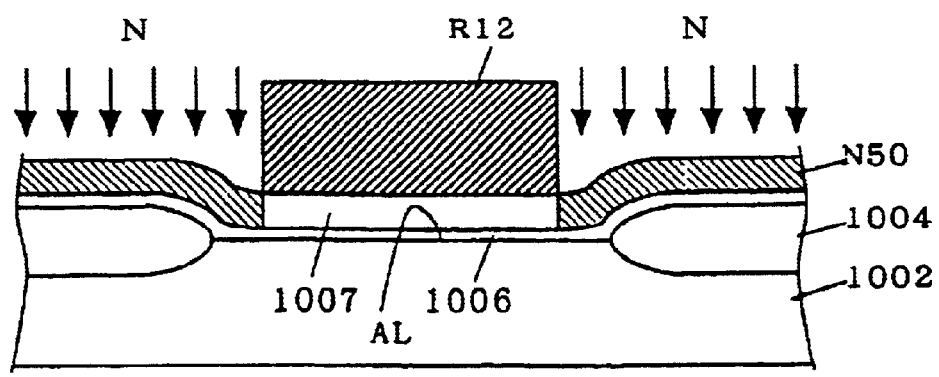
FIG. 69 is a diagram showing a second modification of the manufacturing step according to the fifth preferred embodiment of the present invention.

FIG. 69 shows a principal portion of the high-voltage circuit portion HP. FIG. 69 omits the channel cut layer 1003 and the channel dope layer 1005.

In FIG. 69, a resist mask R12 is formed in such a manner that there is an opening portion on the polysilicon layer 1007 at the central portion of the active region AL which is surrounded from the both sides of the LOCOS layer 1004.

In this condition, when nitrogen ions are implanted into the polysilicon layer 1007 which is not covered with the resist mask R12 from above, the nitrogen ions are introduced into the polysilicon layer 1007 at the edge portion of the active region AL, whereby the nitrogen-introduced region N50 is formed.

The nitrogen ions are implanted with the energy of 10 keV and at a dose of $1 \times 10^{15}/cm^2$.

Hence, when the MOS transistor H1 operates, the range in which a depletion layer is formed expands within the polysilicon layer 1007 at the edge portion of the active region AL, the effective thickness of the oxide film does not increase, the thickness of the oxide film becomes effectively thick, and a threshold value becomes high partially.

When a threshold value may become high partially, this structure may be applied not only to the MOS transistor L1 of the high-voltage circuit portion HP but also to the MOS transistor L1 of the low-voltage circuit portion LP.

Although adopting such a structure does not create many advantages in a MOS transistor which is formed on a bulk silicon substrate, in a MOS transistor which is formed on an SOI (silicon on insulator) substrate, adopting such a structure solves a problem of a deteriorated threshold value due to the structure of the edge portion of the active region AL.

Figure 70:
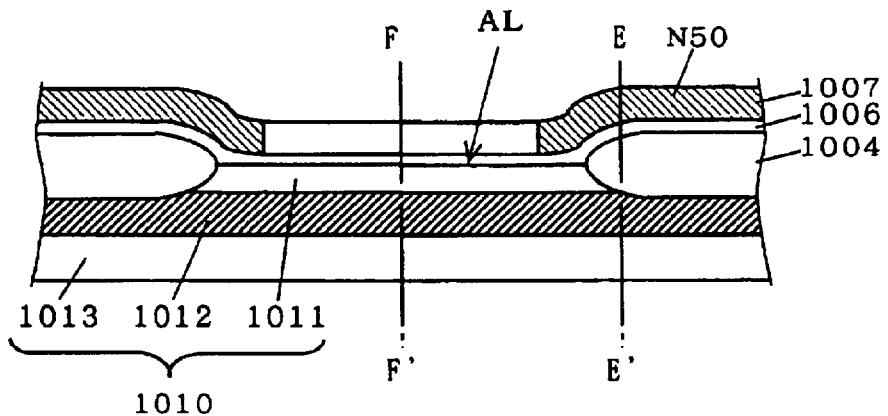
FIG. 70 is a diagram showing an example of an application of the second modification of the manufacturing step according to the fifth preferred embodiment of the present invention.
Figure 71:
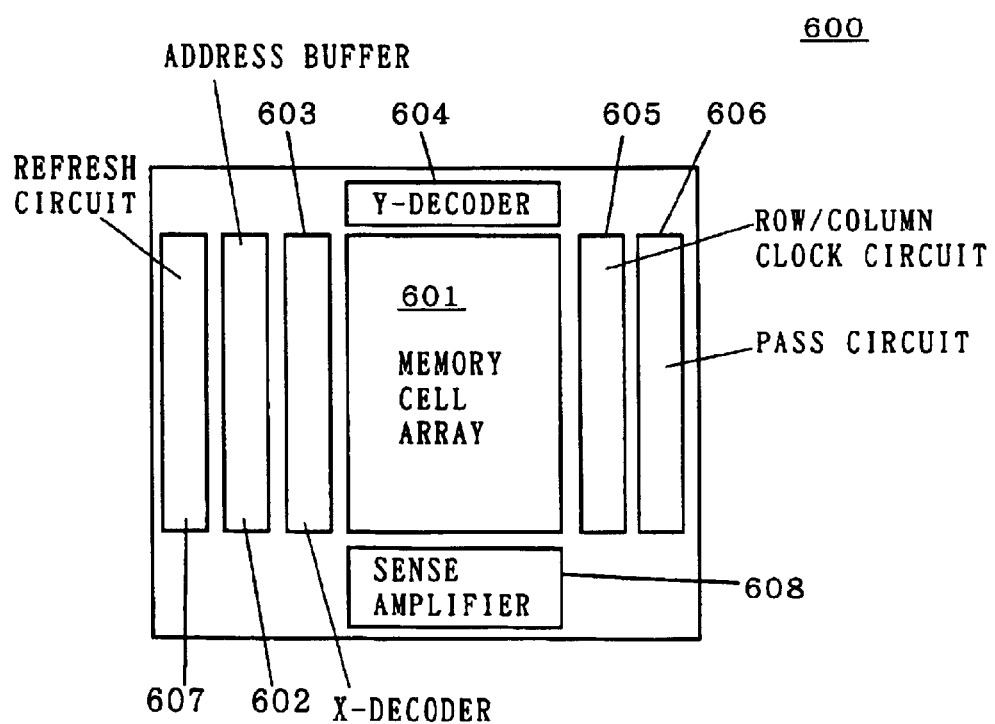
FIG. 71 is a diagram for describing an overall structure of a conventional DRAM.
Figure 72:
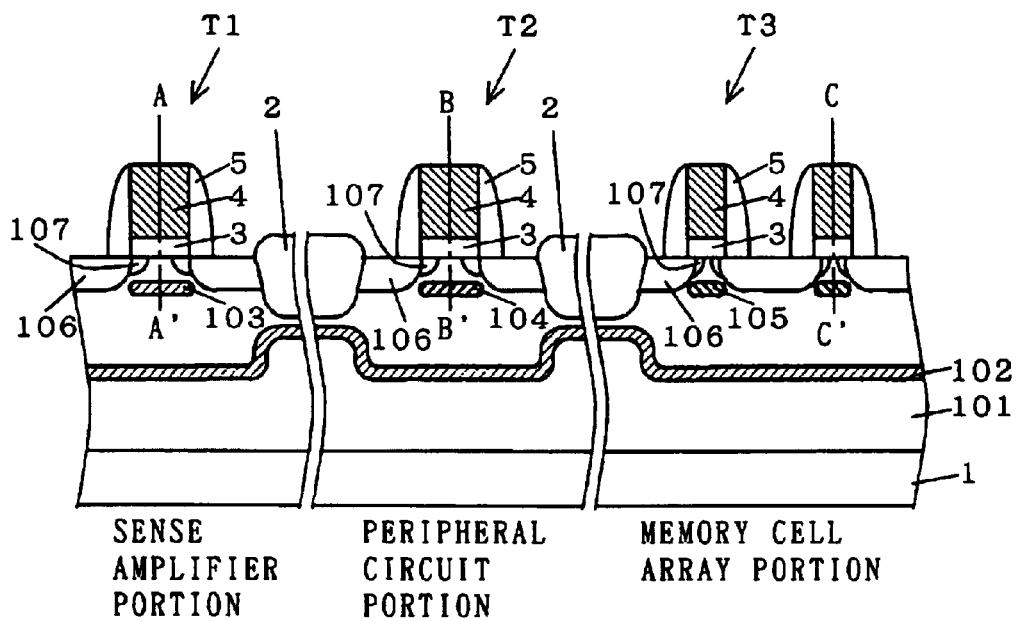
FIG. 72 is a cross sectional view for describing a structure of the conventional DRAM.
Figure 73:
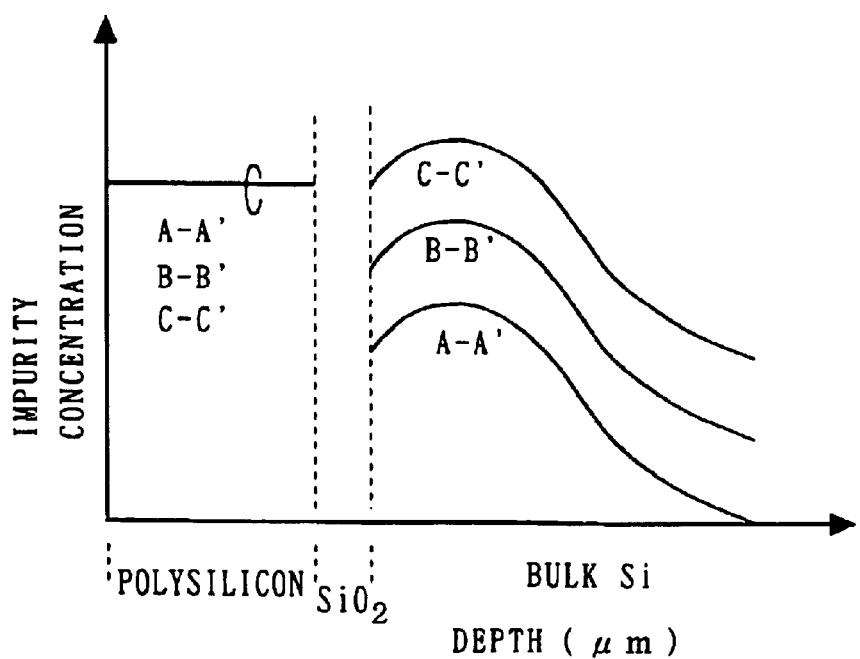
FIG. 73 is a diagram for describing a distribution of an impurity within the conventional DRAM.
Figure 74:
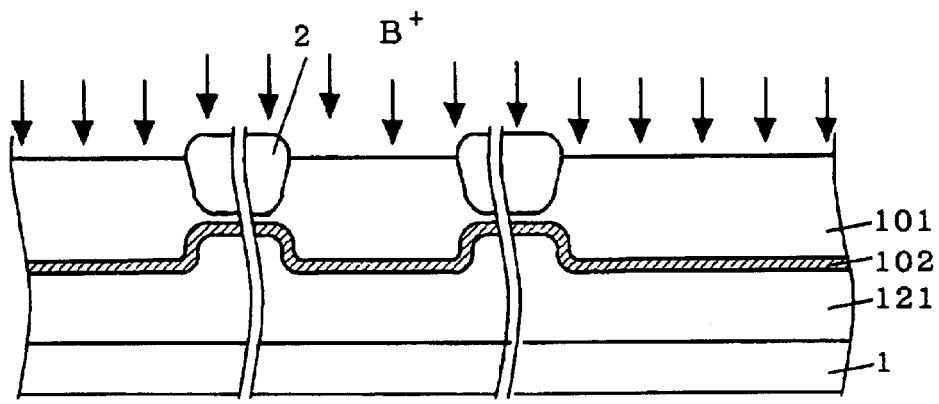
FIGS. 74 to 79 are diagrams showing manufacturing steps of manufacturing the conventional DRAM.
Figure 75:
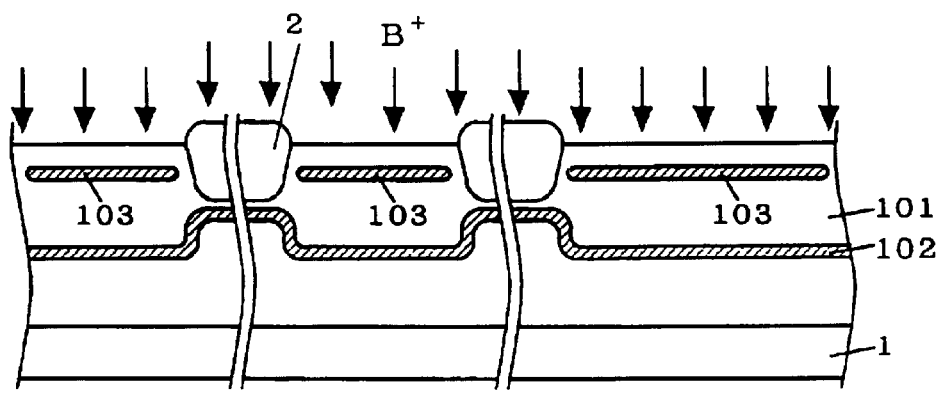
Figure 76:
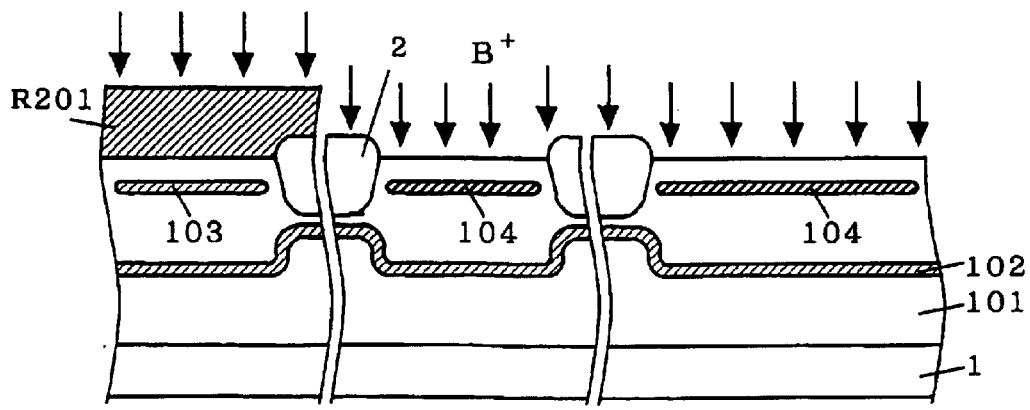
Figure 77:
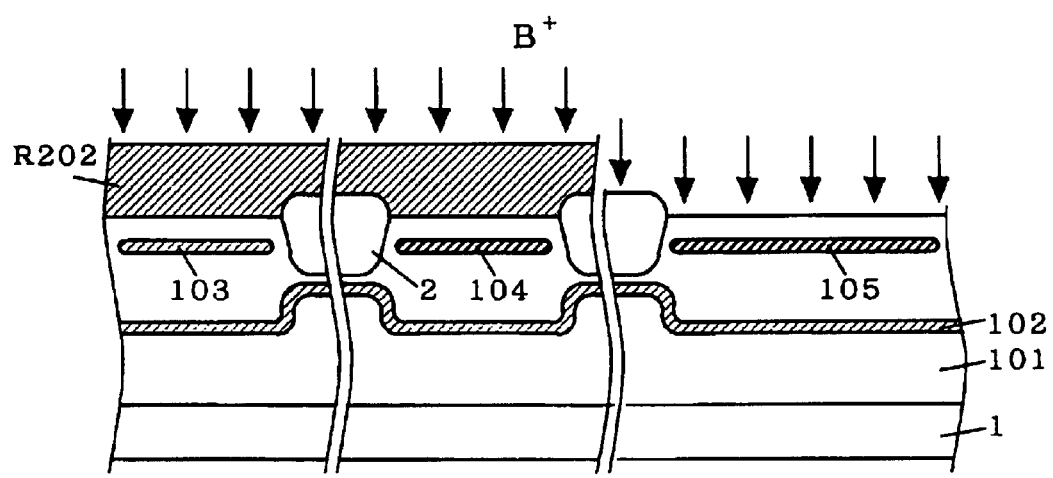
Figure 78:
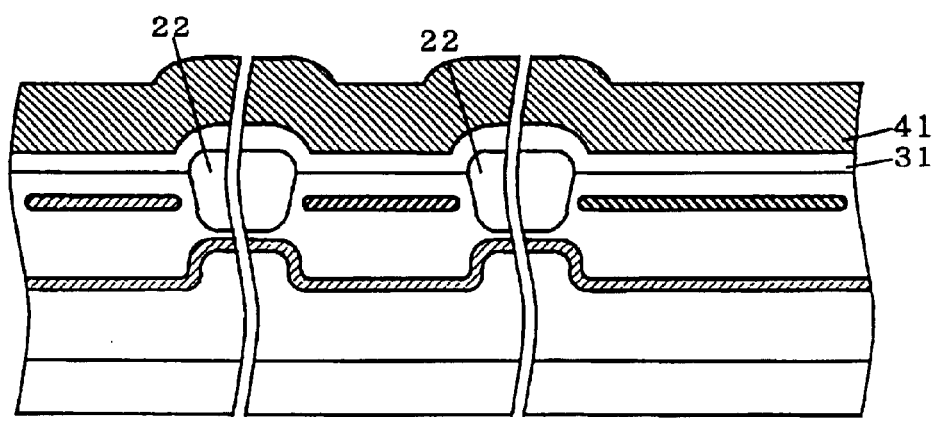
Figure 79:
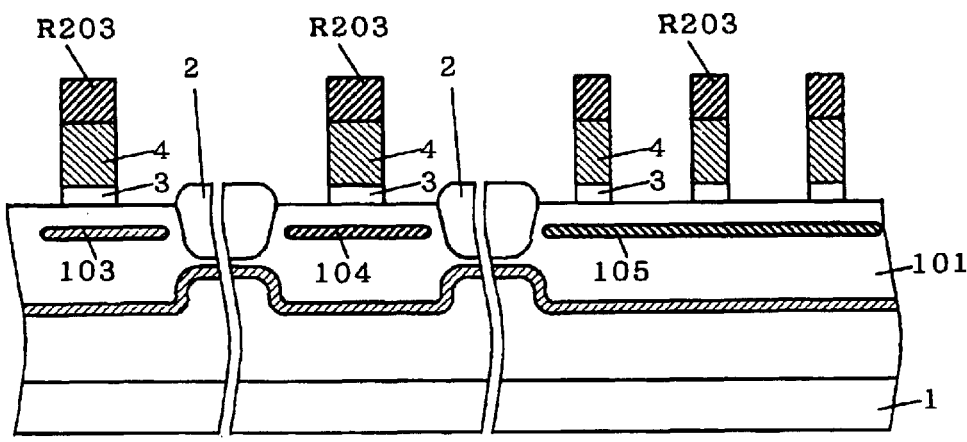
Figure 80:
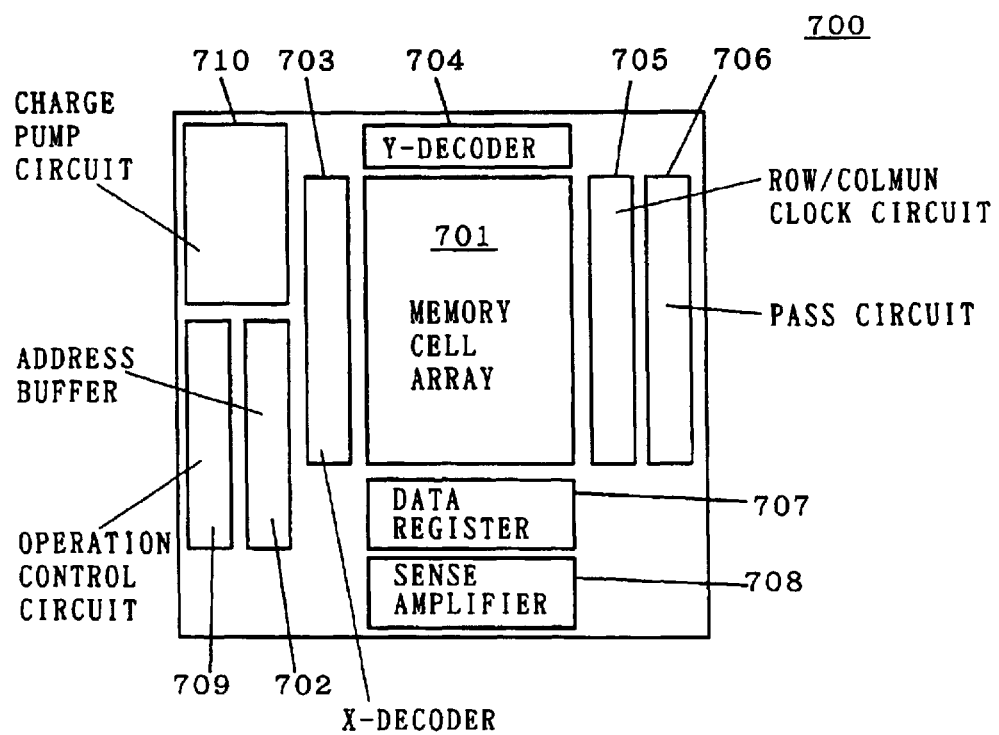
FIG. 80 is a diagram for describing an overall structure of a conventional flash memory.
Figure 81:
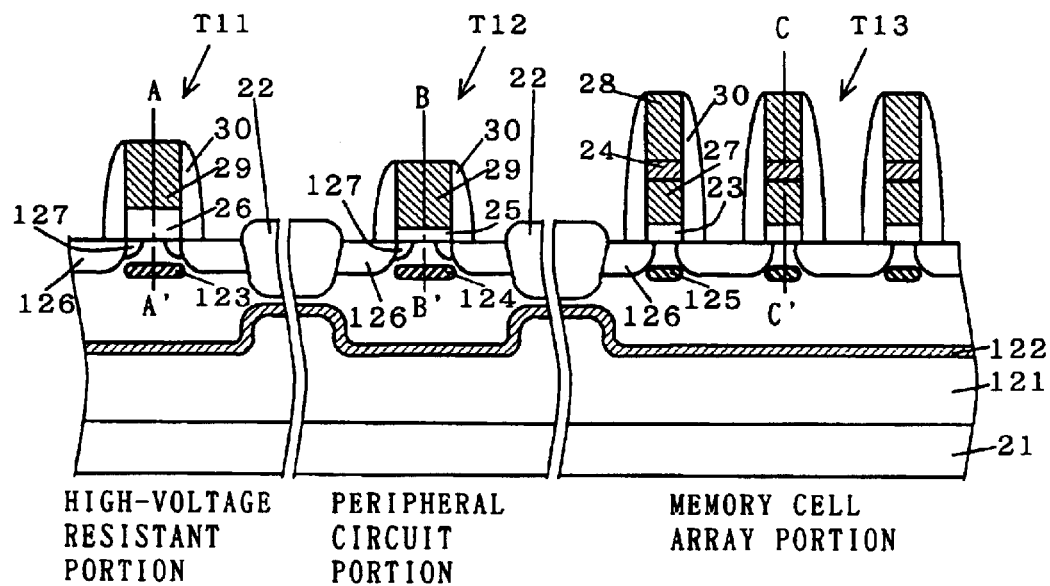
FIG. 81 is a cross sectional view for describing a structure of the conventional flash memory.
Figure 82:
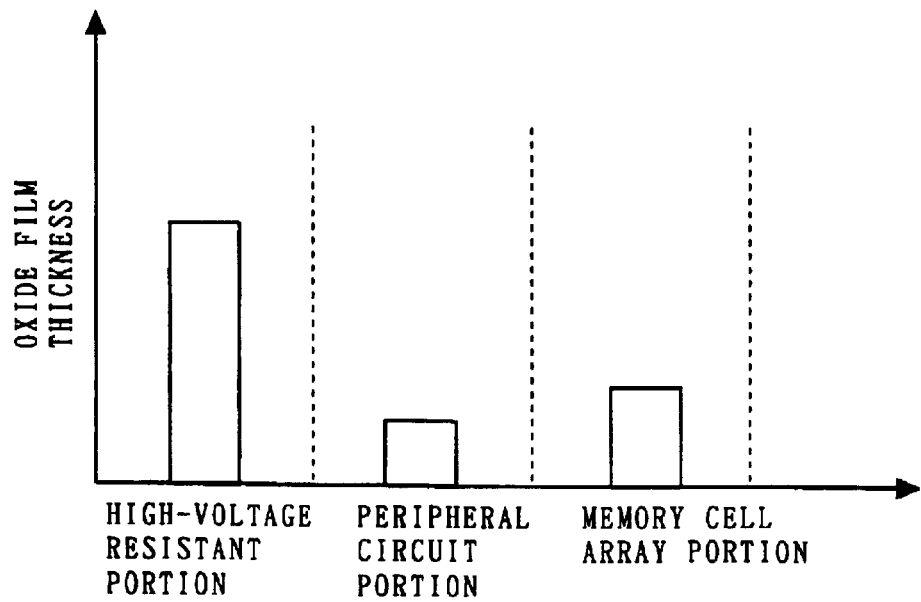
FIG. 82 is a diagram for describing a thickness of a gate oxide film in the conventional flash memory.
Figure 83:
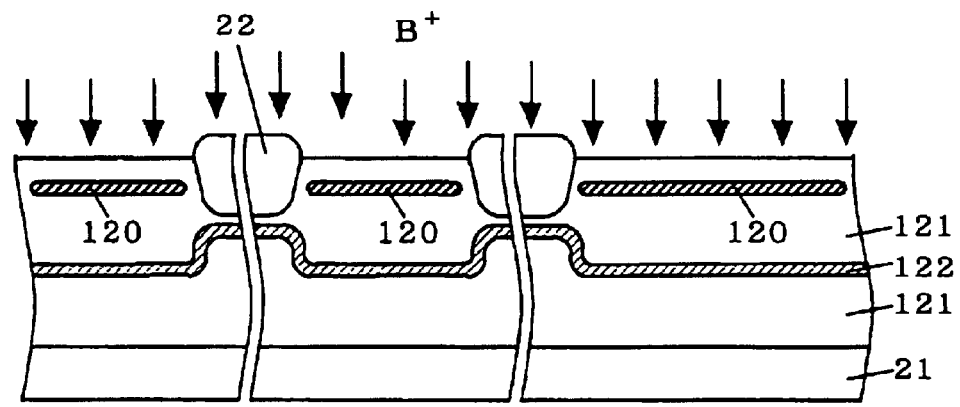
FIGS. 83 to 96 are diagrams showing manufacturing steps of manufacturing the conventional flash memory.
Figure 84:
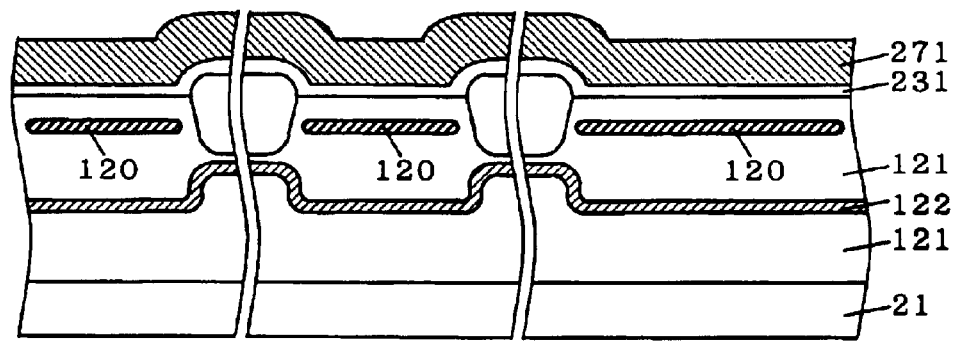
Figure 85:
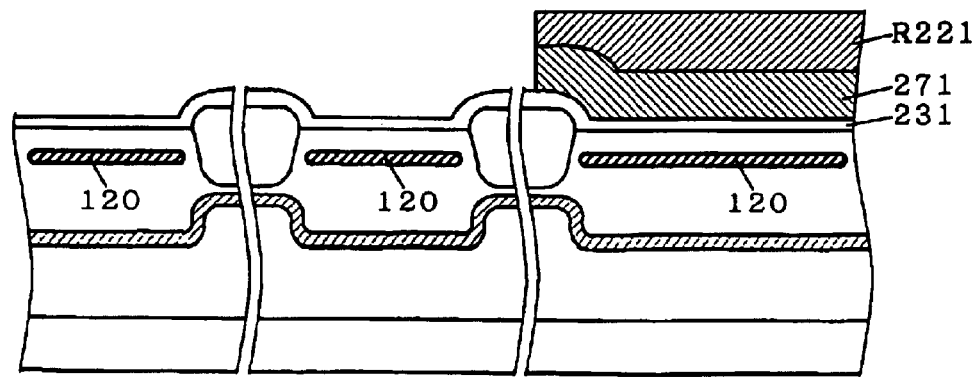
Figure 86:
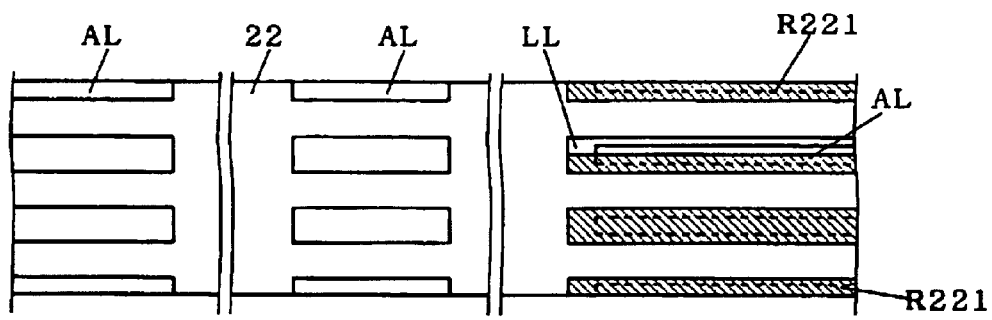
Figure 87:
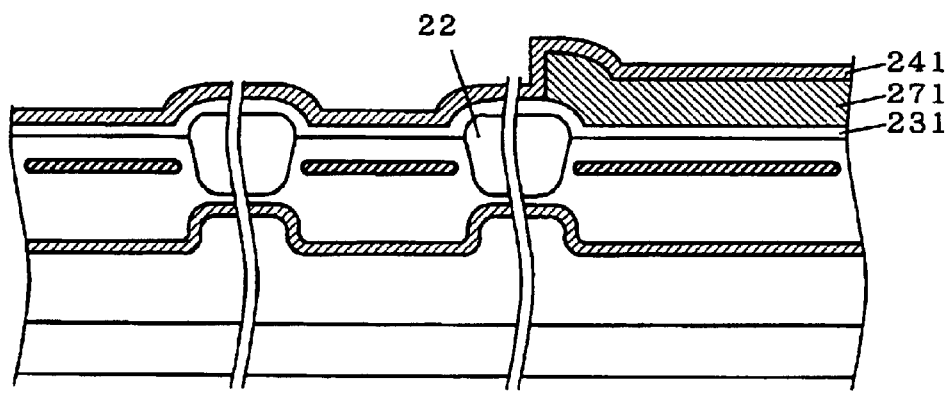
Figure 88:
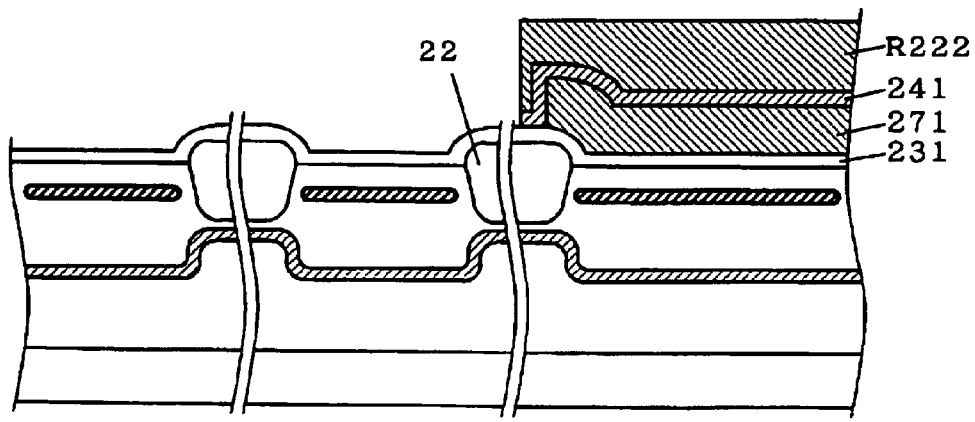
Figure 89:
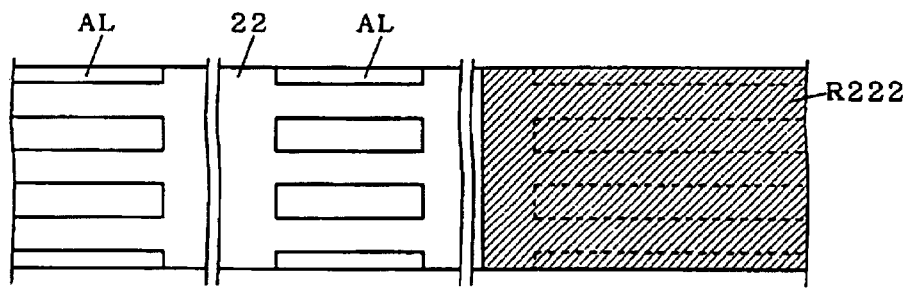
Figure 90:
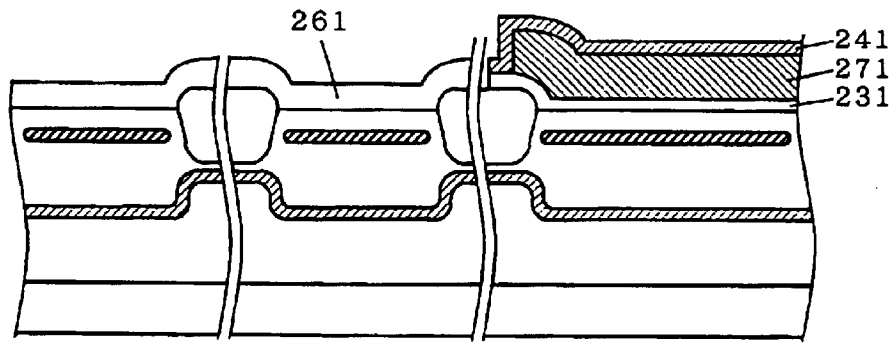
Figure 91:
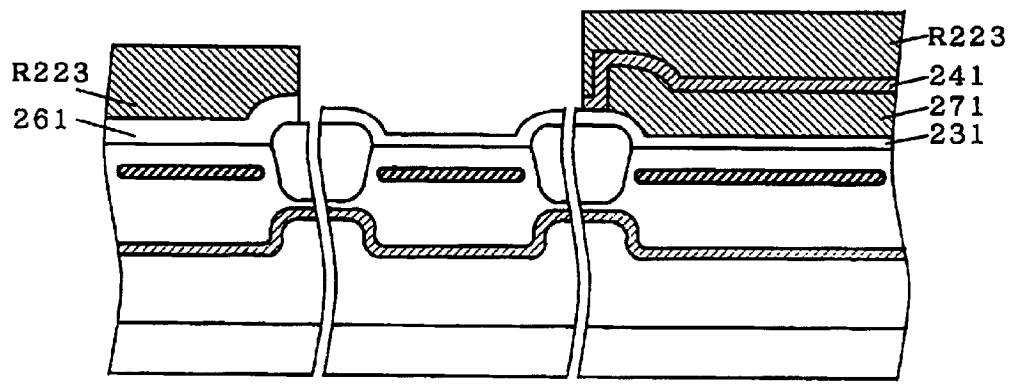
Figure 92:
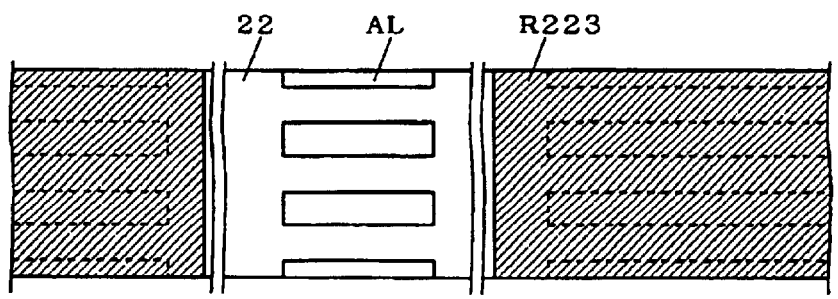
Figure 93:
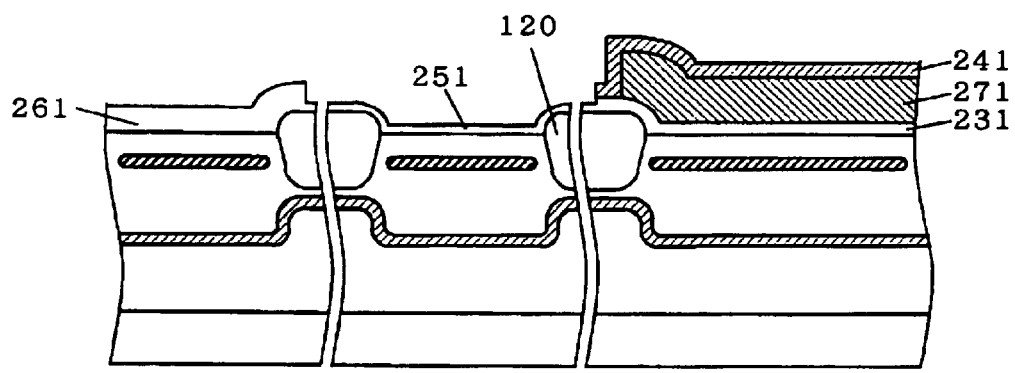
Figure 94:
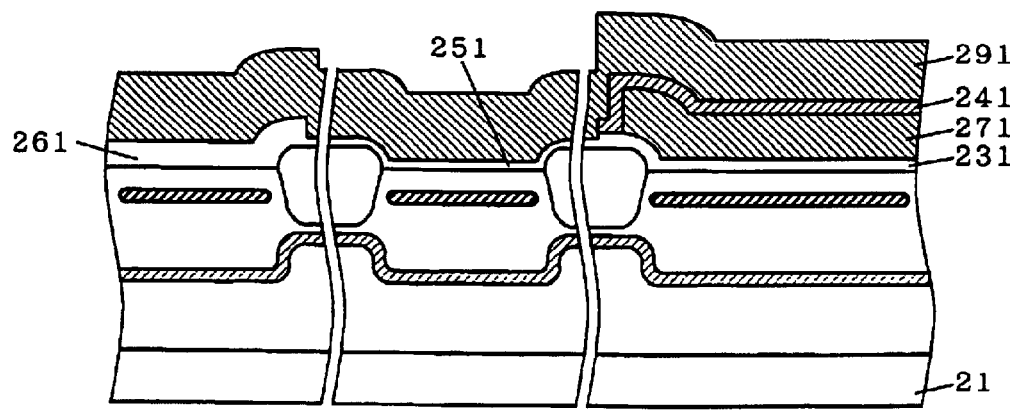
Figure 95:
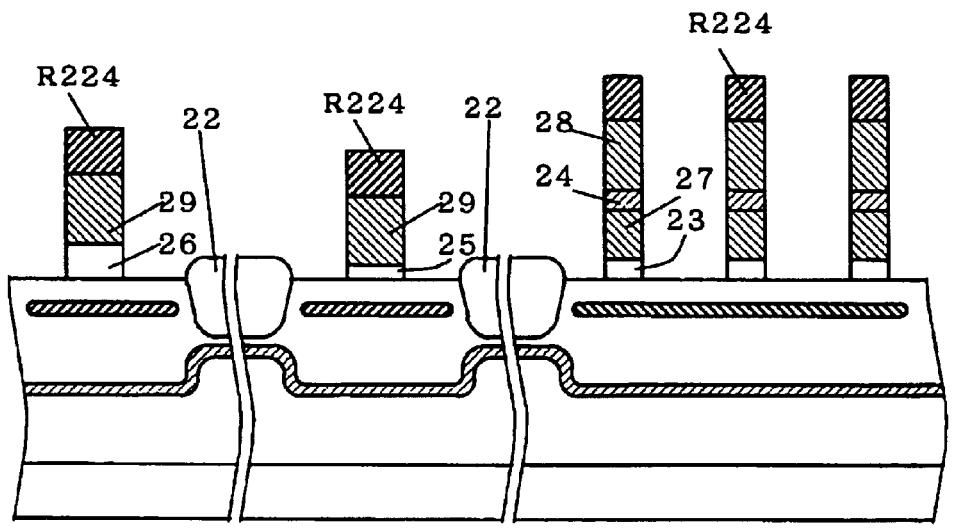
Figure 96:
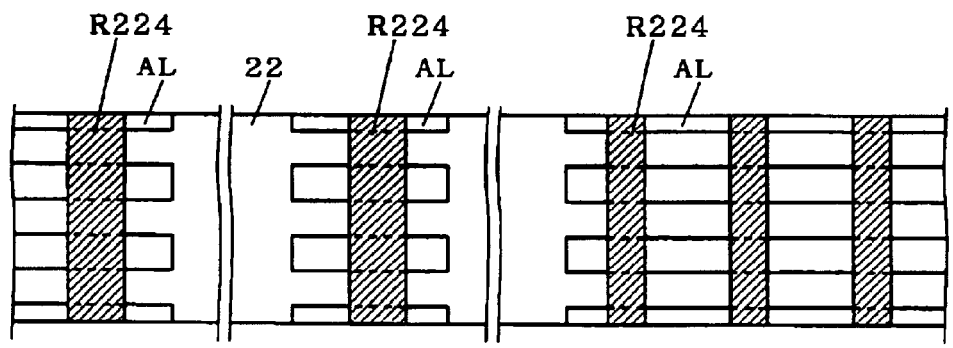
Figure 97:
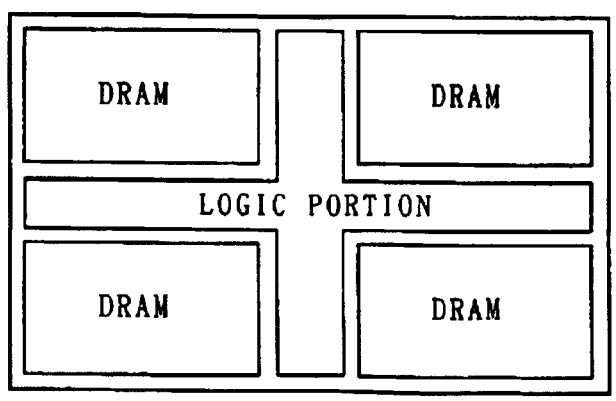
FIG. 97 is a diagram for describing an overall structure of a conventional LOGIC in DRAM.
Figure 98:
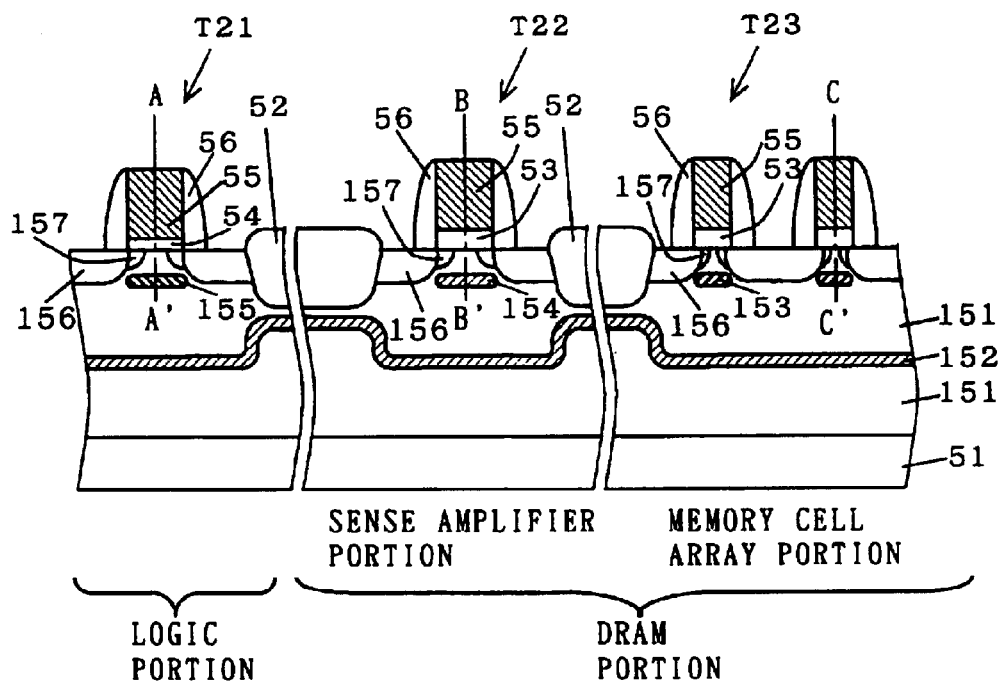
FIG. 98 is a cross sectional view for describing a structure of the conventional LOGIC in DRAM.
Figure 99:
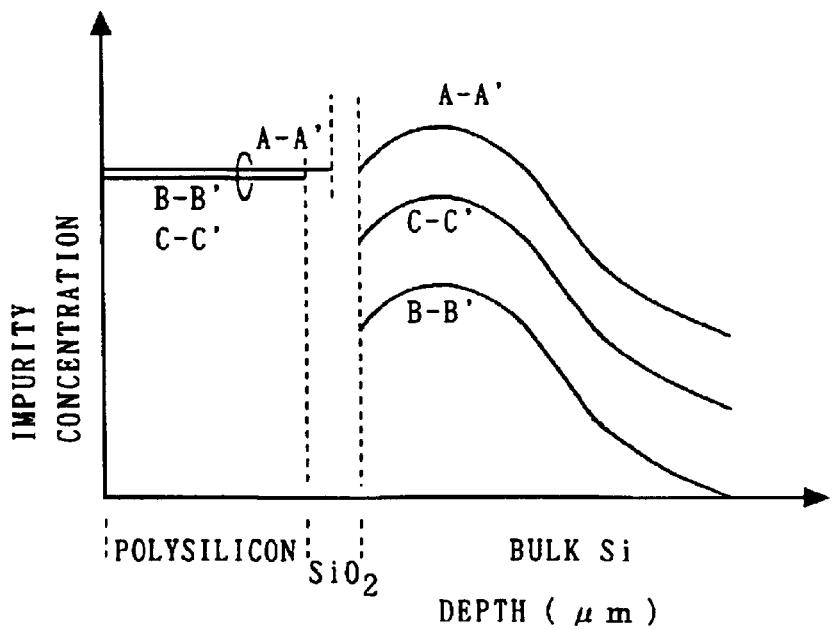
FIG. 99 is a diagram for describing a distribution of an impurity within the conventional LOGIC in DRAM.
Figure 100:
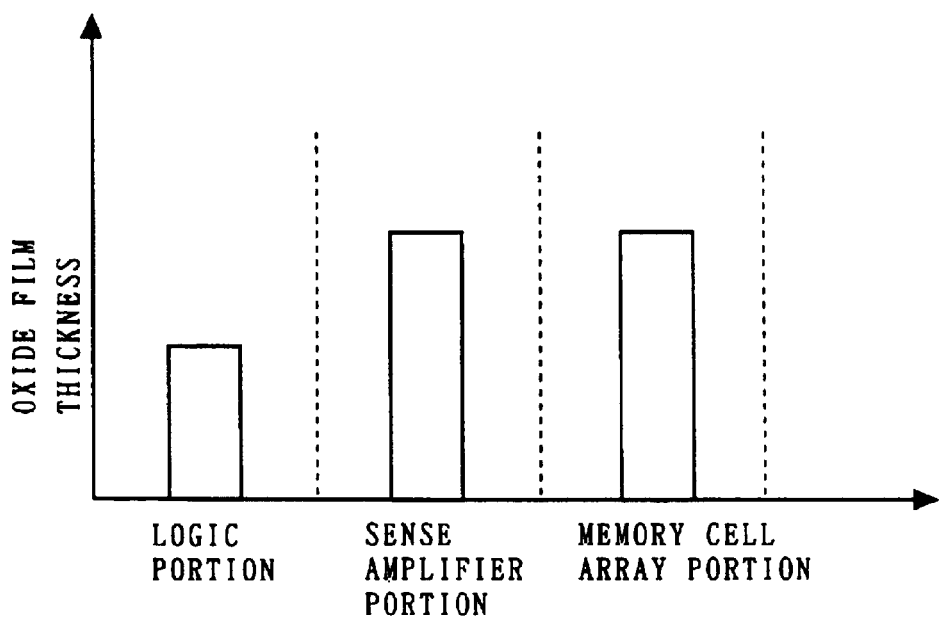
FIG. 100 is a diagram for describing a thickness of a gate oxide film in the conventional LOGIC in DRAM.
Figure 101:
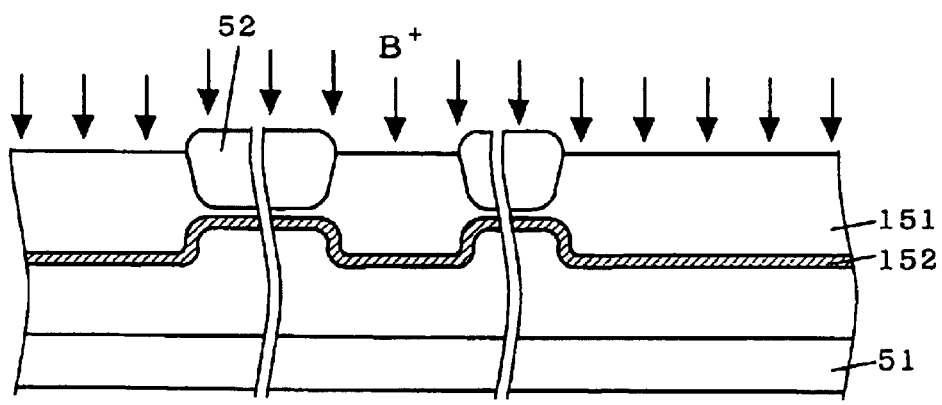
FIGS. 101 to 109 are diagrams showing manufacturing steps of manufacturing the conventional LOGIC in DRAM.
Figure 102:
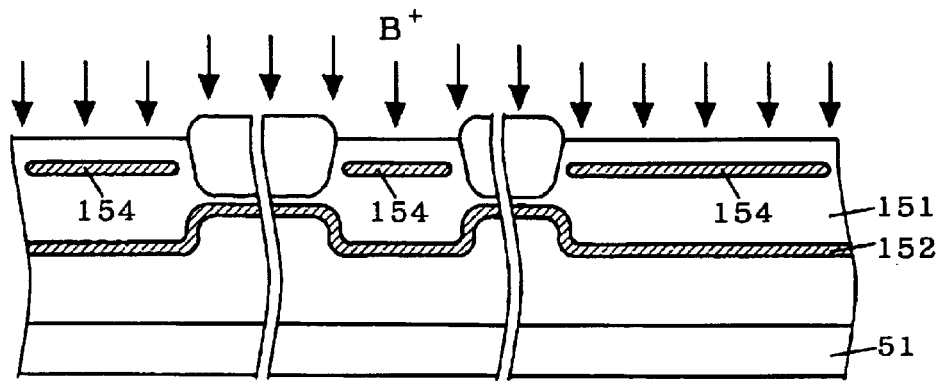
Figure 103:
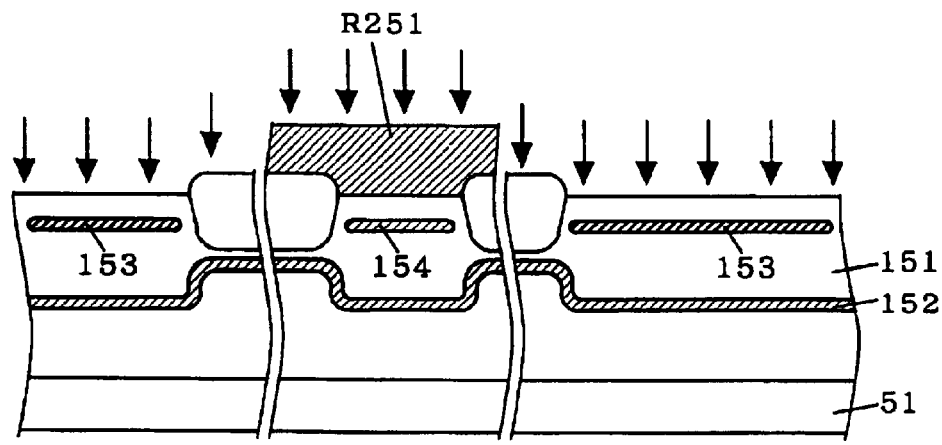
Figure 104:
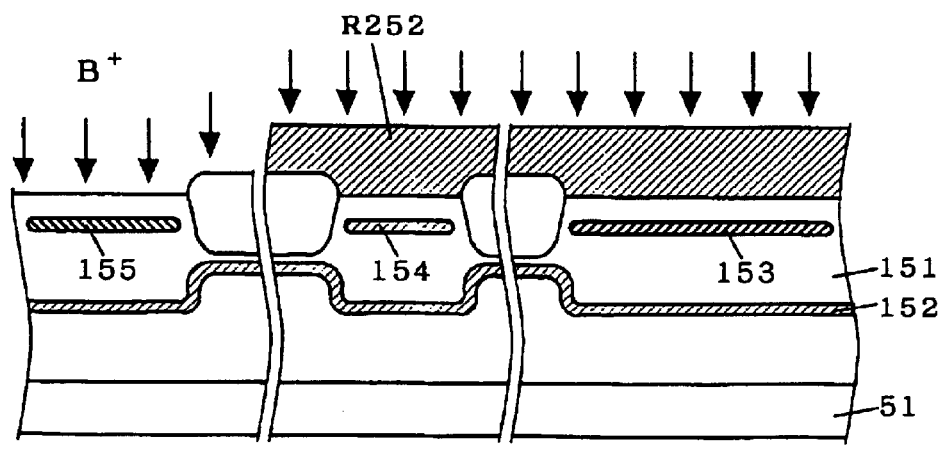
Figure 105:
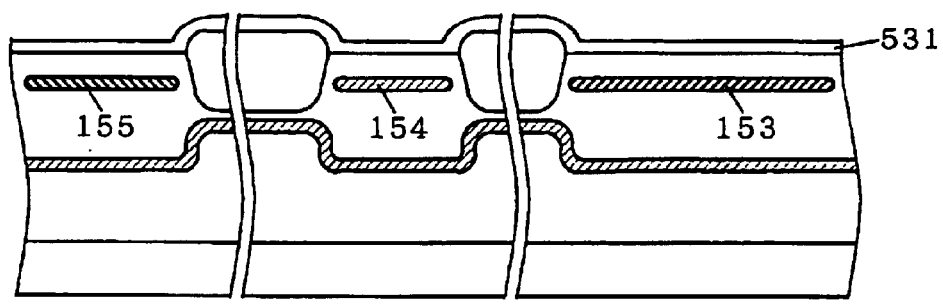
Figure 106:
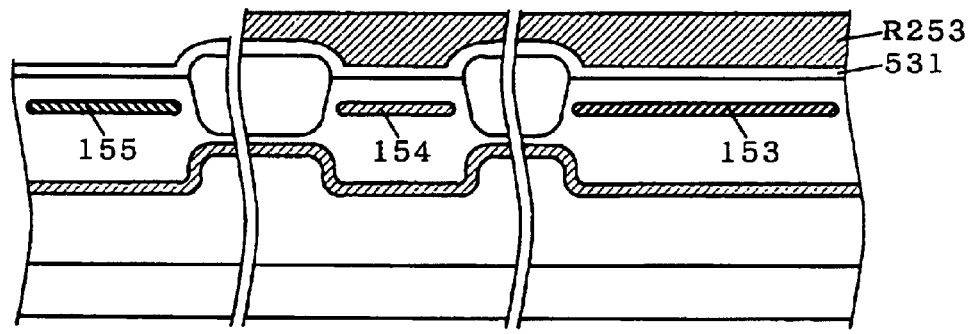
Figure 107:
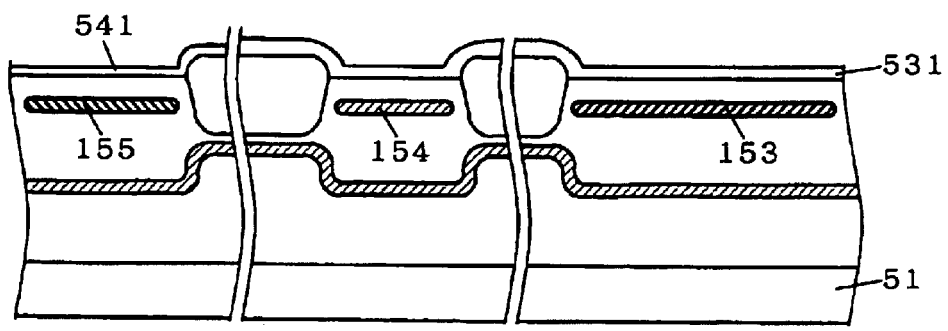
Figure 108:
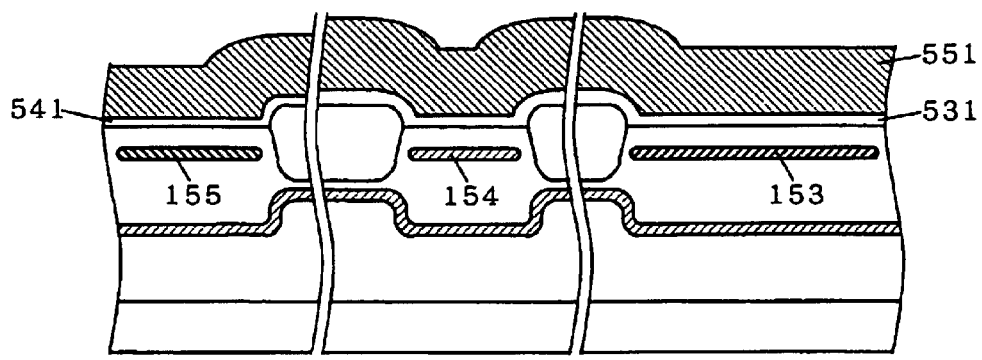
Figure 109:
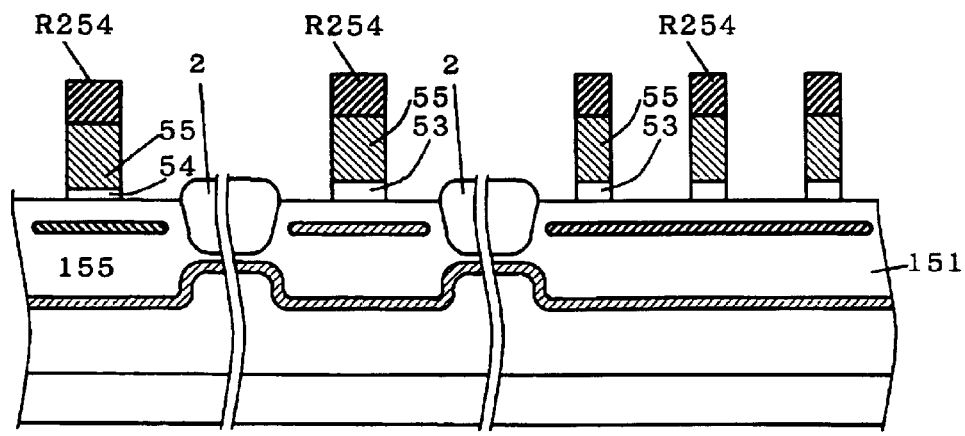
Figure 110:
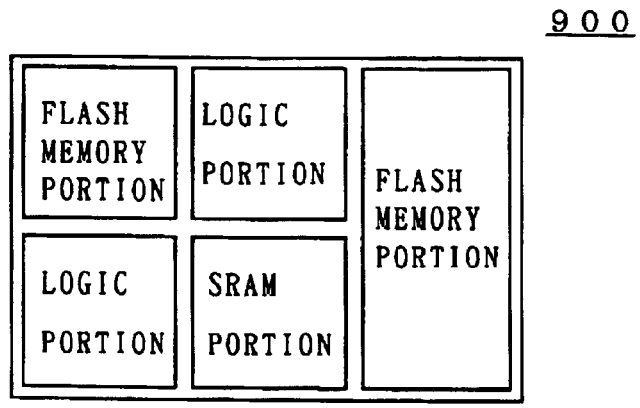
FIG. 110 is a diagram for describing an overall structure of a conventional LOGIC in FLASH.
Figure 111:
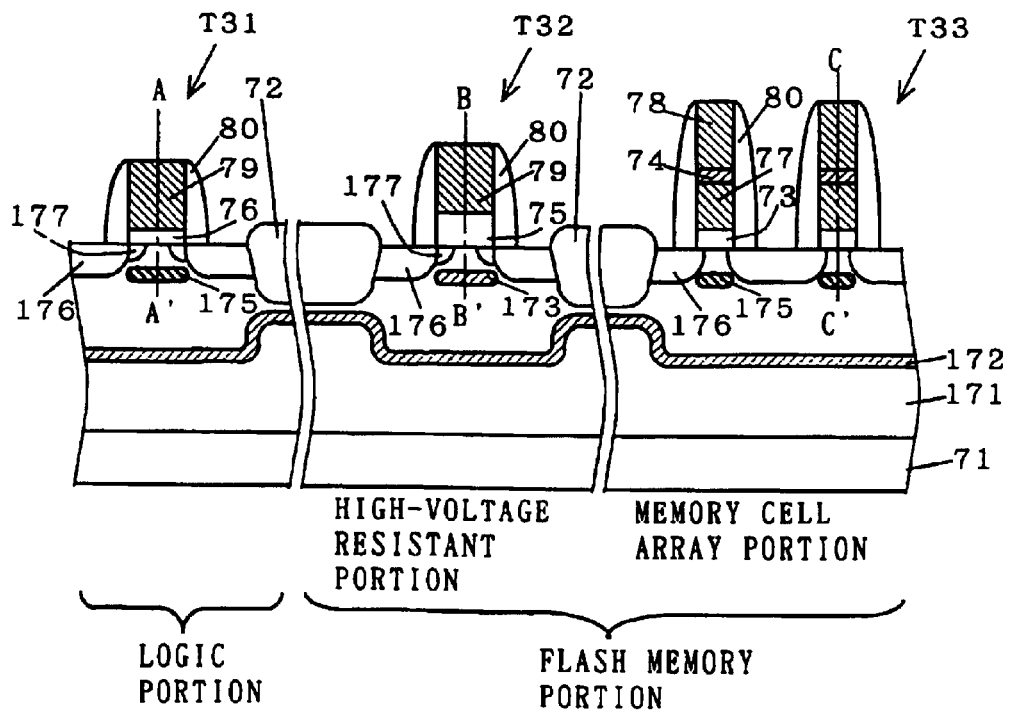
FIG. 111 is a cross sectional view for describing a structure of the conventional LOGIC in FLASH.
Figure 112:
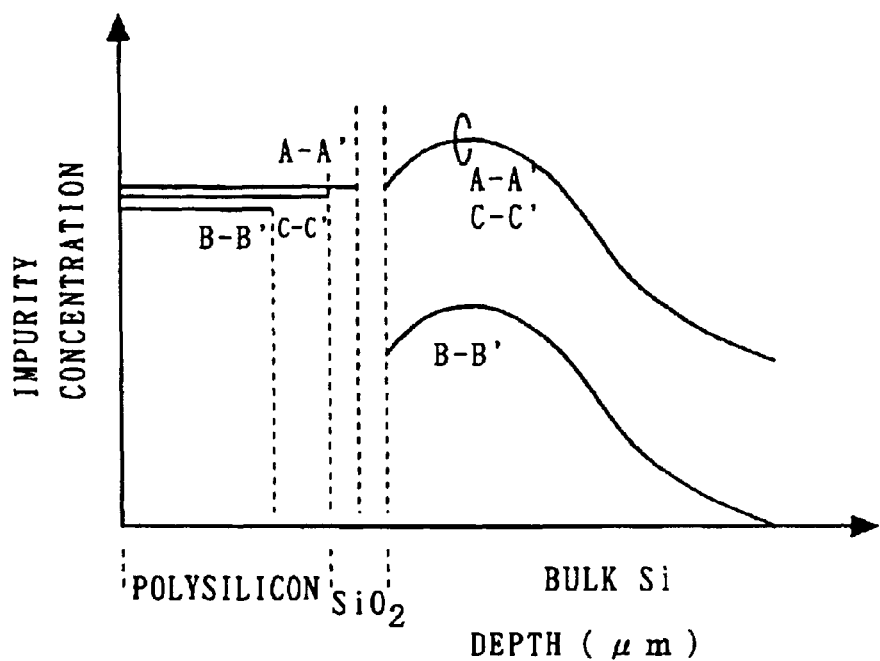
FIG. 112 is a diagram for describing a distribution of an impurity within the conventional LOGIC in FLASH.
Figure 113:
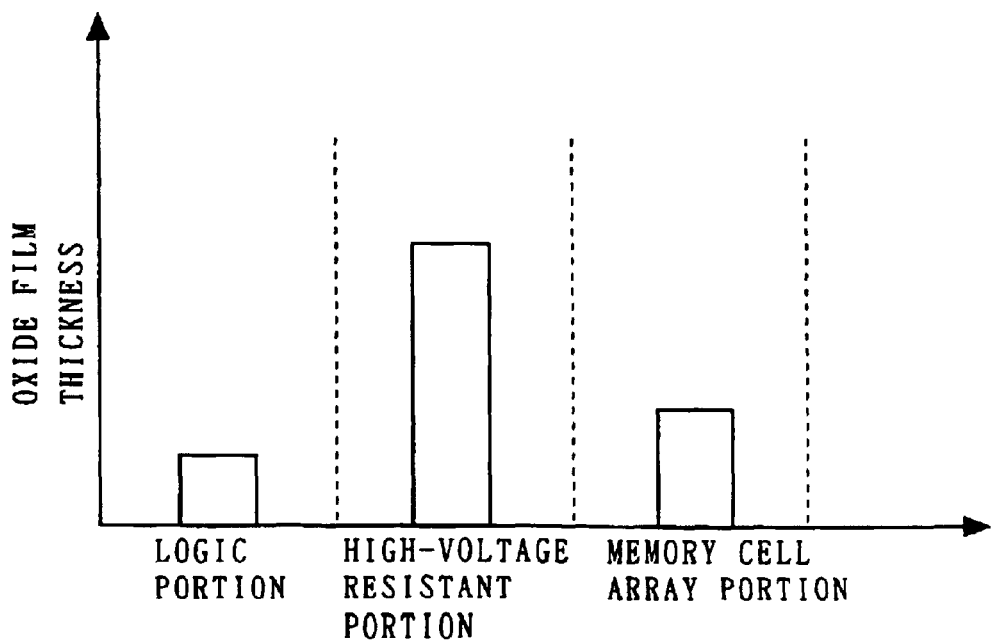
FIG. 113 is a diagram for describing a thickness of a gate oxide film in the conventional LOGIC in FLASH.
Figure 114:
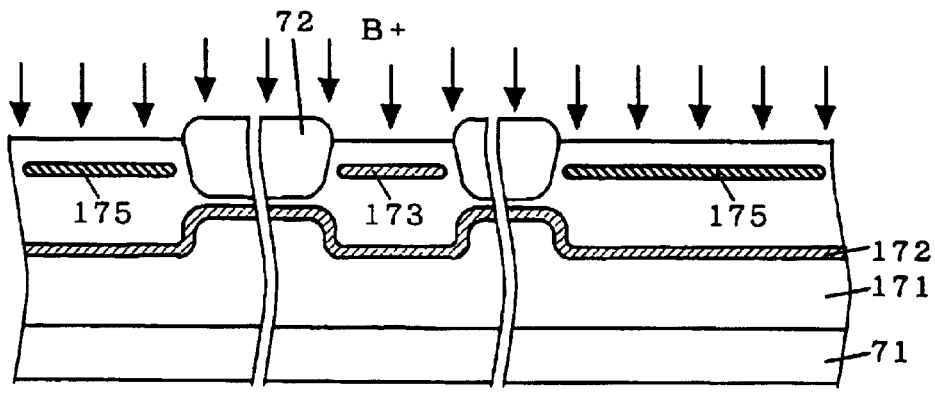
FIGS. 114 to 127 are diagrams showing manufacturing steps of manufacturing the conventional LOGIC in FLASH.
Figure 115:
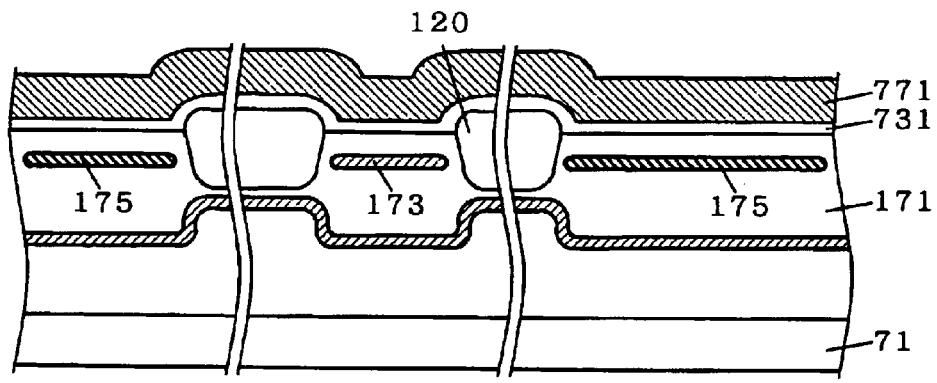
Figure 116:
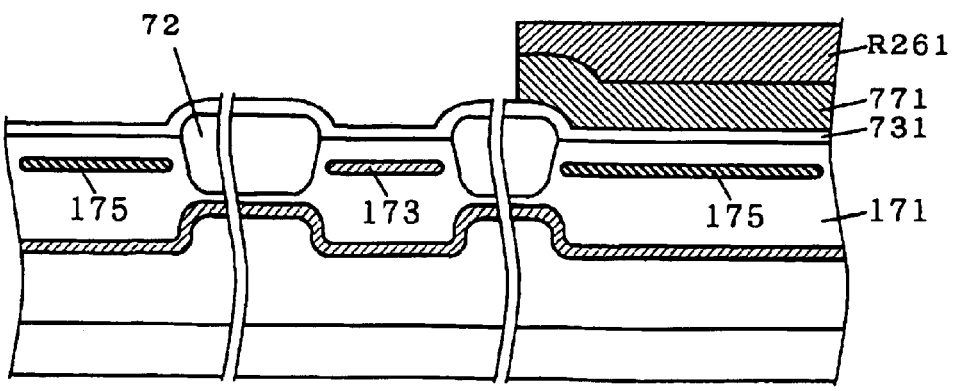
Figure 117:
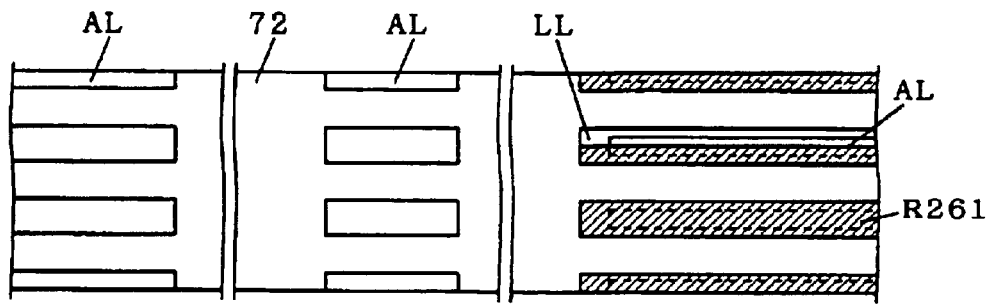
Figure 118:
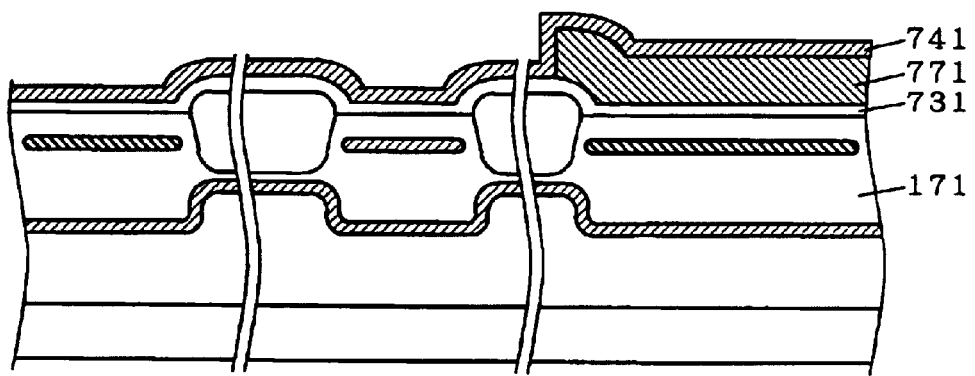
Figure 119:
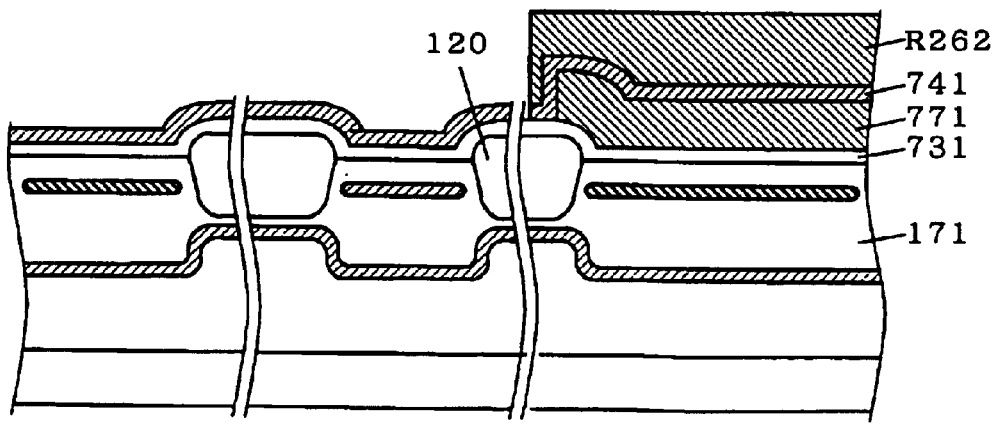
Figure 120:
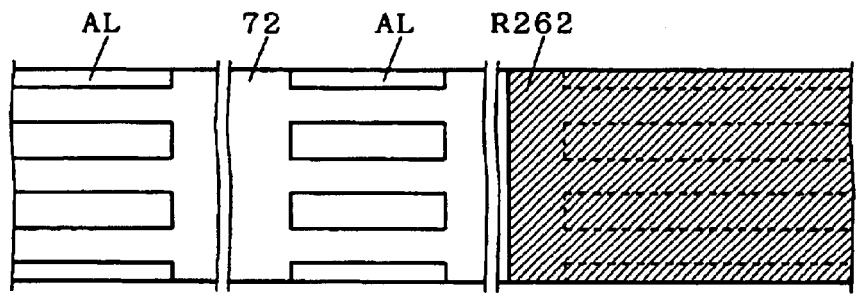
Figure 121:
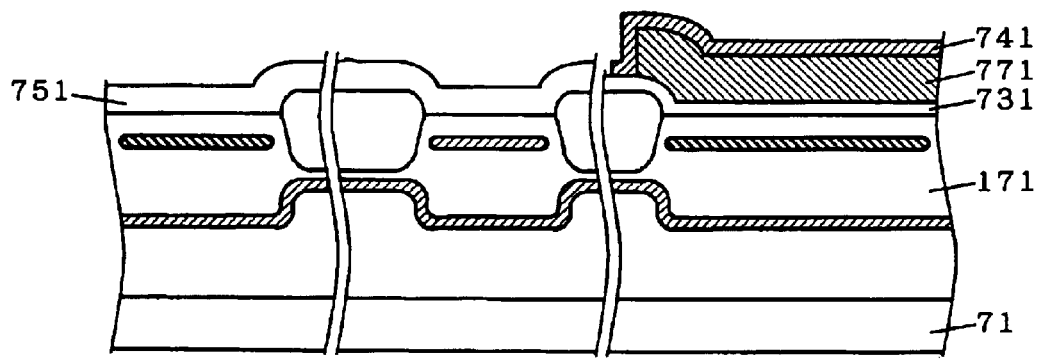
Figure 122:
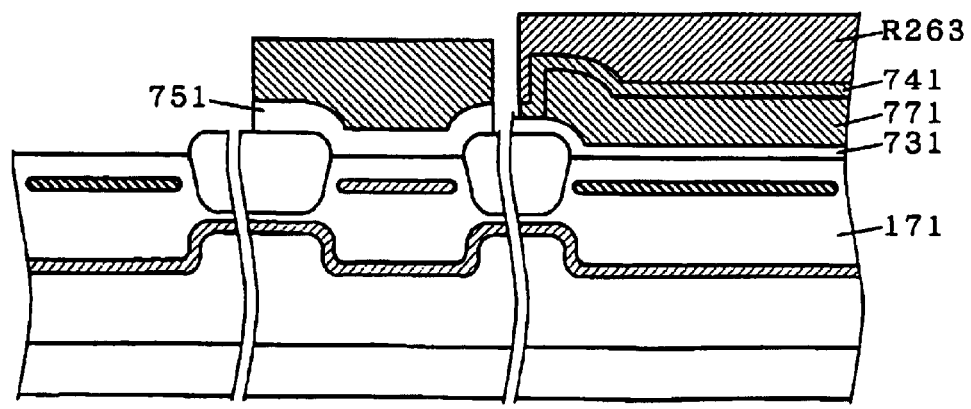
Figure 123:
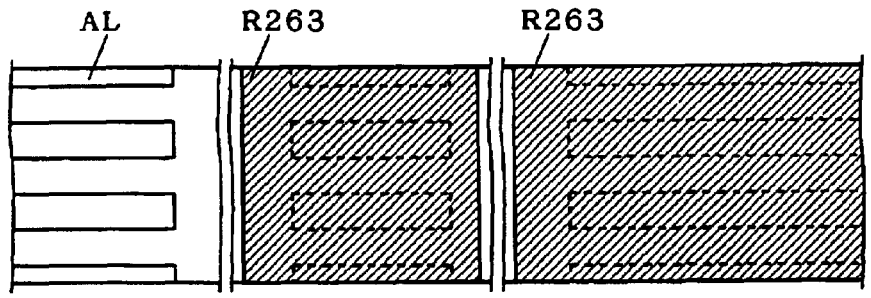
Figure 124:
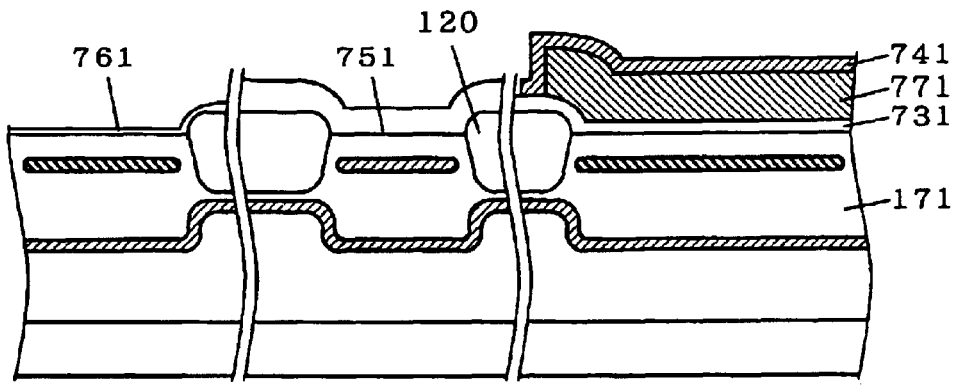
Figure 125:
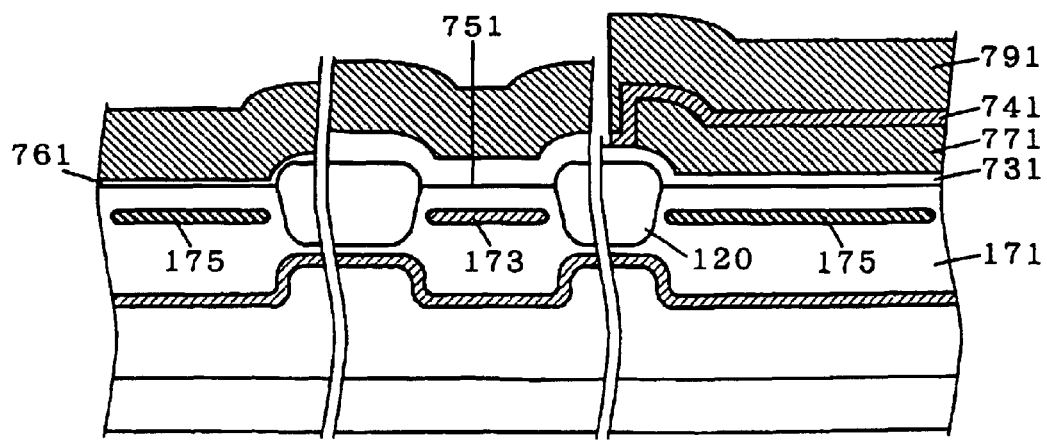
Figure 126:
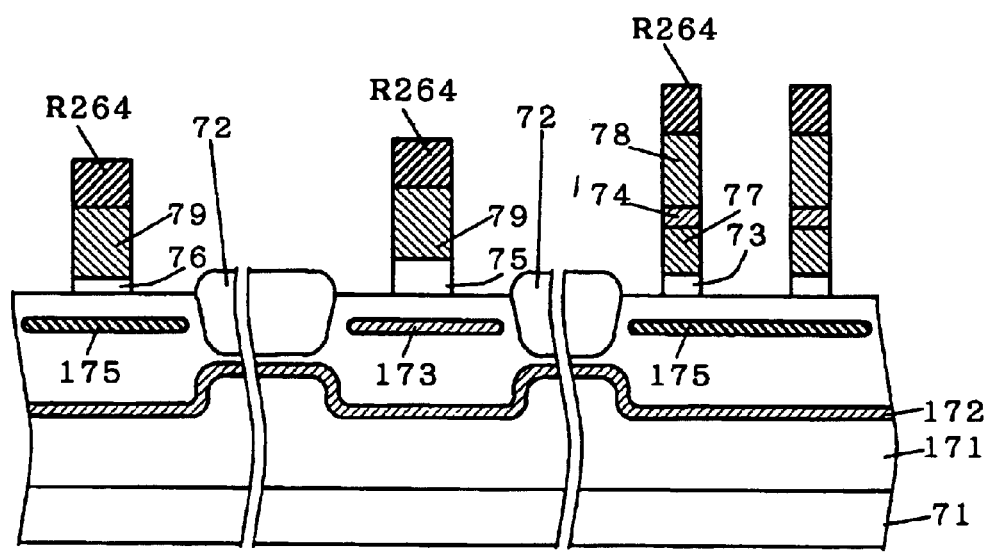
Figure 127:
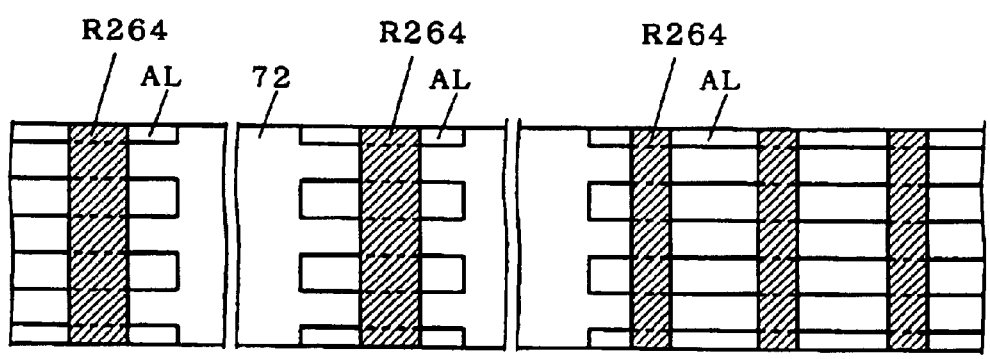

FIG. 70 shows a MOS transistor which is formed on an SOI (silicon on insulator) substrate. The SOI substrate 1010 is formed by a silicon substrate 1013, a buried insulation film 1012 which is formed on the silicon substrate 1013, and an SOI layer which is formed on the buried insulation film 1012, and forms a MOS transistor formed on an SOI layer lull. The SOI layer 1011 has a thin thickness. As shown in a portion which is indicated at line E–E', in particular, in FIG. 70, in the edge portion of the active region AL, the SOI layer 1011 is extremely thin. The threshold value of the MOS transistor in this portion decreases lower than in other portion (which is indicated at line F–F'). Hence, there is a problem that the threshold value of the MOS transistor as a whole becomes low.

However, according to the present invention, the nitrogen-introduced region N50 is formed within the polysilicon layer 1007 on the edge portion of the active region AL, the range in which a depletion layer is formed becomes larger, the effective thickness of the oxide film becomes thicker and a threshold value is partially increased. Thus, the problem is solved.

While the foregoing has described the fifth preferred embodiment of the present invention and the modification thereof in relation to an example of a semiconductor device which is basically formed on a bulk silicon substrate, it is needless to mention that the fifth preferred embodiment is applicable to a semiconductor device which is formed on an SOI substrate as described in relation to the second modification which is shown FIG. 70.

Further, although the first to the third modifications of the fifth preferred embodiment are related to examples of applications to the high-voltage circuit portion HP, it is needless to mention that the modifications may be applied to the low voltage circuit portion LP.

In addition, although the foregoing has described the fifth preferred embodiment of the present invention taking a stepdown circuit as an example, on a premise that the high-voltage circuit portion HP is disposed which is formed by the MOS transistor H1 which receives a relatively high voltage at the gate electrode and the low voltage circuit portion LP is disposed which is formed by the MOS transistor L1 which receives a relatively low voltage at the gate electrode, the present invention may be applied to a regular input/output circuit. That is, in an input/output circuit, a high voltage due to static electricity, e.g., a voltage which is higher than a power source voltage is supplied from outside to a gate electrode in some cases. However, when the present invention is applied, since the effective thickness of the gate oxide film is thick, even in this case, dielectric breakdown of the gate oxide film is prevented and an excellent input/output circuit is obtained.

While the invention has been described in detail, the foregoing description is in all aspects illustrative and not restrictive. It is understood that numerous other modification and variations can be devised without departing from the scope of the invention.

We claim:

1. A method of manufacturing a semiconductor device in which there are first and second types of transistors formed on a single semiconductor substrate, comprising the steps of:
   (a) selectively forming a field oxide film on a main surface of said semiconductor substrate to thereby define first and second regions in which said first and said second types of transistors are formed;
   (b) forming an oxide film on said first and said second active regions; and
   (c) forming a control electrode of a polysilicon layer on said first and said second regions,
   wherein said step (c) includes the steps of:
   (c-1) introducing an impurity of the same conductivity as a source/drain layer into said polysilicon layer within said first region at a relatively low dose n1; and
   (c-2) introducing said impurity into said polysilicon layer within said second region at a relatively high dose n2 while introducing nitrogen into a lower portion of said polysilicon layer within said second region at a dose n3.

2. The method of manufacturing a semiconductor device of claim 1, wherein said dose n1 is $5 \times 10^{14}/cm^2$, said dose n2 is $5 \times 10^5/cm^2$, and said dose n3 is $1 \times 10^{15}/cm^2$.

3. A method of manufacturing a semiconductor device in which there are at least two types of transistors on a semiconductor substrate, comprising the steps of:
   (a) forming said first type of transistor in a first region of said device;
   (b) forming said second type of transistor in a second region of said device; and
   (c) forming a control electrode, which includes an impurity and nitrogen, in each of said first and second transistors;
   (d) masking said first type of transistor, and
   (e) introducing nitrogen into said control electrode of only said second type of transistor.

4. The method of manufacturing a semiconductor device of claim 3, comprising:
   forming at least three types of transistors in respective first second and third regions of said device;
   (g) forming a control electrode, which includes an impurity and nitrogen, in each of said first, second and third transistors;
   in step (e), introducing nitrogen into control electrodes of only said second and third transistors;
   (h) masking said first and second transistors; and
   (i) introducing nitrogen into only said control electrode of said third transistor.

5. The method of manufacturing a semiconductor device of claim 4, comprising:
   (j) implanting nitrogen of doses n1, n2, and n3 into said control electrodes of said first, second and third transistors, respectively, where n1<n2<n3.

6. A method of manufacturing a semiconductor device having first and second transistors on a main surface of a semiconductor substrate of a first conductivity type, comprising the steps of:
   (a) forming an isolation film on said main surface of said semiconductor substrate for isolating said first and said second transistors;
   (b) forming a gate insulation film of said first and said second transistors on said main surface of said semiconductor substrate;
   (c) forming first and second control electrodes on said gate insulation film of said first and said second transistors, said first control electrode including an impurity of a second conductivity type and nitrogen of a first concentration, and said second control electrode including nitrogen of a second concentration different from said first concentration; and
   (d) forming first and second source/drain regions on said main surface of said semiconductor substrate, respectively, at regions where said first and said second transistors are formed.

7. The method of manufacturing a semiconductor device according to claim 6, wherein said step (b) includes a step of (b-1) forming a first insulation film on said main surface of said semiconductor substrate, at regions where said first and said second transistors are formed, said step (c) includes the steps of:

(c-1) forming a polysilicon layer including an impurity of the second conductivity type on a surface of said first insulation film; and (c-2) patterning said polysilicon layer.

8. The method of manufacturing a semiconductor device according to claim 7, wherein said step (c-1) comprises the steps of:

introducing nitrogen into said polysilicon layer, at regions where said first and said second transistors are formed; and masking over a surface at a region where said first transistor is formed, and introducing nitrogen further into said polysilicon layer, at a region where said second transistor is formed.

9. The method of manufacturing a semiconductor device according to claim 8, further comprising the step of forming a capacitor which is connected to one of said second source/drain regions, after said step (d).

10. The method of manufacturing a semiconductor device according to claim 6 further comprising a third transistor on said main surface of said semiconductor substrate, wherein said step (a) comprises a step of forming said isolation film so as to isolate said first to third transistors, said method, after said step (a) and before the step of forming said first insulation film, further comprising the steps of:

forming a second insulation film at a region where said third transistor is formed;

forming a conductive layer on a surface of said second insulation film; and forming a third insulation film on a surface of said conductive layer, wherein said step (c-1) includes the steps of:

forming said polysilicon layer also on a surface of said third insulation film, said polysilicon layer serving as a third control electrode and including an impurity of said second conductivity type;

introducing nitrogen into said polysilicon layer, at regions where said first to third transistors are formed, and masking over a surface at a region where said first and third transistors are formed, and introducing nitrogen further into said polysilicon layer, at a region where said second transistor is formed, and said step (c-2) comprises a step of patterning said third insulation film, said conductive layer and said polysilicon layer.

11. The method of manufacturing a semiconductor device according to claim 6 wherein said step (b) includes a step of (b-1) forming a first insulation film on said main surface of said semiconductor substrate, at regions where said first and said second transistors are formed, said step (c) includes the steps of:

(c-1) forming a polysilicon layer which does not include an impurity on a surface of said first insulation film;

(c-2) introducing an impurity of said conductivity type into said polysilicon layer to thereby form a doped polysilicon layer; and (c-3) patterning said doped polysilicon layer.

12. The method of manufacturing a semiconductor device according to claim 11 further comprising, prior to said step (c-3), the steps of:

introducing nitrogen into said doped polysilicon layer, at regions where said first and said second transistors are formed; and masking over a surface at a region where said first transistor is formed, and introducing nitrogen further into said doped polysilicon layer, at a region where said second transistor is formed.

13. The method of manufacturing a semiconductor device according to claim 12, further comprising a step of forming a capacitor which is connected to one of said second source/drain regions, after step (d).

14. The method of manufacturing a semiconductor device according to claim 11, further comprising a third transistor on said main surface of said semiconductor substrate, where said step (a) comprises a step of forming said insulation film to isolate said first to third transistors, said method, after said step (a) and before the step of forming said first insulation film, further comprising the steps of:

forming a second insulation film at a region where said third transistor is formed;

forming a conductive layer on a surface of said second insulation film; and forming a third insulation layer on said main surface of said semiconductor substrate, wherein said step (c-1) includes the steps of:

forming said polysilicon layer serving as a third control electrode also on a surface of said third insulation film, said step (c-2) comprises a step of introducing an impurity of said second conductivity type into regions where said first to third transistors are formed;

said method further comprises, prior to said step (c-3), the steps of:

introducing nitrogen into said doped polysilicon layer, at the regions where said first to third transistors are formed; and masking over a surface at a region where said first and said third transistors are formed, and introducing nitrogen further into said polysilicon layer, at a region where said second transistor is formed, and said step (c-3) comprises a step of patterning said third insulation film, said conductive layer and said doped polysilicon layer.

* * * * *

UNITED STATES PATENT AND TRADEMARK OFFICE
CERTIFICATE OF CORRECTION

PATENT NO. : 6,815,295 B1
DATED : November 9, 2004
INVENTOR(S) : Ueno et al.

It is certified that error appears in the above-identified patent and that said Letters Patent is hereby corrected as shown below:

<u>Title page, Item [54] and Column 1, line 1</u>,
Title, should read:
-- SEMICONDUCTOR DEVICE AND METHOD OF MANUFACTURING THE SAME --

Signed and Sealed this

Eighth Day of February, 2005

JON W. DUDAS
*Director of the United States Patent and Trademark Office*